(12) United States Patent
Zhu et al.

(10) Patent No.: US 11,550,350 B2
(45) Date of Patent: *Jan. 10, 2023

(54) POTENTIAL GENERATING CIRCUIT, INVERTER, DELAY CIRCUIT, AND LOGIC GATE CIRCUIT

(71) Applicant: CHANGXIN MEMORY TECHNOLOGIES, INC., Hefei (CN)

(72) Inventors: Lei Zhu, Hefei (CN); Zhiyong Chen, Hefei (CN); Jinlai Luo, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/404,149

(22) Filed: Aug. 17, 2021

(65) Prior Publication Data

US 2022/0163987 A1 May 26, 2022

Related U.S. Application Data

(63) Continuation of application No. PCT/CN2021/095449, filed on May 24, 2021.

(30) Foreign Application Priority Data

Nov. 25, 2020 (CN) .......................... 202011340780.6

(51) Int. Cl.
*G05F 1/575* (2006.01)
*H03K 19/08* (2006.01)
(Continued)

(52) U.S. Cl.
CPC ............... *G05F 1/575* (2013.01); *H03K 5/01* (2013.01); *H03K 19/08* (2013.01); *H03K 2005/00013* (2013.01)

(58) Field of Classification Search
CPC .......... G05F 1/575; H03K 5/01; H03K 19/08; H03K 2005/00013
(Continued)

(56) References Cited

U.S. PATENT DOCUMENTS

| | | | |
|---|---|---|---|
| 4,417,263 A | * | 11/1983 | Matsuura ............ H01L 27/0883 968/891 |
| 5,099,146 A | | 3/1992 | Miki |

(Continued)

FOREIGN PATENT DOCUMENTS

| | | |
|---|---|---|
| CN | 1216880 A | 5/1999 |
| CN | 1367927 A | 9/2002 |

(Continued)

OTHER PUBLICATIONS

First Office Action of the U.S. Appl. No. 17/446,302, dated May 25, 2022, 51 pgs.

(Continued)

*Primary Examiner* — Ryan Jager
(74) *Attorney, Agent, or Firm* — Cooper Legal Group, LLC

(57) ABSTRACT

A potential generating circuit includes a first transistor and a second transistor. Potential at a substrate of the first transistor varies with a first parameter. The first parameter is any one of a supply voltage, an operating temperature, as well as a manufacturing process of the potential generating circuit. Potential at a substrate of the second transistor varies with the first parameter. A gate of the first transistor is connected to a drain of the first transistor. The substrate of the first transistor serves as a first output of the potential generating circuit. A gate of the second transistor is connected to a drain of the second transistor. The substrate of the second transistor serves as a second output of the potential generating circuit.

16 Claims, 54 Drawing Sheets

(51) Int. Cl.
  *H03K 5/01* (2006.01)
  *H03K 5/00* (2006.01)
(58) Field of Classification Search
  USPC .......................................................... 327/261
  See application file for complete search history.

(56) References Cited

U.S. PATENT DOCUMENTS

| | | | | |
|---|---|---|---|---|
| 5,434,534 | A * | 7/1995 | Lucas | H03K 17/145 |
| | | | | 327/543 |
| 5,831,472 | A * | 11/1998 | Wang | H03K 19/01721 |
| | | | | 327/539 |
| 6,040,610 | A * | 3/2000 | Noguchi | H01L 21/8238 |
| | | | | 327/143 |
| 6,060,930 | A | 5/2000 | Choi | |
| 6,075,404 | A | 6/2000 | Shindoh | |
| 6,081,131 | A | 6/2000 | Ishii | |
| 6,147,550 | A * | 11/2000 | Holloway | G05F 3/205 |
| | | | | 327/544 |
| 6,198,322 | B1 | 3/2001 | Yoshimura | |
| 6,229,732 | B1 | 5/2001 | Lin | |
| 6,262,616 | B1 | 7/2001 | Srinivasan | |
| 6,333,571 | B1 * | 12/2001 | Teraoka | H03K 19/0013 |
| | | | | 307/115 |
| 6,448,833 | B2 | 9/2002 | Hirose | |
| 6,468,848 | B1 * | 10/2002 | Awaka | H01L 27/0629 |
| | | | | 438/210 |
| 6,496,056 | B1 * | 12/2002 | Shoji | H03K 3/011 |
| | | | | 327/543 |
| 6,803,803 | B1 | 10/2004 | Starr | |
| 6,847,252 | B1 | 1/2005 | Ono | |
| 7,049,887 | B2 * | 5/2006 | Midtgaard | H03G 3/3042 |
| | | | | 330/136 |
| 7,119,622 | B2 | 10/2006 | Sato | |
| 7,138,851 | B2 * | 11/2006 | Sumita | H03K 19/00384 |
| | | | | 327/332 |
| 7,148,732 | B2 | 12/2006 | Kakuda | |
| 7,154,324 | B1 | 12/2006 | Maangat | |
| 7,221,211 | B2 | 5/2007 | Sumita | |
| 7,358,793 | B2 | 4/2008 | Sumita | |
| 7,365,590 | B2 | 4/2008 | Sumita | |
| 7,426,146 | B2 * | 9/2008 | Aota | G11C 5/147 |
| | | | | 365/189.09 |
| 7,477,090 | B2 | 1/2009 | Takahashi | |
| 7,495,465 | B2 | 2/2009 | Khan | |
| 7,508,251 | B2 | 3/2009 | Sumita | |
| 7,525,381 | B2 | 4/2009 | Murden | |
| 7,642,843 | B2 | 1/2010 | Riho | |
| 7,675,348 | B2 | 3/2010 | Sumita | |
| 7,683,433 | B2 * | 3/2010 | Kapoor | H03K 19/00361 |
| | | | | 323/273 |
| 7,719,346 | B2 * | 5/2010 | Imura | G05F 1/56 |
| | | | | 327/543 |
| 7,791,959 | B2 * | 9/2010 | Chun | H01L 23/34 |
| | | | | 365/185.27 |
| 7,808,308 | B2 * | 10/2010 | Lai | G05F 3/24 |
| | | | | 327/541 |
| 7,816,974 | B2 * | 10/2010 | Araki | G05F 3/205 |
| | | | | 327/534 |
| 7,834,683 | B2 * | 11/2010 | Truong | G05F 3/247 |
| | | | | 327/543 |
| 7,843,253 | B2 * | 11/2010 | Aota | G11C 5/147 |
| | | | | 327/543 |
| 7,847,616 | B2 * | 12/2010 | Hashimoto | H03K 19/0013 |
| | | | | 327/107 |
| 7,898,297 | B2 * | 3/2011 | Kapoor | H03K 19/0963 |
| | | | | 326/98 |
| 7,999,603 | B2 | 8/2011 | Sumita | |
| 8,143,963 | B2 * | 3/2012 | Lin | H03L 1/022 |
| | | | | 331/158 |
| 8,174,309 | B2 * | 5/2012 | Yoshino | G05F 3/242 |
| | | | | 327/543 |
| 8,188,801 | B2 | 5/2012 | Kim | |
| 8,378,739 | B2 | 2/2013 | Notani | |
| 8,384,470 | B2 * | 2/2013 | Sugiura | G05F 3/242 |
| | | | | 327/541 |
| 8,390,355 | B2 | 3/2013 | Quan | |
| 8,390,356 | B2 | 3/2013 | Shinde | |
| 8,519,782 | B2 * | 8/2013 | Oyama | H03K 5/2481 |
| | | | | 327/540 |
| 8,665,005 | B2 * | 3/2014 | Gerna | H02M 3/156 |
| | | | | 327/512 |
| 8,742,815 | B2 | 6/2014 | Wadhwa | |
| 8,754,695 | B2 | 6/2014 | Di Vincenzo | |
| 8,963,621 | B2 * | 2/2015 | Gerna | H03K 3/012 |
| | | | | 327/512 |
| 8,975,952 | B2 * | 3/2015 | Fechner | H03K 3/01 |
| | | | | 326/103 |
| 9,019,666 | B2 | 4/2015 | Bourgeat | |
| 9,214,932 | B2 * | 12/2015 | Clausen | H03K 17/063 |
| 9,225,334 | B2 | 12/2015 | Di Vincenzo et al. | |
| 9,300,247 | B2 * | 3/2016 | Roine | H03B 5/24 |
| 9,325,323 | B2 | 4/2016 | Rana | |
| 9,431,959 | B2 * | 8/2016 | Liu | H03B 5/364 |
| 9,473,135 | B2 * | 10/2016 | Garg | H03K 19/0185 |
| 9,525,407 | B2 * | 12/2016 | Iriarte | H03K 5/2472 |
| 9,998,099 | B2 | 6/2018 | Su et al. | |
| 10,193,444 | B1 * | 1/2019 | Wei | G05F 1/463 |
| 10,324,485 | B2 * | 6/2019 | Huang | G05F 3/205 |
| 10,361,691 | B2 | 7/2019 | Jang | |
| 10,418,981 | B2 | 9/2019 | Loke et al. | |
| 10,432,090 | B2 * | 10/2019 | Wei | G05F 1/463 |
| 10,476,457 | B2 * | 11/2019 | Schober | H01L 29/4238 |
| 10,514,716 | B2 * | 12/2019 | Schober | G05F 3/262 |
| 10,554,174 | B2 * | 2/2020 | Schober | H03K 19/018571 |
| 10,707,757 | B2 * | 7/2020 | Wei | H02M 3/157 |
| 11,119,522 | B2 * | 9/2021 | Huang | G05F 3/205 |
| 11,177,794 | B2 * | 11/2021 | Roewer | H03K 3/011 |
| 2001/0020861 | A1 | 9/2001 | Hirose | |
| 2001/0046156 | A1 * | 11/2001 | Miyazaki | G11C 5/143 |
| | | | | 365/156 |
| 2002/0195623 | A1 * | 12/2002 | Horiuchi | H01L 21/84 |
| | | | | 257/200 |
| 2003/0071661 | A1 | 4/2003 | Eguchi | |
| 2003/0085751 | A1 * | 5/2003 | Miyazaki | G11C 5/146 |
| | | | | 327/534 |
| 2003/0146785 | A1 * | 8/2003 | Ueda | G05F 3/24 |
| | | | | 327/543 |
| 2003/0174014 | A1 * | 9/2003 | Nakashimo | G05F 3/24 |
| | | | | 327/542 |
| 2004/0135621 | A1 | 7/2004 | Sumita | |
| 2004/0251484 | A1 * | 12/2004 | Miyazaki | G05F 3/205 |
| | | | | 257/299 |
| 2005/0116765 | A1 | 6/2005 | Sakiyama | |
| 2005/0134384 | A1 | 6/2005 | Sato | |
| 2005/0162212 | A1 | 7/2005 | Sakiyama | |
| 2006/0125550 | A1 | 6/2006 | Sumita | |
| 2006/0125551 | A1 | 6/2006 | Sumita | |
| 2007/0024342 | A1 | 2/2007 | Sumita | |
| 2007/0024343 | A1 | 2/2007 | Sumita | |
| 2007/0024345 | A1 | 2/2007 | Sumita | |
| 2007/0132504 | A1 | 6/2007 | Sumita | |
| 2008/0088357 | A1 | 4/2008 | Sumita | |
| 2008/0211556 | A1 | 9/2008 | Masuo | |
| 2008/0211572 | A1 | 9/2008 | Riho | |
| 2009/0153214 | A1 | 6/2009 | Takatori | |
| 2010/0007382 | A1 | 1/2010 | Hashimoto | |
| 2010/0117717 | A1 | 5/2010 | Sumita | |
| 2011/0102043 | A1 | 5/2011 | Zerbe | |
| 2011/0309885 | A1 | 12/2011 | Kim | |
| 2012/0154066 | A1 * | 6/2012 | Kubota | H03L 5/00 |
| | | | | 331/116 FE |
| 2013/0141824 | A1 | 6/2013 | Bourgeat | |
| 2014/0285240 | A1 | 9/2014 | Di Vincenzo et al. | |
| 2014/0376305 | A1 | 12/2014 | Bai et al. | |
| 2015/0229296 | A1 | 8/2015 | Kim | |
| 2016/0013763 | A1 | 1/2016 | Tomimatsu et al. | |
| 2016/0065220 | A1 | 3/2016 | Rana et al. | |
| 2017/0077907 | A1 | 3/2017 | Su et al. | |
| 2017/0271195 | A1 * | 9/2017 | Høyerby | H01L 27/092 |
| 2018/0302069 | A1 | 10/2018 | Loke et al. | |

(56) References Cited

U.S. PATENT DOCUMENTS

| | | | |
|---|---|---|---|
| 2020/0209070 A1* | 7/2020 | Tang | G01K 15/005 |
| 2021/0080991 A1 | 3/2021 | Huang | |
| 2022/0038064 A1* | 2/2022 | Kareppagoudr | H03F 1/0216 |
| 2022/0163986 A1* | 5/2022 | Zhu | H03K 17/56 |
| 2022/0166416 A1* | 5/2022 | Zhu | H03K 5/01 |

FOREIGN PATENT DOCUMENTS

| | | |
|---|---|---|
| CN | 1497725 A | 5/2004 |
| CN | 1630185 A | 6/2005 |
| CN | 101256824 A | 9/2008 |
| CN | 101895280 A | 11/2010 |
| CN | 102291105 A | 12/2011 |
| CN | 103647545 A | 3/2014 |
| CN | 104038201 A | 9/2014 |
| CN | 105629772 A | 6/2016 |
| CN | 106301346 A | 1/2017 |
| CN | 108696269 A | 10/2018 |
| CN | 109379060 A | 2/2019 |
| CN | 109450415 A | 3/2019 |
| CN | 110377088 A | 10/2019 |
| CN | 111295841 A | 6/2020 |
| JP | H06139779 A | 5/1994 |
| JP | 2001251171 A | 9/2001 |
| JP | 2010074721 A | 4/2010 |

OTHER PUBLICATIONS

Supplementary European Search Report in the European application No. 21773264.3, dated Jul. 27, 2022, 8 pgs.

First Office Action of the U.S. Appl. No. 17/400,481, dated Jan. 12, 2022, 9 pgs.

Supplementary European Search Report in the European application No. 21772658.7, dated Sep. 8, 2022, 10 pgs.

Melek, et al., "Body-Bias Compensation Technique for SubThreshold CMOS Static Logic Gates", SBCCI'04, Sep. 7-11, 2004, Pernambuco, Braci, pp. 267-272.

Supplementary European Search Report in the European application No. 21856898.8, dated Nov. 7, 2022, 13 pages.

* cited by examiner

POTENTIAL GENERATING CIRCUIT, INVERTER, DELAY CIRCUIT, AND LOGIC GATE CIRCUIT

CROSS-REFERENCE TO RELATED APPLICATION

This is a continuation application of International Patent Application No. PCT/CN2021/095449, filed on May 24, 2021, which claims the benefit of priority to Chinese Application No. 202011340780.6, filed on Nov. 25, 2020 and titled "POTENTIAL GENERATING CIRCUIT, INVERTER, DELAY CIRCUIT, AND LOGIC GATE, CIRCUIT". The contents of International Patent Application No. PCT/CN2021/095449 and Chinese Application No. 202011340780.6 are incorporated herein by reference in their entireties.

TECHNICAL FIELD

The present disclosure relates to the field of integrated circuit technology, and more particularly, to a potential generating circuit, an inverter, a delay circuit, and a logic gate circuit.

BACKGROUND

At present, a delay circuit is commonly used in a semiconductor element. A delay circuit is a circuit capable of delaying a pulse signal by a certain period of time. When a delay circuit is used in a Dynamic Random Access Memory (DRAM), a delay provided by the delay circuit often has to be controlled precisely. The change in the delay by a delay circuit has to be small when there is a change in a parameter such as a supply voltage, an operating temperature, a manufacturing process, etc.

FIG. 1 is a diagram of an input signal and an output signal passing through a delay circuit. After the input signal has passed through the delay circuit, a delay signal is output. As shown in FIG. 1, the output signal is the input signal delayed by a period of time T. FIG. 1 shows a case in which both a rising edge and a falling edge of the input signal are delayed by T. In another case, only the rising edge of the input signal is delayed by T, or only the falling edge of the input signal is delayed by T.

In an existing delay circuit, the delay T may change greatly (to become larger or smaller) with the change in the supply voltage, the operating temperature, as well as the manufacturing process, impacting precision of the delay. There is a pressing need for a solution for reducing impact of the change in such a parameter on the delay T by a delay circuit so as to reduce the change in the delay T.

SUMMARY

The present disclosure provides a potential generating circuit, capable of outputting a potential varying with any one of a supply voltage, an operating temperature, as well as a manufacturing process.

The present disclosure provides an inverter with a small change in a delay T by the inverter, improving capability of the inverter to control a delay precision.

The present disclosure provides a delay circuit for reducing impact of a manufacturing process, a supply voltage and an operating temperature of the delay circuit on a delay T provided by the delay circuit, so that the change in the delay T is small.

The present disclosure provides a logic gate circuit for reducing impact of a manufacturing process, a supply voltage and an operating temperature of the logic gate circuit on the delay T by the logic gate circuit, so that the change in the delay T is small.

In a first aspect, the present disclosure provides a potential generating circuit, including a first transistor and a second transistor.

Potential at a substrate of the first transistor varies with a first parameter. The first parameter is any one of a supply voltage, an operating temperature, or a manufacturing process of the potential generating circuit.

Potential at a substrate of the second transistor varies with the first parameter.

A gate of the first transistor is connected to a drain of the first transistor, the substrate of the first transistor serves as a first output of the potential generating circuit, a gate of the second transistor is connected to a drain of the second transistor, and the substrate of the second transistor serves as a second output of the potential generating circuit.

The potential generating circuit provided in the present disclosure is provided with the first transistor and the second transistor. The gate of the first transistor is connected to the drain of the first transistor, the substrate of the first transistor serves as the first output of the potential generating circuit, the gate of the second transistor is connected to the drain of the second transistor, and the substrate of the second transistor serves as the second output of the potential generating circuit. Since the potential at the substrate of the first transistor varies with the first parameter, and the potential at the substrate of the second transistor varies with the first parameter, the first output and the second output may respectively output a potential varying with any one of the supply voltage, the operating temperature, as well as the manufacturing process.

Optionally, the first parameter is the supply voltage or the operating temperature of the potential generating circuit, the potential at the substrate of the first transistor increases as the first parameter increases, the potential at the substrate of the first transistor decreases as the first parameter decreases, the potential at the substrate of the second transistor decreases as the first parameter increases, and the potential at the substrate of the second transistor increases as the first parameter decreases.

Optionally, the first transistor is a P-type transistor, and the second transistor is an N-type transistor.

Optionally, a source of the first transistor is connected to a first voltage node, a source of the second transistor is connected to a second voltage node, and the drain of the first transistor is connected to the drain of the second transistor.

Optionally, the potential generating circuit may further include a constant current source.

A first terminal of the constant current source may be connected to the second voltage node. A second terminal of constant current source may be connected to a third voltage node.

Optionally, the potential generating circuit may further include a first error amplifier, a second error amplifier, and a third transistor.

The first error amplifier and the second transistor may form a first feedback loop. The substrate of the second transistor may be connected to a voltage node of the first feedback loop.

The second error amplifier and the third transistor may form a second feedback loop. The substrate of the first transistor may be connected to a voltage node of the second feedback loop.

Optionally, a negative input of the first error amplifier may be connected to the second voltage node. A positive input of the first error amplifier may be connected to a first reference voltage. An output of the first error amplifier may be connected to the substrate of the second transistor.

A negative input of the second error amplifier may be connected to a second reference voltage. A positive input of the second error amplifier may be connected to a fourth voltage node. An output of the second error amplifier may be connected to a gate of the third transistor. A source of the third transistor may be connected to the first voltage node. A drain of the third transistor may be coupled to the fourth voltage node through a first resistor. The output of the first error amplifier may be coupled to the fourth voltage node through a second resistor.

Optionally, the first voltage node may be connected to a power supply. The first reference voltage may be grounded. A potential of the third voltage node may be less than a potential of the first reference voltage.

Optionally, the potential generating circuit may further include a constant current source.

A first terminal of the constant current source may be connected to a third voltage node. A second terminal of the constant current source may be connected to the first voltage node.

Optionally, the potential generating circuit may further include a first error amplifier, a second error amplifier, and a third transistor.

The first error amplifier and the first transistor may form a first feedback loop. The substrate of the first transistor may be connected to a voltage node of the first feedback loop.

The second error amplifier and the third transistor may form a second feedback loop. The substrate of the second transistor may be connected to a voltage node of the second feedback loop.

Optionally, a negative input of the first error amplifier may be connected to the first voltage node. A positive input of the first error amplifier may be connected to a first reference voltage. An output of the first error amplifier may be connected to the substrate of the first transistor.

A negative input of the second error amplifier may be connected to a second reference voltage. A positive input of the second error amplifier may be connected to a fourth voltage node. An output of the second error amplifier may be connected to a gate of the third transistor. A source of the third transistor may be connected to the second voltage node. A drain of the third transistor may be coupled to the fourth voltage node through a second resistor. An output of the first error amplifier may be coupled to the fourth voltage node through a first resistor.

Optionally, the second voltage node may be grounded. The first reference voltage may be connected to a power supply. A potential of the third voltage node may be greater than a potential of the first reference voltage.

Optionally, the potential generating circuit may further include a first buffer and a second buffer.

The first buffer may be connected to the first output, and output a first substrate potential equal to the potential at the substrate of the first transistor.

The second buffer may be connected to the second output, and output a second substrate potential equal to the potential at the substrate of the second transistor.

In a second aspect, the present disclosure provides a delay circuit, including a potential generating circuit of the first aspect as well as any possible implementation of the first aspect, and a delay unit.

The delay unit includes a first inverter. The first inverter includes a fourth transistor and a fifth transistor. A substrate of the fourth transistor is connected to the potential at the substrate of the first transistor. A substrate of the fifth transistor is connected to the potential at the substrate of the second transistor.

Alternatively, the delay circuit includes a potential generating circuit of a possible implementation of the first aspect, and a delay unit.

The delay unit includes a first inverter. The first inverter includes a fourth transistor and a fifth transistor. A substrate of the fourth transistor is connected to the first substrate potential. A substrate of the fifth transistor is connected to the second substrate potential.

With the delay circuit provided in the present embodiment, the potential at the substrate of the first transistor in the potential generating circuit may vary with any one of the supply voltage, the operating temperature, as well as the manufacturing process, providing the substrate of the fourth transistor with a first substrate potential varying with the first parameter, and the potential at the substrate of the second transistor may vary with any one of the supply voltage, the operating temperature, as well as the manufacturing process, providing the substrate of the fifth transistor with a second substrate potential varying with the first parameter. Therefore, the current flowing through the two transistors of the first inverter may be adjusted, and the change in the current flowing through the two transistors of the inverter may be compensated, so that the change in the delay T provided by the delay circuit is small, improving control over a delay precision by the delay circuit.

Optionally, H is equal to L, and M is equal to N. The H may be a ratio of a channel length of the first transistor to a channel length of the fourth transistor. The L may be a ratio of a channel length of the second transistor to a channel length of the fifth transistor. The M may be a ratio of a channel width of the first transistor to a channel width of the fourth transistor. The N may be a ratio of a channel width of the second transistor to a channel width of the fifth transistor.

In a third aspect, the present disclosure provides an inverter, including a P-type transistor and an N-type transistor.

A source of the P-type transistor is connected to a power supply, a drain of the P-type transistor is connected to a drain of the N-type transistor, a source of the N-type transistor is grounded, a gate of the P-type transistor is connected to a gate of the N-type transistor and serves as an input of the inverter, and the drain of the P-type transistor serves as an output of the inverter.

A substrate of the P-type transistor is connected to a first substrate potential. A substrate of the N-type transistor is connected to a second substrate potential. The first substrate potential varies with a first parameter. The second substrate potential varies with the first parameter. The first parameter may be any one of a supply voltage, an operating temperature, or a manufacturing process of the inverter.

With the inverter provided in the present embodiment, the first substrate potential may vary with any one of the supply voltage, the operating temperature, as well as the manufacturing process, providing the first substrate potential varying with the first parameter to the substrate of the TP1, and the second substrate potential may vary with any one of the supply voltage, the operating temperature, as well as the manufacturing process, providing the second substrate potential varying with the first parameter to the substrate of the TN1, such that the current flowing through the P-type transistor TP1 and the N-type transistor TN1 of the inverter may be adjusted, compensating the change in the current flowing through the two transistors of the inverter, so that the change in the delay T by the inverter is small, improving control over a delay precision by the inverter.

Optionally, the first parameter is the supply voltage or the operating temperature of the inverter.

The first substrate potential increases as the first parameter increases, the first substrate potential decreases as the first parameter decreases, the second substrate potential decreases as the first parameter increases, and the second substrate potential increases as the first parameter decreases.

In a fourth aspect, the present disclosure provides a delay circuit, including the inverter of the third aspect or a possible implementation of the third aspect, and a capacitor.

The capacitor has a first terminal connected to the output of the inverter, and has a second terminal being connected to the power supply or being grounded.

With the delay circuit according to the present embodiment, the change in the current flowing through the two transistors of the inverter may be compensated, so that the change in the delay T by the inverter is small, thereby rendering the change in the delay T provided by the delay circuit to be small, improving control over a delay precision by the delay circuit.

Optionally, the capacitor is an array of capacitors.

According to a fifth aspect, the present disclosure provides a logic gate circuit, including a P-type transistor and an N-type transistor.

A substrate of the P-type transistor may be connected to a first substrate potential. A substrate of the N-type transistor may be connected to a second substrate potential. The first substrate potential and the second substrate potential may vary with a first parameter, such that a change in a delay between an input and an output of the logic gate circuit varying with the first parameter is within a first range. The first parameter may include any one of a supply voltage, an operating temperature, as well as a manufacturing process of the logic gate circuit.

With the logic gate circuit provided in the present disclosure, the delay provided by the logic gate circuit from the input terminal to the output terminal has a small change when any one of the supply voltage, the operating temperature, as well as the manufacturing process changes, improving control over a delay precision by the logic gate circuit.

DETAILED DESCRIPTION

To make an object, a technical solution, and beneficial effects of the present disclosure clearer, clear complete description of the technical solution of the present disclosure is given below with reference to the drawings of the present disclosure. Clearly, embodiments illustrated are some, instead of all, embodiments according to the present disclosure. Based on embodiments of the present disclosure, a person having ordinary skill in the art may acquire another embodiment without creative effort. Any such embodiment falls within the scope of the present disclosure.

First, a rising edge delay and a falling edge delay in the present disclosure are explained for ease of understanding.

Figure 1:
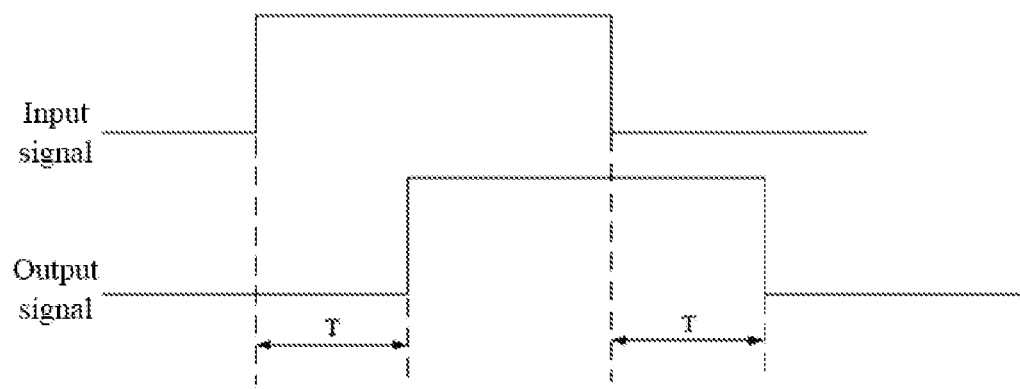
FIG. 1 is a diagram of an input signal and an output signal passing through a delay circuit.

1. RISING EDGE DELAY: FIG. 1 is a diagram of an input signal and an output signal passing through a delay circuit. As shown in FIG. 1, the delay T between the rising edge of the output signal and the rising edge of the input signal is the rising edge delay.

2. FALLING EDGE DELAY: as shown in FIG. 1, the delay T between the falling edge of the output signal and the falling edge of the input signal is the falling edge delay.

Figure 2:
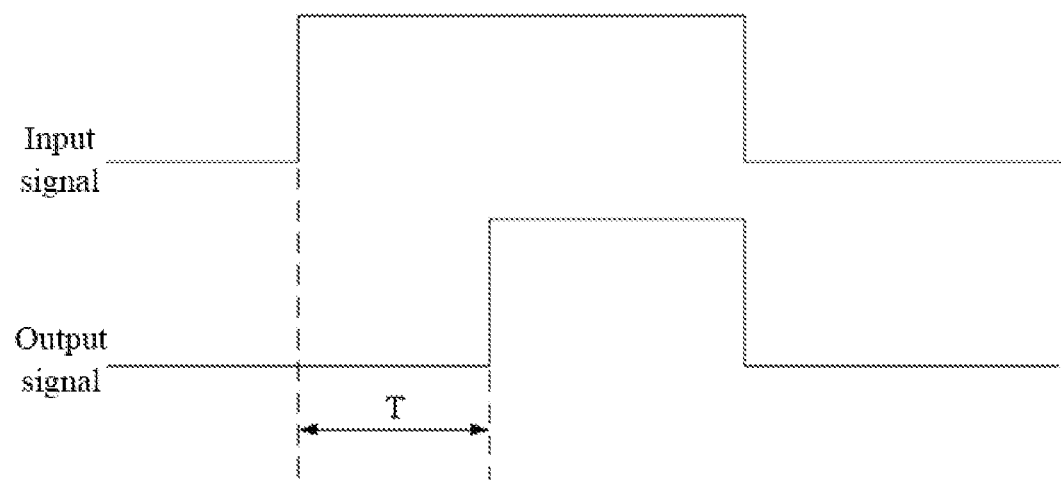
FIG. 2 is a diagram of an input signal and an output signal passing through a delay circuit.
Figure 3:
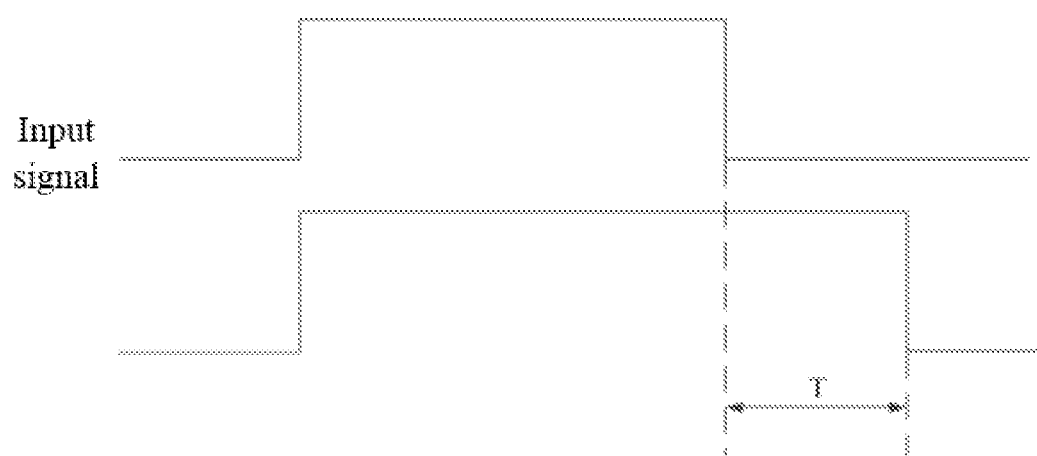
FIG. 3 is a diagram of an input signal and an output signal passing through a delay circuit.

With a delay circuit provided in the present disclosure, it is possible to delay both the rising edge and the falling edge of the input signal by T, with the width of the pulse signal remaining constant. As shown in FIG. 1, it is also possible to delay the rising edge of the input signal by T, and it is also possible to delay the falling edge of the input signal by T. FIG. 2 is a diagram of an input signal and an output signal passing through a delay circuit. As shown in FIG. 2, the rising edge of the input signal is delayed by T, acquiring an output signal, with the width of the pulse signal being decreased by T. FIG. 3 is a diagram of an input signal and an output signal passing through a delay circuit. As shown in FIG. 3, the falling edge of the input signal is delayed by T, acquiring an output signal, with the width of the pulse signal being increased by T. It should be noted that only one period of the pulse signal is shown in each of FIG. 1 to FIG. 3.

A delay circuit provided in the present disclosure may be applied to a scene in which the delay provided by the delay circuit is to be controlled precisely. For example, the delay circuit may be applied to a DRAM, and is capable of compensating impact of the change in any one of the supply voltage, the operating temperature, as well as the manufacturing process at the same time, so that the change in the delay T is small, thereby improving control over a delay precision by the delay circuit.

In an existing delay circuit, a delay unit includes an inverter composed of two transistors (a P-type transistor and an N-type transistor), and a delay T of an output signal passing through the delay circuit may vary greatly with a change in a supply voltage, an operating temperature, as well as a manufacturing process, thereby impacting a delay precision. To solve this problem, the present disclosure starts from the structure of the delay unit. A change in any of a supply voltage, an operating temperature, as well as a manufacturing process may cause a change in the current flowing through the two transistors of the inverter, thereby causing a change in the delay. Therefore, the present disclosure provides a delay circuit. The delay circuit includes a potential generating circuit and a delay unit. The potential generating circuit includes a first transistor and a second transistor. Potential at a substrate of the first transistor varies with a first parameter. Potential at a substrate of the second transistor varies with the first parameter. The first parameter is any one of a supply voltage, an operating temperature, or a manufacturing process of the potential generating circuit. The delay unit includes a first inverter. The first inverter includes a fourth transistor and a fifth transistor. A substrate of the fourth transistor is connected to the potential at the substrate of the first transistor. A substrate of the fifth transistor is connected to the potential at the substrate of the second transistor.

Since the potential at the substrate of the first transistor may vary with the supply voltage, the operating temperature, as well as the manufacturing process, the potential at the substrate that varies with the first parameter may be provided to the substrate of the fourth transistor. The potential at the substrate of the second transistor may vary with any one of the supply voltage, the operating temperature, as well as the manufacturing process. Thus, the potential at the substrate that varies with the first parameter may be provided to the substrate of the fifth transistor. Therefore, the current flowing through the two transistors of the first inverter may be adjusted to compensate the change in the current flowing through the two transistors of the inverter, so that the change in the delay T provided by the delay circuit is small, improving control over a delay precision by the delay circuit.

A specific structure of a potential generating circuit, an inverter, a delay circuit, and a logic gate circuit provided in the present disclosure are elaborated with embodiments.

Embodiment 1

Figure 4:
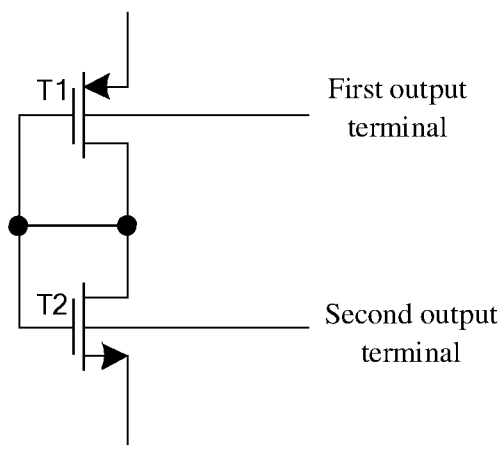
FIG. 4 is a diagram of a structure of a potential generating circuit according to embodiments of the present disclosure.

FIG. 4 is a diagram of a structure of a potential generating circuit according to embodiments of the present disclosure.

As shown in FIG. 4, the potential generating circuit according to the embodiment may include a first transistor T1 and a second transistor T2. Potential at a substrate of the first transistor T1 varies with a first parameter. The first parameter is any one of a supply voltage, an operating temperature, or a manufacturing process of the potential generating circuit. Potential at a substrate of the second transistor T2 varies with the first parameter. A gate of the first transistor T1 is connected to a drain of the first transistor T1. The substrate of the first transistor T1 serves as a first output of the potential generating circuit. A gate of the second transistor T2 is connected to a drain of the second transistor T2. The substrate of the second transistor T2 serves as a second output of the potential generating circuit.

In particular, the potential at the substrate of the first transistor T1 is the potential output by the first output, and the potential at the substrate of the second transistor T2 is the potential output by the second output. Since the potential at the substrate of the first transistor T1 varies with the first parameter, and the potential at the substrate of the second transistor T2 varies with the first parameter, the potential generating circuit provided in the present embodiment may output a potential varying with any one of the supply voltage, the operating temperature, as well as the manufacturing process.

In particular, if the first parameter is the supply voltage or the operating temperature of the potential generating circuit, the potential at the substrate of the first transistor T1 may vary with the first parameter, and the potential at the substrate of the second transistor T2 may vary with the first parameter as follows. The potential at the substrate of the first transistor T1 may increase as the first parameter increases, and the potential at the substrate of the first transistor T1 may decrease as the first parameter decreases. That is, the potential at the substrate of the first transistor and the first parameter are proportional to each other. The potential at the substrate of the second transistor T2 may decrease as the first parameter increases, and the potential at the substrate of the second transistor T2 may increase as the first parameter decreases.

In one possible implementation, the first transistor T1 is a P-type transistor, and the second transistor T2 is an N-type transistor.

In one possible implementation, a source of the first transistor T1 is connected to a first voltage node, a source of the second transistor T2 is connected to a second voltage node, and the drain of the first transistor T1 is connected to the drain of the second transistor T2.

Figure 5:
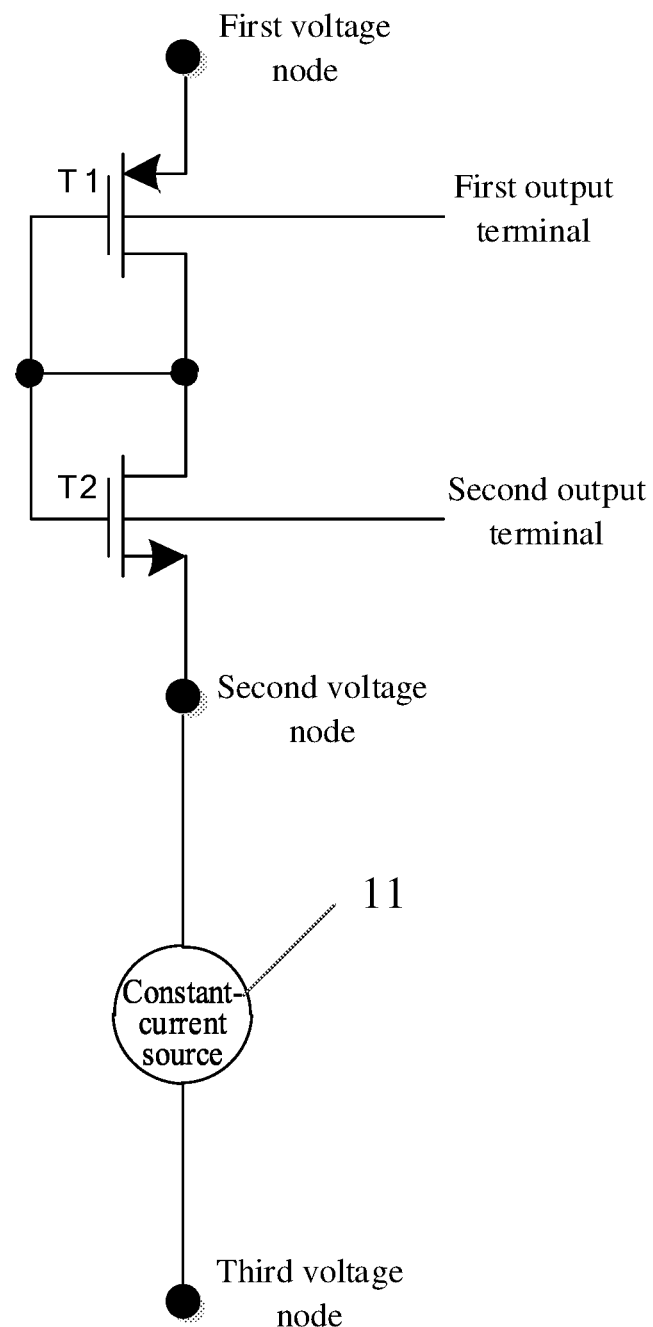
FIG. 5 is a diagram of a structure of a potential generating circuit according to embodiments of the present disclosure.

In the implementation, FIG. 5 is a diagram of a structure of a potential generating circuit according to embodiments of the present disclosure. As shown in FIG. 5, based on the circuit shown in FIG. 4, the potential generating circuit according to this embodiment may further include a constant current source 11. A first terminal of the constant current source 11 may be connected to the second voltage node. A second terminal of the constant current source 11 may be connected to a third voltage node.

Figure 6:
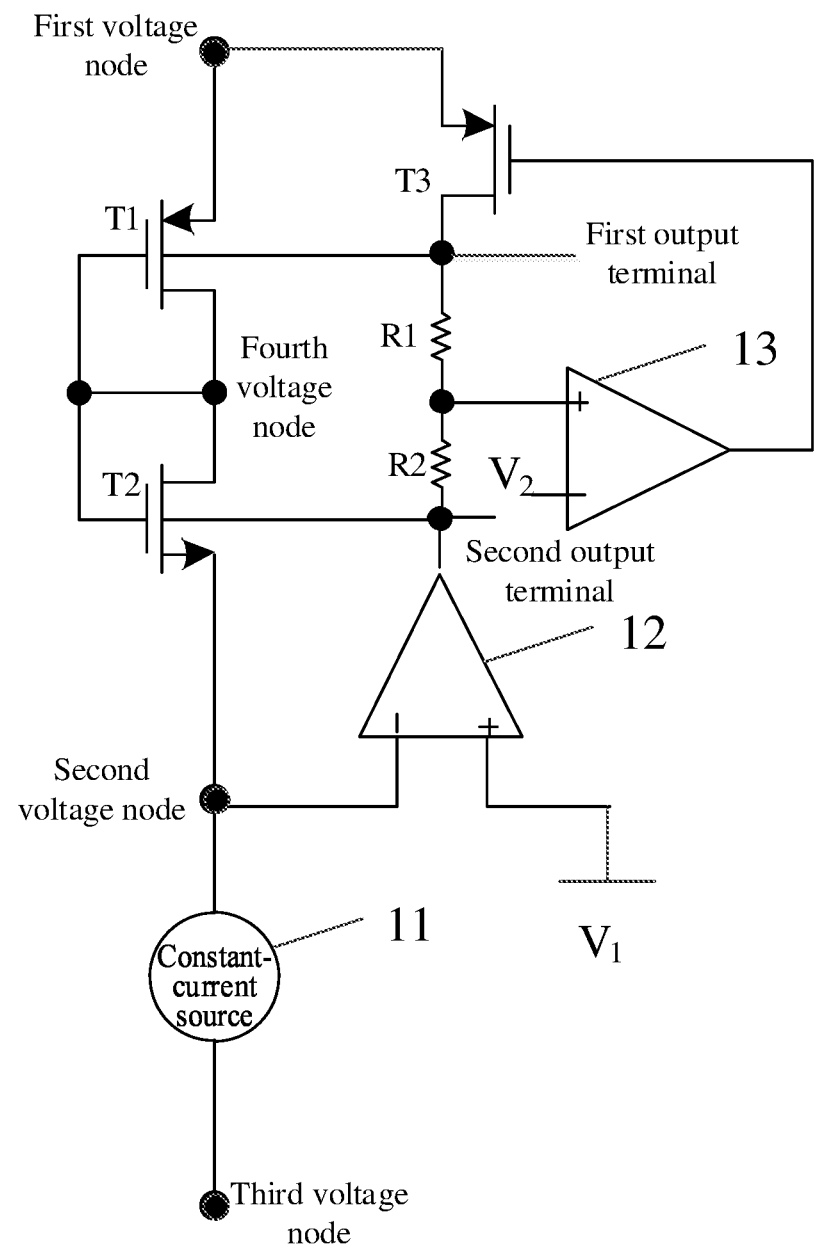
FIG. 6 is a diagram of a structure of a potential generating circuit according to embodiments of the present disclosure.

FIG. 6 is a diagram of a structure of a potential generating circuit according to embodiments of the present disclosure. As shown in FIG. 6, based on the circuit shown in FIG. 5, the potential generating circuit according to the embodiment may further include a first error amplifier 12, a second error amplifier 13, and a third transistor T3.

The first error amplifier 12 and the second transistor T2 may form a first feedback loop. The substrate of the second transistor T2 may be connected to a voltage node of the first feedback loop.

The second error amplifier 13 and the third transistor T3 may form a second feedback loop. The substrate of the first transistor may be connected to a voltage node of the second feedback loop.

As shown in FIG. 6, optionally, a negative input of the first error amplifier 12 is connected to the second voltage node. A positive input of the first error amplifier 12 may be connected to a first reference voltage V1. An output of the first error amplifier 12 may be connected to the substrate of the second transistor T2.

A negative input of the second error amplifier 13 may be connected to a second reference voltage V2. A positive input of the second error amplifier 13 may be connected to a fourth voltage node. An output of the second error amplifier 13 may be connected to a gate of the third transistor T3. A source of the third transistor T3 may be connected to the first voltage node. A drain of the third transistor T3 may be coupled to the fourth voltage node through a first resistor R1. The output of the first error amplifier 12 may be coupled to the fourth voltage node through a second resistor R2.

In the embodiment, the first voltage node may be connected to a power supply. The first reference voltage V1 may be grounded. A potential of the third voltage node may be less than a potential of the first reference voltage V1.

In the potential generating circuit shown in FIG. 6, the first voltage node may be connected to a power supply. The first reference voltage V1 may be grounded. A potential of the third voltage node may be less than a potential of V1. That is, the potential of the third voltage node is less than 0. The potential of the first voltage node may be greater than the potential of the third voltage node.

Another potential generating circuit is shown below in conjunction with FIG. 7 and FIG. 8, and is elaborated below in conjunction with FIG. 7 and FIG. 8.

Figure 7:
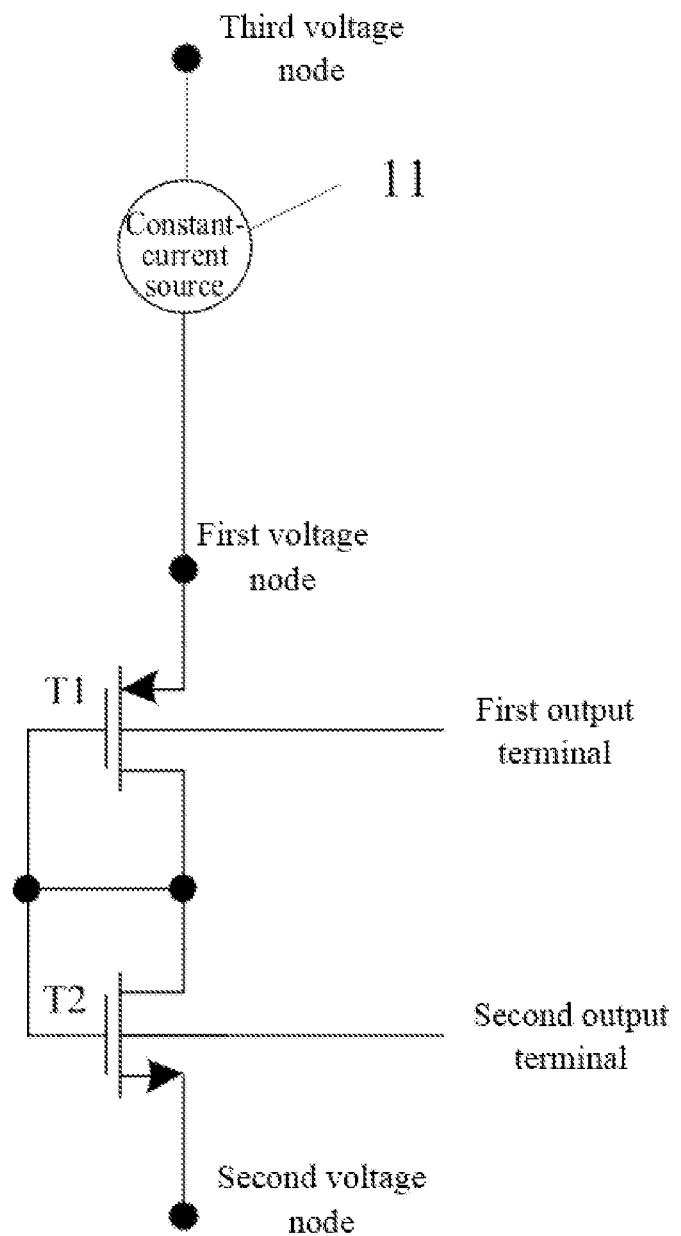
FIG. 7 is a diagram of a structure of a potential generating circuit according to embodiments of the present disclosure.

FIG. 7 is a diagram of a structure of a potential generating circuit according to embodiments of the present disclosure. As shown in FIG. 7, based on the circuit shown in FIG. 4, the potential generating circuit according to the embodiment may further include a constant current source 11. A first terminal of the constant current source 11 may be connected to a third voltage node. A second terminal of the constant current source 11 may be connected to the first voltage node.

Figure 8:
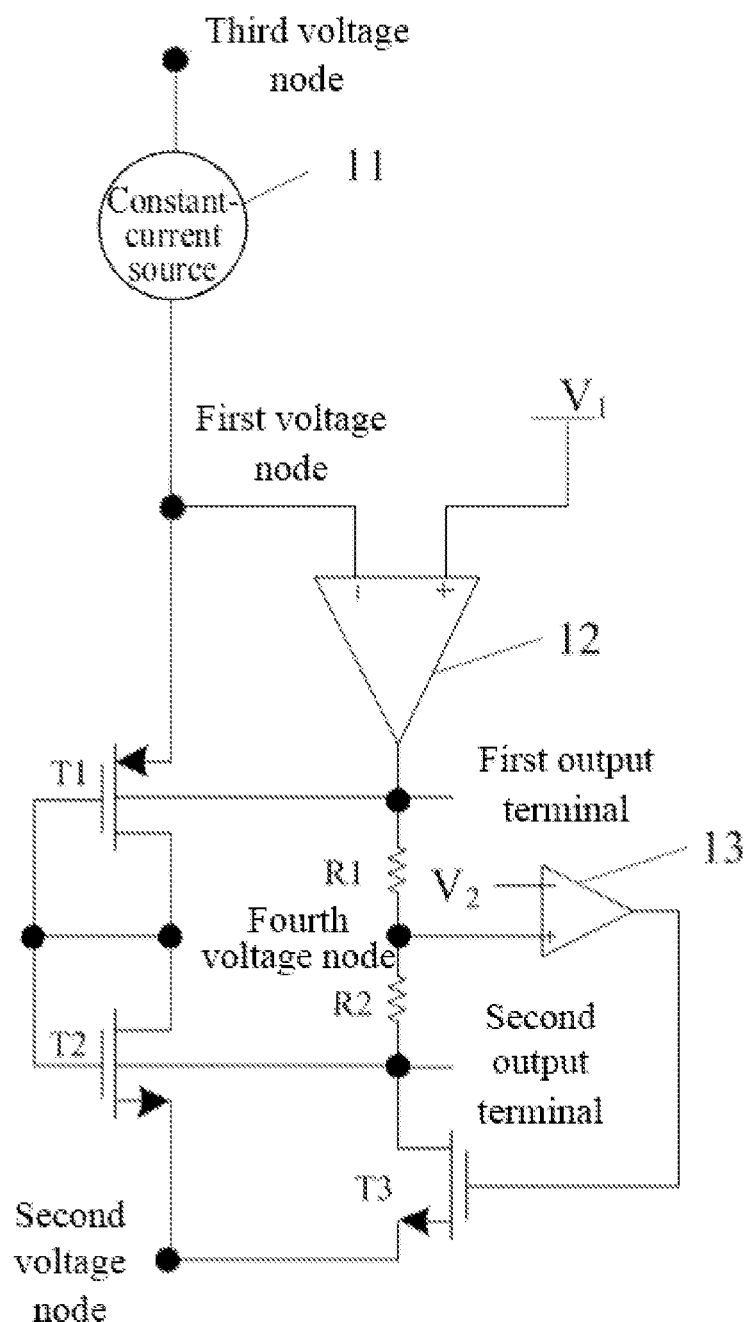
FIG. 8 is a diagram of a structure of a potential generating circuit according to embodiments of the present disclosure.

FIG. 8 is a diagram of a structure of a potential generating circuit according to embodiments of the present disclosure. As shown in FIG. 8, based on the circuit shown in FIG. 7, the potential generating circuit according to the embodiment may further include a first error amplifier 12, a second error amplifier 13, and a third transistor T3. The first error amplifier and the first transistor T1 may form a first feedback loop. The substrate of the first transistor T1 may be connected to a voltage node of the first feedback loop.

The second error amplifier 13 and the third transistor T3 may form a second feedback loop. The substrate of the second transistor T2 may be connected to a voltage node of the second feedback loop.

Optionally, as shown in FIG. 8, a negative input of the first error amplifier 12 may be connected to the first voltage node. A positive input of the first error amplifier may be connected to a first reference voltage V1. An output of the first error amplifier 12 may be connected to the substrate of the first transistor T1.

A negative input of the second error amplifier 13 may be connected to a second reference voltage V2. A positive input of the second error amplifier 13 may be connected to a fourth voltage node. An output of the second error amplifier 13 may be connected to a gate of the third transistor T3. A source of the third transistor T3 may be connected to the second voltage node. A drain of the third transistor T3 may be coupled to the fourth voltage node through a second resistor R2. An output of the first error amplifier 12 may be coupled to the fourth voltage node through a first resistor R1.

In the embodiment, the second voltage node may be grounded, the first reference voltage V1 may be connected to a power supply, and a potential of the third voltage node may be greater than a potential of the first reference voltage V1.

In the potential generating circuit shown in FIG. 8, the second voltage node may be grounded, the first reference voltage V1 may be connected to a power supply, and a potential of the third voltage node may be greater than a potential of V1. That is, the potential of the third voltage node is greater than the potential of the power supply. The potential of the first voltage node is less than the potential of the third voltage node.

In the potential generating circuit shown in any one of FIG. 4 to FIG. 8, the first transistor and the second transistor are provided, the gate of the first transistor being connected to the drain of the first transistor, the substrate of the first transistor serving as the first output of the potential generating circuit, the gate of the second transistor being connected to the drain of the second transistor, and the substrate of the second transistor serving as the second output of the potential generating circuit. Since the potential at the substrate of the first transistor varies with the first parameter, and the potential at the substrate of the second transistor varies with the first parameter, the first output and the second output may respectively output a potential varying with any one of the supply voltage, the operating temperature, as well as the manufacturing process.

Figure 9:
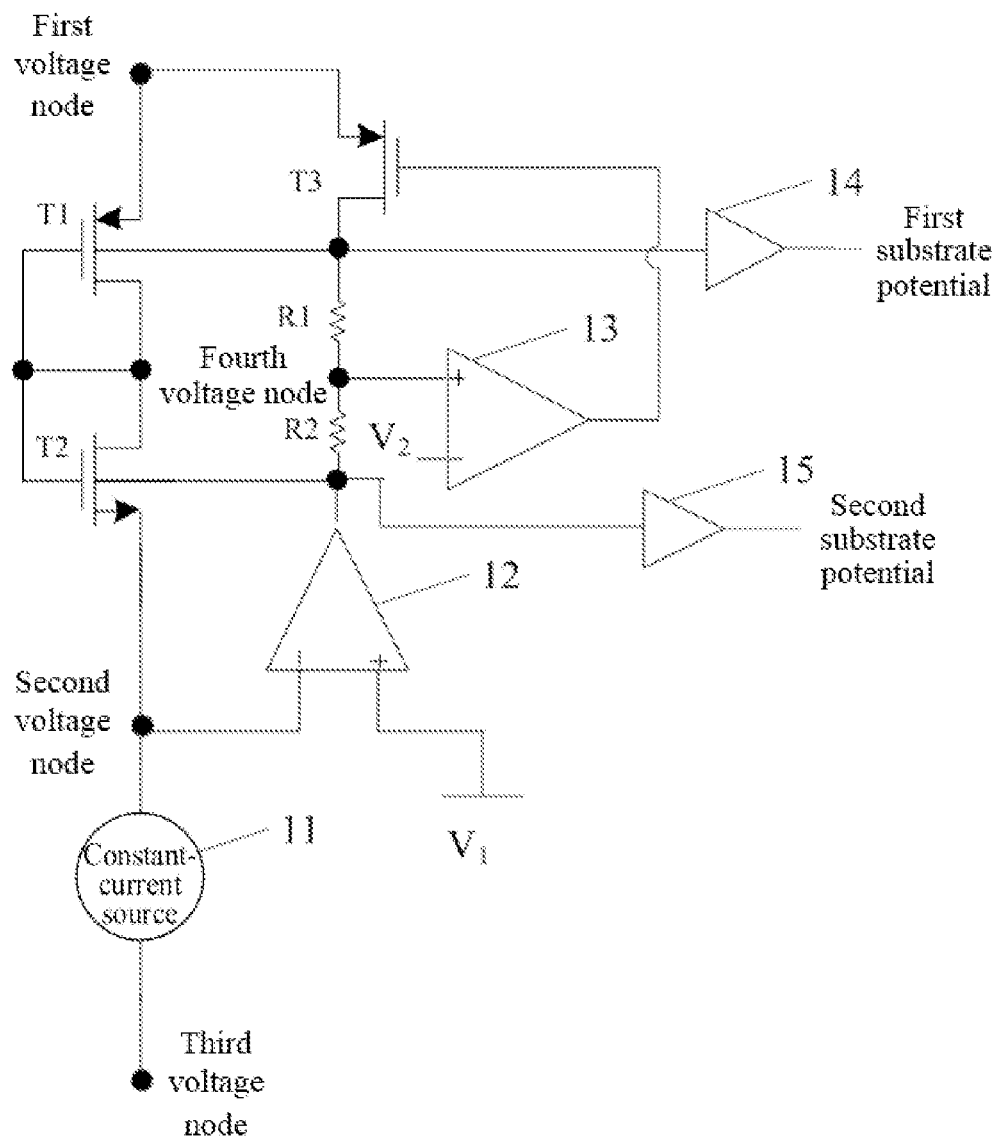
FIG. 9 is a diagram of a structure of a potential generating circuit according to embodiments of the present disclosure.
Figure 10:
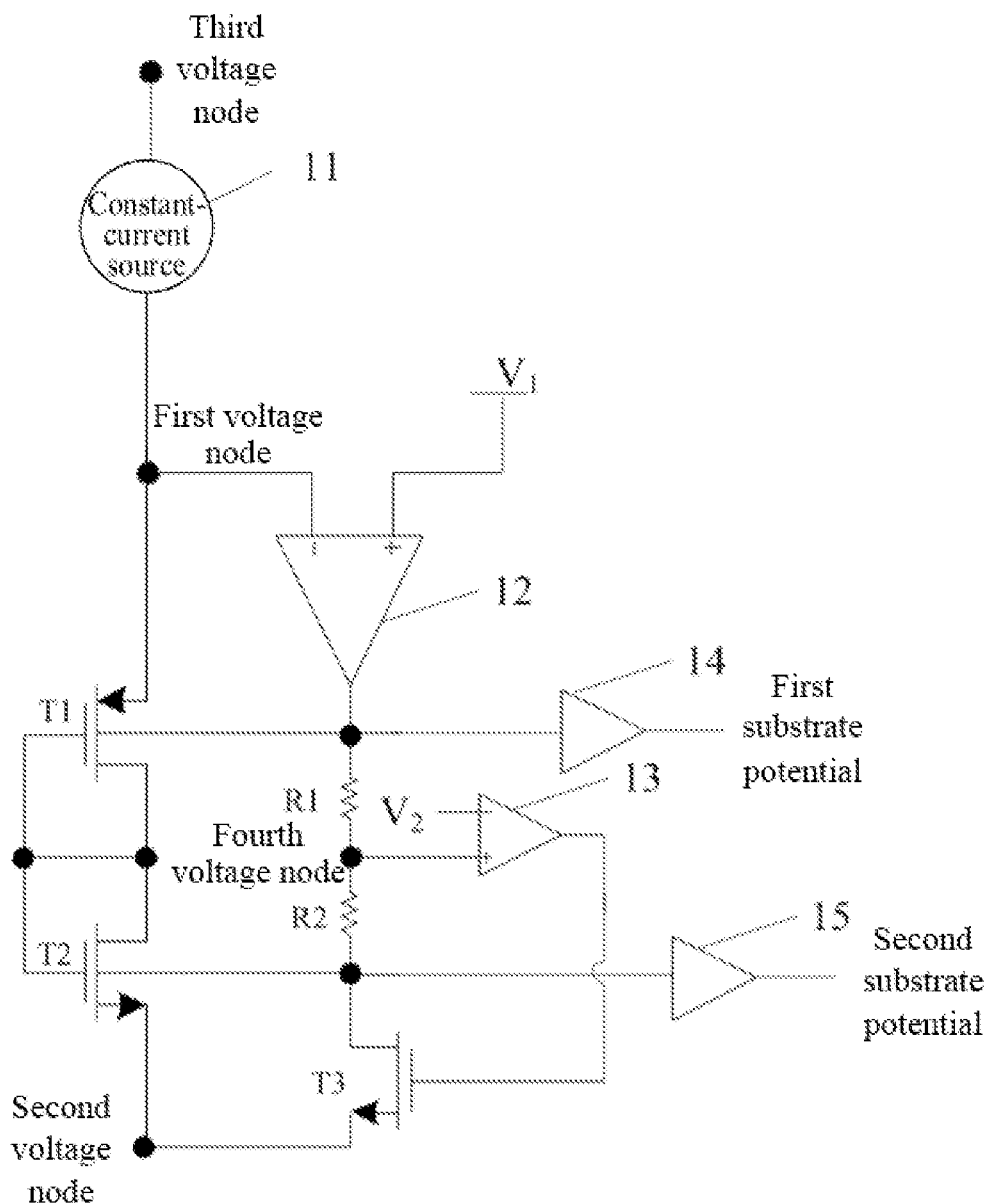
FIG. 10 is a diagram of a structure of a potential generating circuit according to embodiments of the present disclosure.

Further, based on the potential generating circuit shown in any one of FIG. 4 to FIG. 8, the potential generating circuit may further include a first buffer 14 and a second buffer 15. FIG. 9 is a diagram of a structure of a potential generating circuit according to embodiments of the present disclosure. FIG. 10 is a diagram of a structure of a potential generating circuit according to embodiments of the present disclosure. The potential generating circuit shown in FIG. 9 may further include a first buffer 14 and a second buffer 15 based on the circuit shown in FIG. 6. The potential generating circuit shown in FIG. 10 may further include a first buffer 14 and a second buffer 15 based on the circuit shown in FIG. 8.

Referring to FIG. 9 and FIG. 10, the first buffer 14 may be connected to the first output, and output a first substrate potential equal to the potential at the substrate of the first transistor T1. The input potential and the output potential of the first buffer 14 may be the same. The first buffer 14 may be configured to enhance the driving capability of the potential at the substrate of the first transistor T1, and may also isolate the substrate of the first transistor T1, preventing interference to the potential at the substrate of the first transistor T1.

The second buffer 15 may be connected to the second output, and output a second substrate potential equal to the potential at the substrate of the second transistor T2. The input potential and the output potential of the second buffer 15 may be the same. The second buffer 15 may be configured to enhance the driving capability of the potential at the substrate of the second transistor T2, and may also isolate the substrate of the second transistor T2, preventing interference to the potential at the substrate of the second transistor T2.

The structure of the potential generating circuit according to the present disclosure will be described with reference to specific embodiments. The specific structure of the potential generating circuit according to the present disclosure is not limited to any structure as follows.

Figure 11:
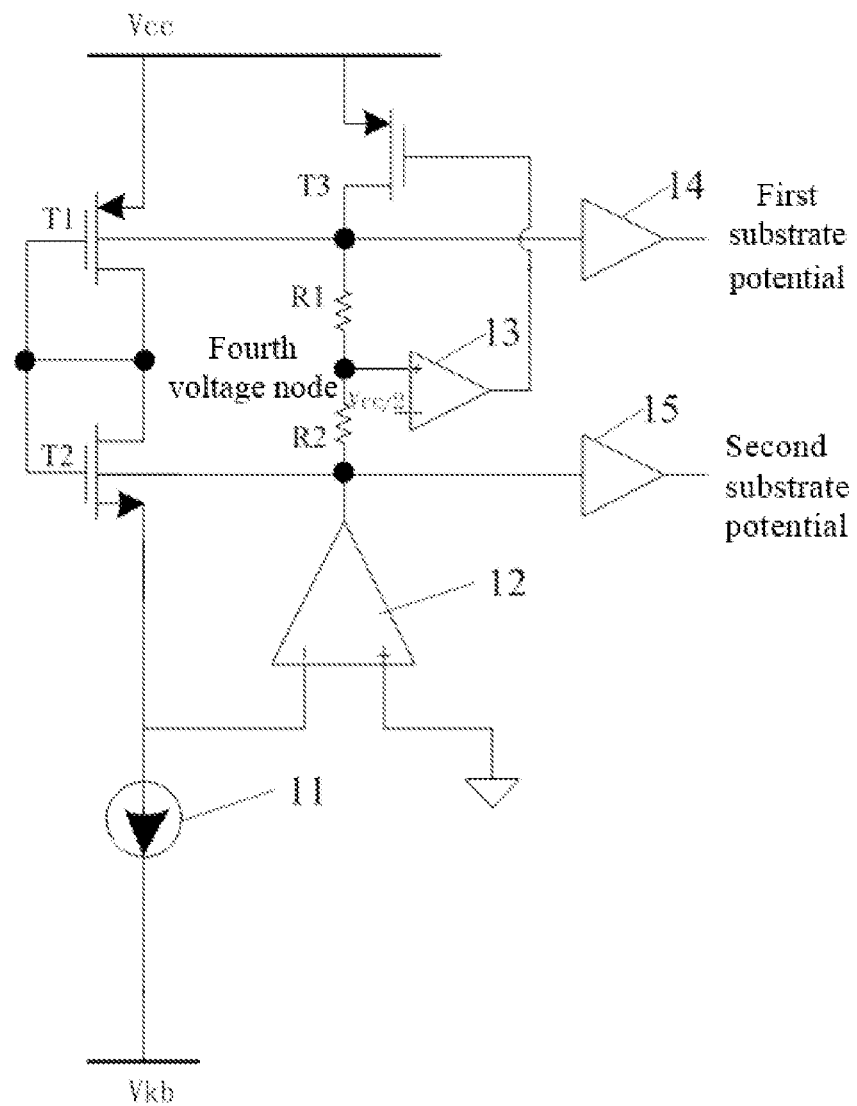
FIG. 11 is a diagram of a structure of a potential generating circuit according to embodiments of the present disclosure.

FIG. 11 is a diagram of a structure of a potential generating circuit according to embodiments of the present disclosure. The potential generating circuit according to the embodiment may include a first transistor T1, a second transistor T2, a constant current source 11, a first error amplifier 12, a second error amplifier 13, a first resistor R1, a second resistor R2, a third transistor T3, a first buffer 14, and a second buffer 15.

In the embodiment, the first transistor T1 is a P-type transistor, and the second transistor T2 is an N-type transistor. The gate of the first transistor T1 is connected to the drain of the first transistor T1, the gate of the second transistor T2 is connected to the drain of the second transistor T2, the source of the first transistor T1 is connected to the power supply Vcc, the source of the second transistor T2 is connected to the first terminal of the constant current source 11, and the drain of the first transistor T1 is connected to the drain of the second transistor T2. The second terminal of the constant current source 11 is connected to Vkb. The potential of Vkb is less than 0.

The first error amplifier 12 and the second transistor T2 may form a first feedback loop. The negative input of the first error amplifier 12 is connected to the source of the second transistor T2 and the first terminal of the constant current source 11. The positive input of the first error amplifier 12 is grounded, and the output of the first error amplifier 12 is connected to the substrate of the second transistor T2.

The negative input of the second error amplifier 13 is connected to the power supply (which may be Vcc/2, for example). The positive input of the second error amplifier 13 is connected to the fourth voltage node. The output of the second error amplifier 13 is connected to the gate of the third transistor T3. The source of the third transistor T3 is connected to the power supply Vcc. The drain of the third transistor T3 is coupled to the fourth voltage node through the first resistor R1. The output of the first error amplifier 12 is coupled to the fourth voltage node through the second resistor R2.

The first buffer 14 is connected to the substrate of the first transistor and outputs the first substrate potential. The first substrate potential may be equal to the potential at the substrate of the first transistor T1. The second buffer 15 is connected to the substrate of the second transistor, and outputs the second substrate potential. The second substrate potential may be equal to the potential at the substrate of the second transistor T2.

Optionally, the resistance of the first resistor R1 and the second resistor R2 may be set to be large, such as to be 100 MΩ. By setting the resistance of the first resistor R1 and the second resistor R2 to a large value, the output of the first error amplifier 12 may impact the input of the second error amplifier 13 merely slowly, with small impact on the first substrate potential.

In the present embodiment, the potential at the substrate of the first transistor T1 increases as the first parameter increases, and the potential at the substrate of the first transistor T1 decreases as the first parameter decreases. The potential at the substrate of the second transistor T2 decreases with the increase of the first parameter, and the potential at the substrate of the second transistor T2 increases with the decrease of the first parameter. The first parameter may be any one of a supply voltage, an operating temperature, or a manufacturing process of the potential generating circuit.

For example, the first parameter may be the operating temperature. The principle of the potential at the substrate of the first transistor T1 changing with the change in the first parameter, as well as the principle of the potential at the substrate of the second transistor T2 changing with the change in the first parameter, is elaborated below.

The current flowing through the first transistor T1 may be Id=μ*Cox*(W/L)*(Vgs−Vth)2. The μ is electron mobility. The Cox is gate capacitance. The Vgs is the voltage difference between the gate and the source. The Vth is the threshold voltage. For example, when the operating temperature increases, the electron mobility μ decreases, such that the current Id flowing through the first transistor T1 may decrease, and accordingly the inverter delay increases. In this case, if the (Vgs−Vth) is increased by a numerical value of adjustment, the change in the current caused by the decreased electron mobility μ may be compensated, and the specific numerical value of adjustment may be set as needed. In the potential generating circuit shown in FIG. 11, if the temperature rises, the electron mobility μ decreases, and the current Id flowing through the first transistor T1 decreases. In order to keep the current of the constant current source constant, the first substrate potential has to be increased, such as to Vcc+100 mV, and the second substrate potential has to be decreased, such as to −100 mV. When the temperature increases, the current Id flowing through the first transistor T1 and the second transistor T2 decreases, and for the constant current source 11, the upstream supplied current decreases, and the current flowing downstream remains constant, so that the potential at the negative input terminal of the first error amplifier 12 decreases, and thus the second substrate potential decreases, such that the output of the first error amplifier 12 becomes −100 mV gradually. The positive input of the second error amplifier 13 decreases, such that the output voltage of the second error amplifier 13 decrease, which then increases the pull-up capability of the third transistor T3, thereby increasing the voltage of the first substrate potential, such that the first substrate potential gradually becomes Vcc+100 mV.

When the first parameter is the supply voltage and the manufacturing process, the change in the supply voltage as well as in the manufacturing process may change the current Id flowing through the first transistor T1, thereby changing the delay, with the compensation principle similar to that described above, details of which are not repeated here.

Figure 12:
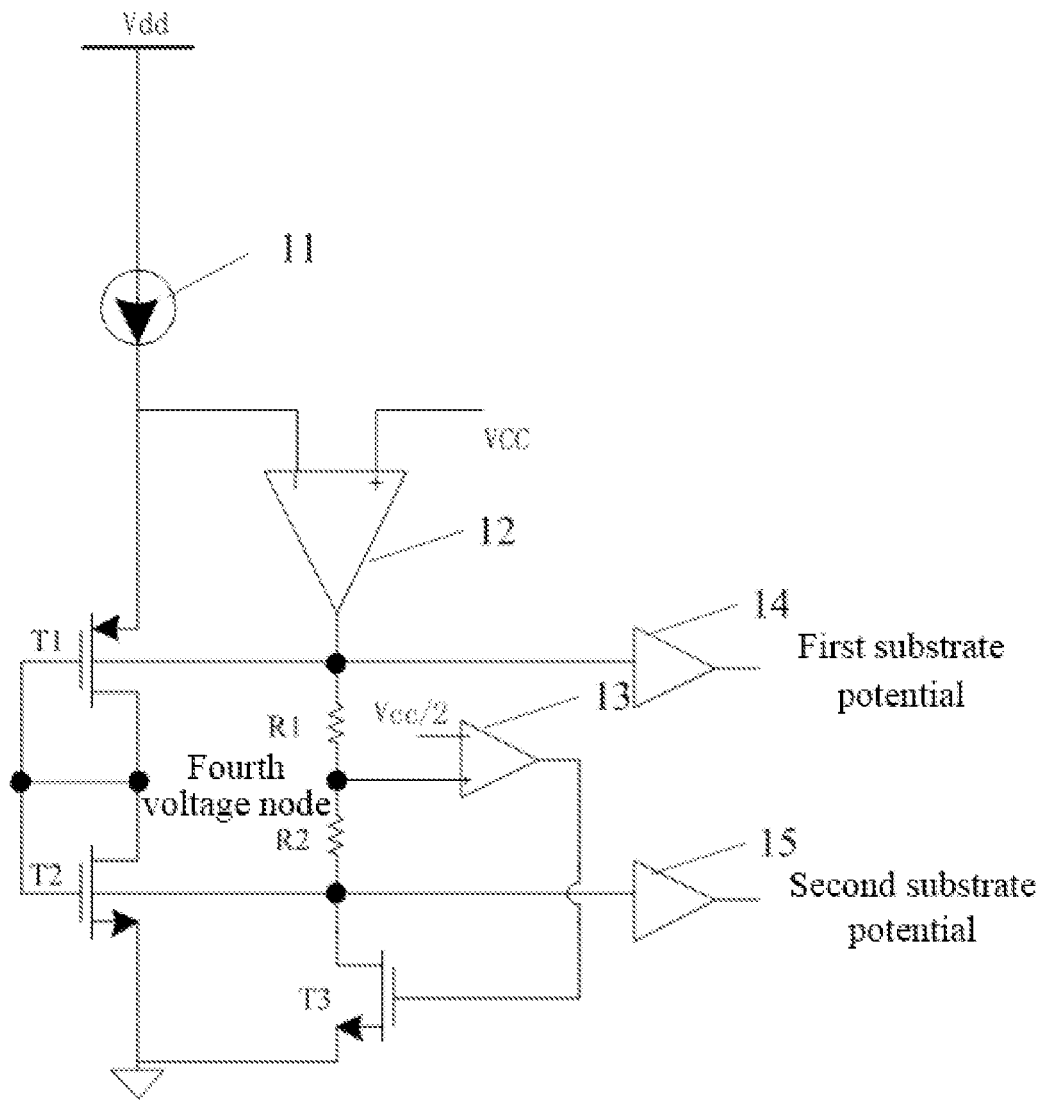
FIG. 12 is a diagram of a structure of a potential generating circuit according to embodiments of the present disclosure.

FIG. 12 is a diagram of a structure of a potential generating circuit according to embodiments of the present disclosure. The potential generating circuit according to the embodiment may include a first transistor T1, a second transistor T2, a constant current source 11, a first error amplifier 12, a second error amplifier 13, a first resistor R1, a second resistor R2, a third transistor T3, a first buffer 14, and a second buffer 15.

In the embodiment, the first transistor T1 is a P-type transistor, and the second transistor T2 is an N-type transistor. The gate of the first transistor T1 is connected to the drain of the first transistor T1, the gate of the second transistor T2 is connected to the drain of the second transistor T2, the source of the first transistor T1 is connected to the first terminal of the constant current source 11, the source of the second transistor T2 is grounded, and the drain of the first transistor T1 is connected to the drain of the second transistor T2. The second terminal of the constant current source 11 is connected to the power supply Vdd.

The first error amplifier 12 and the first transistor T1 may form a first feedback loop, a negative input of the first error amplifier 12 is connected to a first terminal of the constant current source 11, a positive input of the first error amplifier 12 is connected to a power supply Vcc, and an output of the first error amplifier 12 is connected to a substrate of the first transistor T1.

The Vdd is greater than the Vcc.

The negative input of the second error amplifier 13 is connected to the power supply (which may be, for example, Vcc/2), the positive input of the second error amplifier 13 is connected to the fourth voltage node, the output of the second error amplifier 13 is connected to the gate of the third transistor T3, the source of the third transistor T3 is grounded, the drain of the third transistor T3 is coupled to the fourth voltage node through the second resistor R2, and the output of the first error amplifier 12 is coupled to the fourth voltage node through the first resistor R1.

The first buffer 14 is connected to the substrate of the first transistor and outputs a first substrate potential. The first substrate potential is equal to potential at the substrate of the first transistor T1. The second buffer 15 is connected to the substrate of the second transistor and outputs a second substrate potential. The second substrate potential is equal to the potential at the substrate of the second transistor T2.

In the present embodiment, the potential at the substrate of the first transistor T1 increases as the first parameter increases, and the potential at the substrate of the first transistor T1 decreases as the first parameter decreases. The potential at the substrate of the second transistor T2 decreases with the increase of the first parameter, and the potential at the substrate of the second transistor T2 increases with the decrease of the first parameter. The first parameter may be any one of a supply voltage, an operating temperature, or a manufacturing process of the potential generating circuit.

Taking the first parameter being the operating temperature as an example, the principle of the potential at the substrate of the first transistor T1 varying with the first parameter, as well as the principle of the potential at the substrate of the second transistor T2 varying with the first parameter, is elaborated.

The current flowing through the first transistor T1 is Id=μ*Cox*(W/L)*(Vgs−Vth)2. The μ is the electron mobility. The Vth is the threshold voltage. For example, when the operating temperature increases, the electron mobility μ decreases, which causes the current Id flowing through the first transistor T1 to decrease, and the inverter delay increases. In this case, if the Vgs−Vth is increased by a numerical value of adjustment, the change in the current caused by decrease in the electron mobility μ may be compensated, where the specific numerical value of adjustment may be set as needed. In the potential generating circuit shown in FIG. 12, if the temperature rises, the electron mobility μ decreases, and the current Id flowing through the first transistor T1 decreases. In order to keep the current of the constant current source constant, the second substrate potential may have to be decreased, for example, to −100 mV, and increase the first substrate potential, for example, to Vcc+100 mV. If the temperature is raised, the upstream current supplied to the constant current source is constant, and the current flowing downstream the constant current source is equal to the current Id flowing through the first transistor T1 and the second transistor T2. The Id decreases, so that the potential at the negative input terminal of the first error amplifier 12 increases, and the first substrate potential increases, which causes the output of the first error amplifier 12 to gradually become Vcc+100 mV, and then the positive input of the second error amplifier 13 increases, which causes the output voltage of the second error amplifier 13 to increase, and then increases the pull-down capability of the third transistor T3, decreasing the voltage of the second substrate potential.

When the first parameter is the supply voltage and the manufacturing process, the change in the supply voltage as well as in the manufacturing process may change the current Id flowing through the first transistor T1, thereby changing the delay, with the compensation principle similar to that described above, details of which are not repeated here.

Embodiments of the present disclosure further provide a delay circuit including the potential generating circuit shown in any one of FIG. 4 to FIG. 12 and a delay unit. The delay unit includes a first inverter. The first inverter includes a fourth transistor and a fifth transistor. A substrate of the fourth transistor is connected to the potential at the substrate of the first transistor T1. A substrate of the fifth transistor is connected to the potential at the substrate of the second transistor T2.

With the delay circuit provided in the present embodiment, the potential at the substrate of the first transistor in the potential generating circuit may vary with any one of the supply voltage, the operating temperature, as well as the manufacturing process, providing the substrate of the fourth transistor with a first substrate potential varying with the first parameter, and the potential at the substrate of the second transistor may vary with any one of the supply voltage, the operating temperature, as well as the manufacturing process, providing the substrate of the fifth transistor with a second substrate potential varying with the first parameter. Therefore, the current flowing through the two transistors of the first inverter may be adjusted, and the change in the current flowing through the two transistors of the inverter may be compensated, so that the change in the delay T provided by the delay circuit is small, improving control over a delay precision by the delay circuit.

When the first transistor is a P-type transistor, the second transistor is an N-type transistor, the fourth transistor is a P-type transistor, and the fifth transistor is an N-type transistor, the change in the rising edge delay provided by the delay circuit may be adjusted by providing the substrate of the P-type transistor with a first substrate potential varying with the first parameter, so that the change in the rising edge delay provided by the delay circuit is small, and the change in the falling edge delay provided by the delay circuit may be adjusted by providing the substrate of the N-type transistor with a second substrate potential varying with the first parameter, so that the change in the falling edge delay provided by the delay circuit is small.

It should be noted that in embodiments of the present disclosure, the relation of connection between a potential generating circuit and an inverter may be set according to the number of inverters included in the delay circuit and the requirement of delay compensation. For example, two inverters are connected in series. The substrate of the P-type transistor in an inverter is connected to the substrate of the P-type transistor in the potential generating circuit. The change in the rising edge delay provided by the delay circuit may be adjusted. The substrate of the N-type transistor in the inverter is connected to the substrate of the N-type transistor in the potential generating circuit. The change in the falling edge delay provided by the delay circuit may be adjusted. In particular, the relation of connection between a potential generating circuit and an inverter may be set according to the change in the rising edge delay and/or the falling edge delay to be adjusted. The potential generating circuit provided in embodiments of the present disclosure may be applied to a delay circuit in which the rising edge and/or the falling edge is/are delayed, reducing impact of the manufacturing process, the supply voltage and the operating temperature of the delay circuit on the delay T provided by the delay circuit, reducing the change in the delay T (including the rising edge delay and/or the falling edge delay), improving control over a delay precision by the delay circuit.

Figure 13:
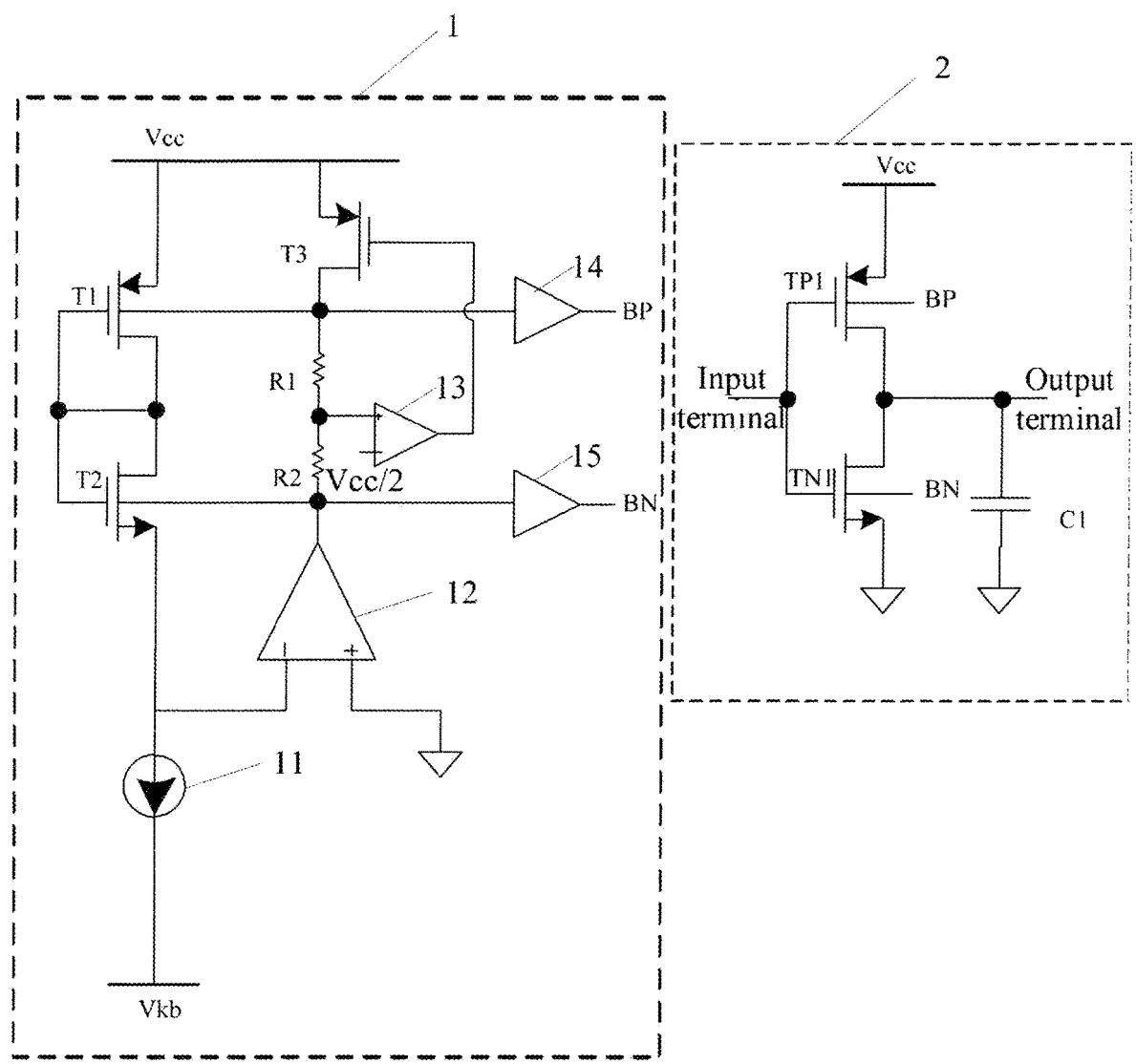
FIG. 13 is a diagram of a structure of a delay circuit according to embodiments of the present disclosure.

Examples of three delay circuits are given below with reference to FIG. 13 to FIG. 15. FIG. 13 is a diagram of a structure of a delay circuit according to embodiments of the present disclosure. As shown in FIG. 13, the delay circuit of the present embodiment includes a potential generating circuit 1 and a delay unit 2. The potential generating circuit 1 is the circuit shown in FIG. 11. Refer to description in the embodiment shown in FIG. 11 for elaboration of the structure, details of which are not repeated here. The potential generating circuit 1 outputs a first substrate potential BP and a second substrate potential BN. The delay unit 2 includes an inverter and a capacitor C1. The inverter includes a P-type transistor TP1 and an N-type transistor TN1. The substrate of the P-type transistor TP1 is connected to the first substrate potential BP, and the substrate of the N-type transistor TN1 is connected to the second substrate potential BN. In the delay circuit of the present embodiment, the potential generating circuit 1 supplies the substrate of the P-type transistor in the delay unit 2 with the first substrate potential varying with the first parameter. When the input terminal of the delay unit 2 is a falling edge, the first substrate potential BP may adjust the change in the rising edge delay provided by the delay circuit, so that the change in the rising edge delay provided by the delay circuit is small. The potential generating circuit 1 provides the substrate of the N-type transistor in the delay unit 2 with the second substrate potential varying with the first parameter. When the input terminal of the delay unit 2 is a rising edge, the second substrate potential BN may adjust the change in the falling edge delay provided by the delay circuit, so that the change in the falling edge delay provided by the delay circuit is small, thereby reducing the impact of the manufacturing process, the supply voltage and the operating temperature of the delay circuit on the delay T provided by the delay circuit, so that the change in the delay T (including the rising edge delay and the falling edge delay) is small, improving control over a delay precision by the delay circuit.

Figure 14:
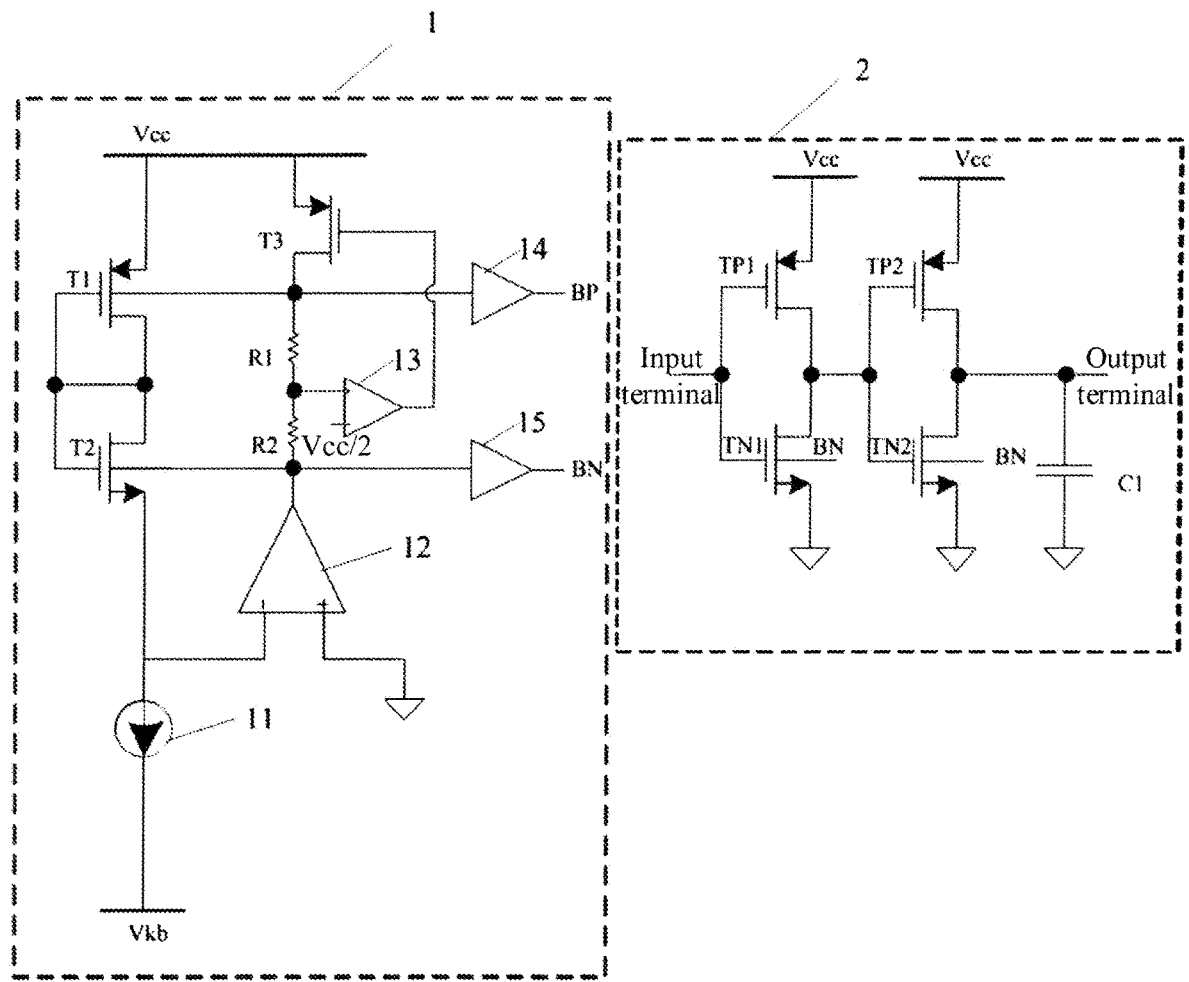
FIG. 14 is a diagram of a structure of a delay circuit according to embodiments of the present disclosure.

FIG. 14 is a diagram of a structure of a delay circuit according to embodiments of the present disclosure. As shown in FIG. 14, the delay circuit of the present embodiment includes a potential generating circuit 1 and a delay unit 2. The potential generating circuit 1 is the circuit shown in FIG. 11. Refer to the description in the embodiment shown in FIG. 11 for elaboration of the structure, details of which are not repeated here. The potential generating circuit 1 outputs a first substrate potential BP and a second substrate potential BN. The delay unit 2 includes a first inverter, a second inverter, and a capacitor C1. The first inverter includes a P-type transistor TP1 and an N-type transistor TN1. The second inverter includes a P-type transistor TP2 and an N-type transistor TN2. The substrate of the N-type transistor TN1 in the delay unit 2 is connected to the second substrate potential BN, and the substrate of the N-type transistor TN2 is connected to the second substrate potential BN. In the delay circuit of the present embodiment, the potential generating circuit 1 provides the substrates of the N-type transistor TN1 and the N-type transistor TN2 in the delay unit 2 with the second substrate potential BN varying with the first parameter. When the input of the delay unit 2 is a rising edge, the change in the falling edge delay provided by the delay circuit may be adjusted, so that the rising edge delay provided by the delay circuit changes little, thereby reducing the impact of the manufacturing process, the supply voltage, and the operating temperature of the delay circuit on the rising edge delay T provided by the delay circuit, so that the rising edge delay T changes little, improving control over a delay precision by the delay circuit.

It will be appreciated that in another delay circuit, the substrate of the P-type transistor TP1 in the delay unit 2 is connected to the first substrate potential BP, and the substrate of the P-type transistor TP2 is connected to the first substrate potential BP, so that the change in the falling edge delay provided by the delay circuit may be adjusted, so that the change in the falling edge delay provided by the delay circuit is small.

Figure 15:
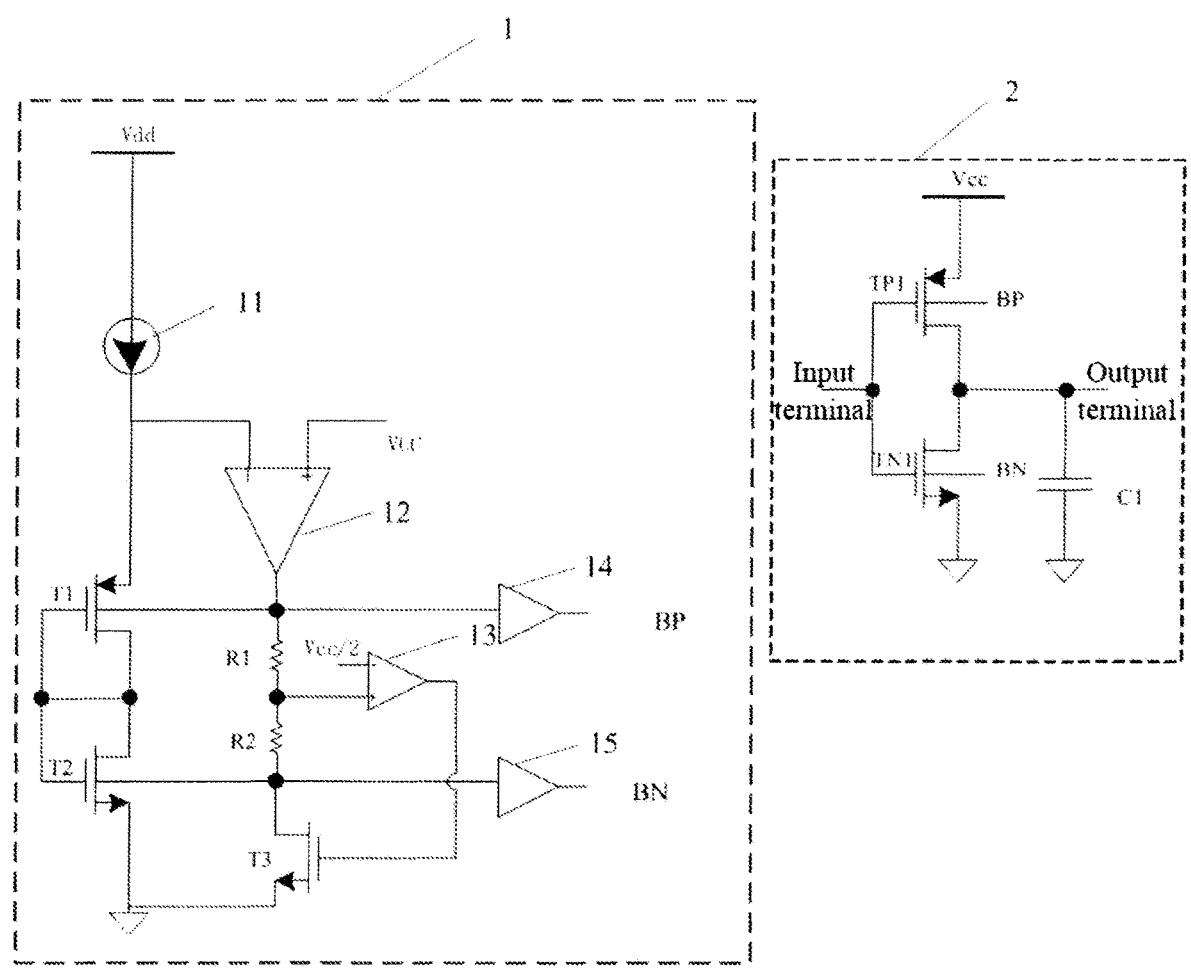
FIG. 15 is a diagram of a structure of a delay circuit according to embodiments of the present disclosure.

FIG. 15 is a diagram of a structure of a delay circuit according to embodiments of the present disclosure. As shown in FIG. 15, the delay circuit in the present embodiment differs from the delay circuit shown in FIG. 13 in that the potential generating circuit 1 in the present embodiment is the circuit shown in FIG. 12, with the remaining structure as well as the effect achieved being the same, details of which are not repeated here.

Embodiments of the present disclosure further provide a delay circuit, including the potential generating circuit shown in any one of FIG. 9 to FIG. 12 and a delay unit. The delay unit includes a first inverter. The first inverter includes a fourth transistor and a fifth transistor. The substrate of the fourth transistor is connected to a first substrate potential, and the substrate of the fifth transistor is connected to a second substrate potential.

With the delay circuit provided in the present embodiment, the first substrate potential in the potential generating circuit may vary with any one of the supply voltage, the operating temperature, as well as the manufacturing process, providing the first substrate potential varying with the first parameter to the substrate of the fourth transistor, and the second substrate potential may vary with any one of the supply voltage, the operating temperature, as well as the manufacturing process, providing the second substrate potential varying with the first parameter to the substrate of the fifth transistor, such that the current flowing through the two transistors of the first inverter may be adjusted to compensate the change in the current flowing through the two transistors of the inverter, so that the change in the delay T provided by the delay circuit is small, improving control over a delay precision by the delay circuit.

In the above two delay circuits, H is equal to L, and M is equal to N. The H is a ratio of a channel length of the first transistor T1 to a channel length of the fourth transistor. The L is a ratio of a channel length of the second transistor T2 to a channel length of the fifth transistor. The M is a ratio of a channel width of the first transistor T1 to a channel width of the fourth transistor. The N is a ratio of a channel width of the second transistor T2 to a channel width of the fifth transistor. Optionally, the H, L, M, and N may be 1. Optionally, the first transistor and the fourth transistor may be of the same type, and the second transistor and the fifth transistor may be of the same type.

Figure 16:
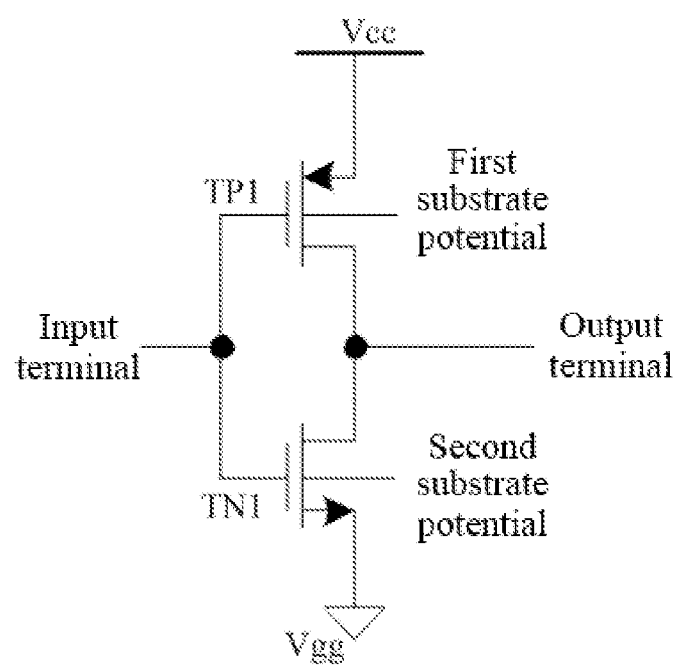
FIG. 16 is a diagram of a structure of an inverter according to embodiments of the present disclosure.

Embodiments of the present disclosure further provide an inverter. FIG. 16 is a diagram of a structure of an inverter according to embodiments of the present disclosure. As shown in FIG. 16, the inverter includes a P-type transistor and an N-type transistor.

A source of the P-type transistor TP1 is connected to a power supply. A drain of the P-type transistor TP1 is connected to a drain of the N-type transistor TN1. A source of the N-type transistor TN1 is grounded. A gate of the P-type transistor TP1 is connected to a gate of the N-type transistor TN1 and serves as the input of the inverter. The drain of the P-type transistor serves as an output of the inverter.

A substrate of the P-type transistor TP1 is connected to a first substrate potential. A substrate of the N-type transistor TN1 is connected to a second substrate potential. The first substrate potential varies with a first parameter. The second substrate potential varies with the first parameter. The first parameter may be any one of a supply voltage, an operating temperature, or a manufacturing process of the inverter.

When the first parameter is the supply voltage or the operating temperature of the inverter, the first substrate potential increases as the first parameter increases, the first substrate potential decreases as the first parameter decreases, the second substrate potential decreases as the first parameter increases, and the second substrate potential increases as the first parameter decreases.

With the inverter provided in the present embodiment, the first substrate potential may vary with any one of the supply voltage, the operating temperature, as well as the manufacturing process, providing the first substrate potential varying with the first parameter to the substrate of the TP1, and the second substrate potential may vary with any one of the supply voltage, the operating temperature, as well as the manufacturing process, providing the second substrate potential varying with the first parameter to the substrate of the TN1, such that the current flowing through the P-type transistor TP1 and the N-type transistor TN1 of the inverter may be adjusted, compensating the change in the current flowing through the two transistors of the inverter, so that the change in the delay T by the inverter is small, improving control over a delay precision by the inverter.

Figure 17:
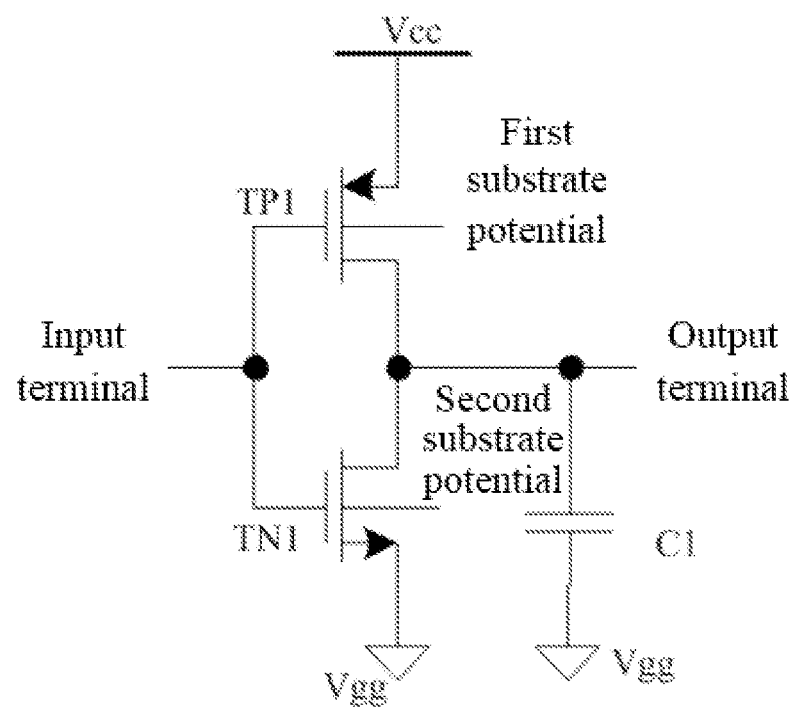
FIG. 17 is a diagram of a structure of a delay circuit according to embodiments of the present disclosure.

Embodiments of the present disclosure further provide a delay circuit. FIG. 17 is a diagram of a structure of a delay circuit according to embodiments of the present disclosure. As shown in FIG. 17, the delay circuit according to the embodiment may include an inverter as shown in FIG. 16 and a capacitor C1. One terminal of the capacitor C1 is grounded. In one possible implementation, the capacitor C1 may be an array of capacitors.

With the delay circuit according to the present embodiment, the change in the current flowing through the two transistors of the inverter may be compensated, so that the change in the delay T by the inverter is small, thereby rendering the change in the delay T provided by the delay circuit to be small, improving control over a delay precision by the delay circuit.

Embodiments of the present disclosure further provide a logic gate circuit, including a P-type transistor and an N-type transistor. A substrate of the P-type transistor is connected to a first substrate potential. A substrate of the N-type transistor is connected to a second substrate potential. The first substrate potential and the second substrate potential vary with a first parameter, such that a change in a delay between an input and an output of the logic gate circuit varying with the first parameter is within a first range. The first parameter may include any one of a supply voltage, an operating temperature, as well as a manufacturing process of the logic gate circuit.

In particular, the first range is a small range, such as a range close to 0. For example, the first range is 1% or 3% or 5%, so that the delay provided by the logic gate circuit from the input terminal to the output terminal has a small change when any one of the supply voltage, the operating temperature, as well as the manufacturing process changes, improving control over a delay precision by the logic gate circuit.

Embodiment 2

Figure 18:
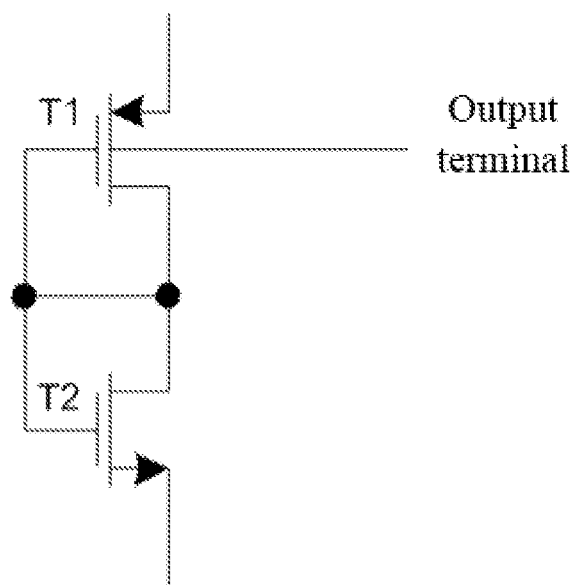
FIG. 18 is a diagram of a structure of a potential generating circuit according to embodiments of the present disclosure.

FIG. 18 is a diagram of a structure of a potential generating circuit according to embodiments of the present disclosure. As shown in FIG. 18, the potential generating circuit according to the embodiment may include a first transistor T1 and a second transistor T2. Potential at the substrate of the first transistor T1 varies with a first parameter. The first parameter may be any one of a supply voltage, an operating temperature, as well as a manufacturing process of the potential generating circuit.

The gate of the first transistor T1 is connected to the drain of the first transistor T1, the substrate of the first transistor T1 serves as the output of the potential generating circuit, and the gate of the second transistor T2 is connected to the drain of the second transistor T2.

In particular, the potential at the substrate of the first transistor T1 is the potential output by the output terminal, and the potential at the substrate of the first transistor T1 varies with the first parameter. Therefore, the potential generating circuit provided in the embodiment may output a potential varying with any one of the supply voltage, the operating temperature, as well as the manufacturing process.

In particular, if the first parameter is the supply voltage or the operating temperature of the potential generating circuit, the potential at the substrate of the first transistor T1 may vary with the first parameter as follows. The potential at the substrate of the first transistor T1 may increase as the first parameter increases, and the potential at the substrate of the first transistor T1 may decrease as the first parameter decreases. That is, the two are proportional to each other.

In one possible implementation, the first transistor T1 is a P-type transistor and the second transistor T2 is an N-type transistor.

In one possible implementation, the source of the first transistor T1 is connected to the first voltage node, the source of the second transistor T2 is connected to the second voltage node, the drain of the first transistor T1 is connected to the drain of the second transistor T2, and the substrate of the second transistor T2 is connected to the second voltage node.

Figure 19:
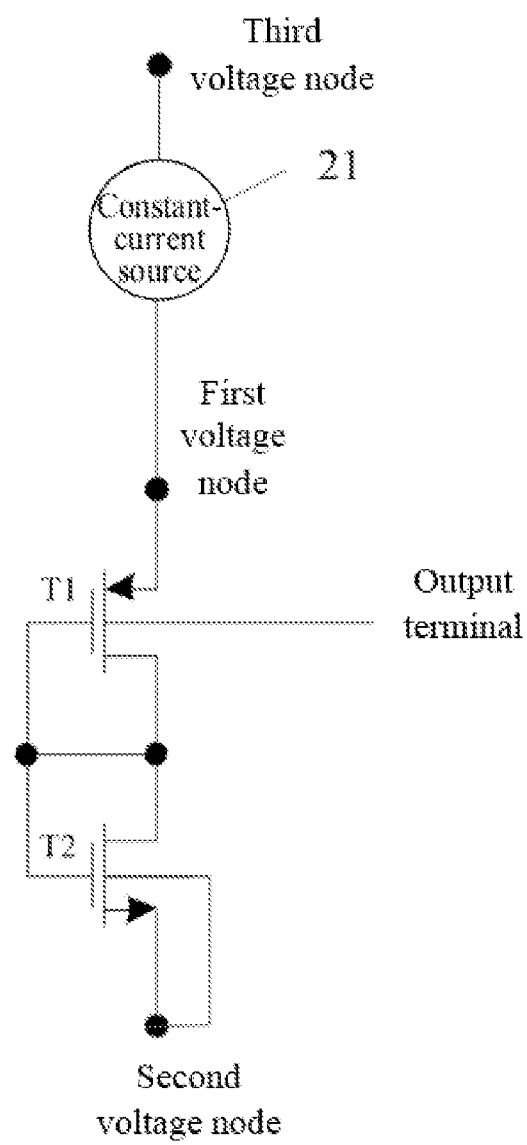
FIG. 19 is a diagram of a structure of a potential generating circuit according to embodiments of the present disclosure.

In the embodiment, FIG. 19 is a diagram of a structure of a potential generating circuit according to embodiments of the present disclosure. As shown in FIG. 19, the potential generating circuit according to this embodiment is based on the circuit shown in FIG. 18, and may further include a constant current source 21. The first terminal of the constant current source 21 is connected to the first voltage node, and the second terminal of the constant current source 21 is connected to the third voltage node.

Figure 20:
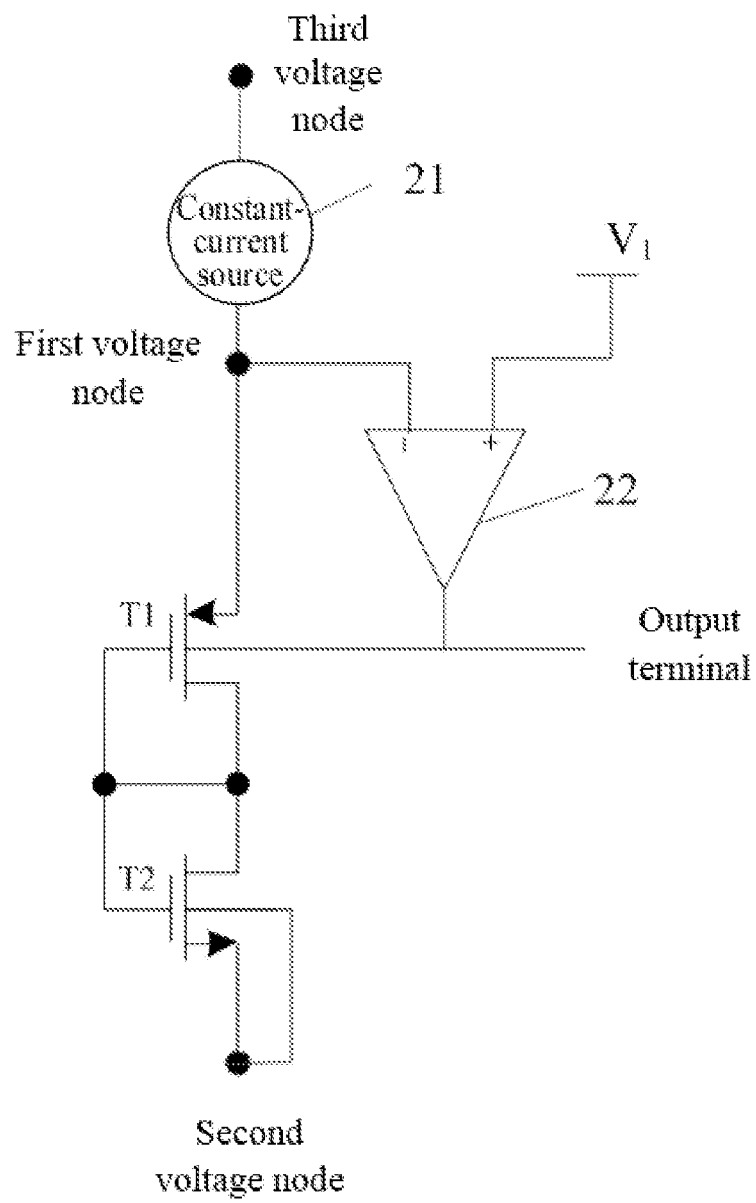
FIG. 20 is a diagram of a structure of a potential generating circuit according to embodiments of the present disclosure.

FIG. 20 is a diagram of a structure of a potential generating circuit according to embodiments of the present disclosure. As shown in FIG. 20, the potential generating circuit according to the embodiment is based on the circuit shown in FIG. 19, and further includes an error amplifier 22 that forms a feedback loop with the first transistor T1, and the substrate of the first transistor T1 is connected to a voltage node of the first feedback loop.

Optionally, as shown in FIG. 20, the negative input of the error amplifier 22 is connected to the first voltage node, the positive input of the error amplifier 22 is connected to the first reference voltage V1, and the output of the error amplifier 22 is connected to the substrate of the first transistor T1.

In the embodiment, the first reference voltage V1 may be connected to the power supply, and the potential at the third voltage node is greater than the potential at the first reference voltage V1.

In the potential generating circuit shown in FIG. 20, the potential at the third voltage node is greater than the potential at the first reference voltage V1, and the potential at the first voltage node is less than the potential at the third voltage node. For example, the voltage at the third voltage node may be Vdd, and the first reference voltage V1 may be equal to Vcc, and Vdd may be greater than Vcc.

A potential generating circuit shown in any one of FIG. 18 to FIG. 20 is provided with a first transistor and a second transistor. The gate of the first transistor is connected to the drain of the first transistor, the substrate of the first transistor serves as an output of the potential generating circuit, and the gate of the second transistor is connected to the drain of the second transistor. Since the potential at the substrate of the first transistor varies with the first parameter, the output may output a potential varying with any one of a supply voltage, an operating temperature, as well as a manufacturing process.

Figure 21:
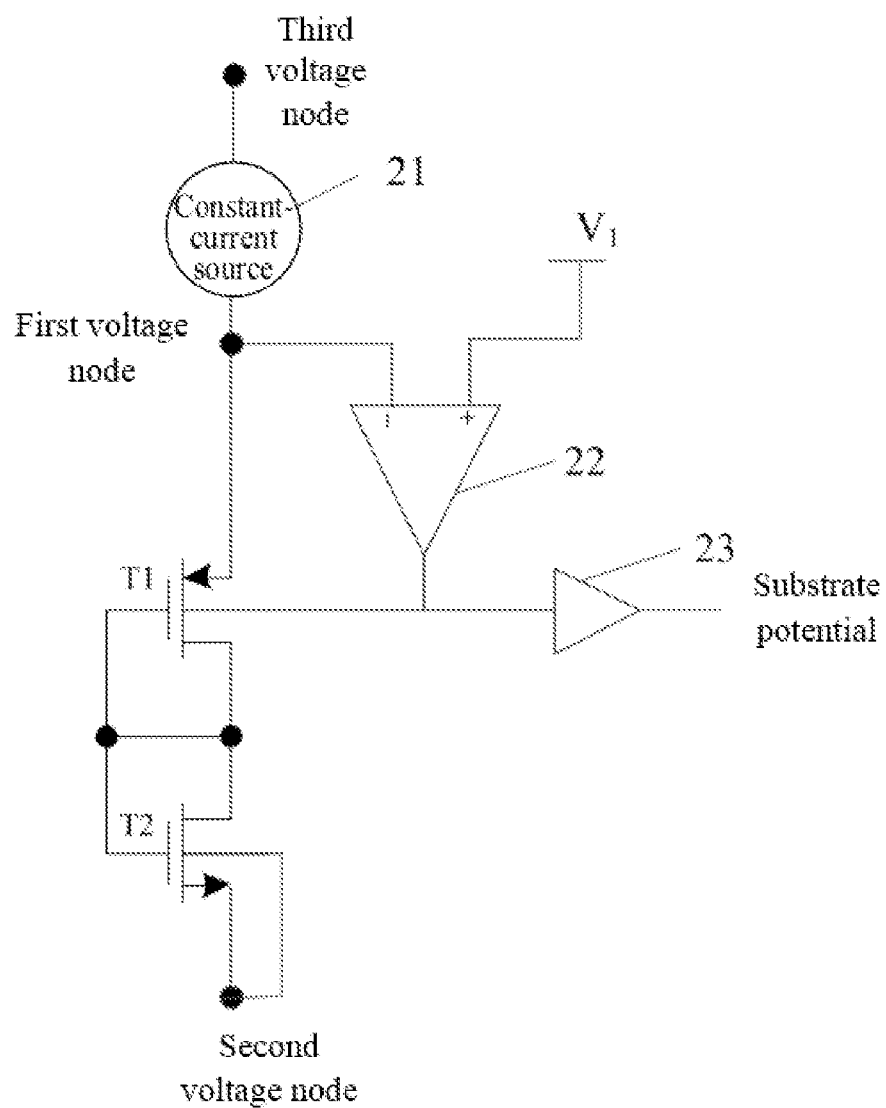
FIG. 21 is a diagram of a structure of a potential generating circuit according to embodiments of the present disclosure.

FIG. 21 is a diagram of a structure of a potential generating circuit according to embodiments of the present disclosure. As shown in FIG. 21, on the basis of the potential generating circuit shown in FIG. 20, the potential generating circuit may further include a buffer 23. The buffer 23 is connected to the output and outputs a substrate potential equal to the potential at the substrate of the first transistor T1. The input potential and the output potential of the buffer 23 are the same. The buffer 23 may be configured to enhance the driving capability of the potential at the substrate of the first transistor T1, and may also isolate the substrate of the first transistor T1, preventing interference to the potential at the substrate of the first transistor T1.

Figure 22:
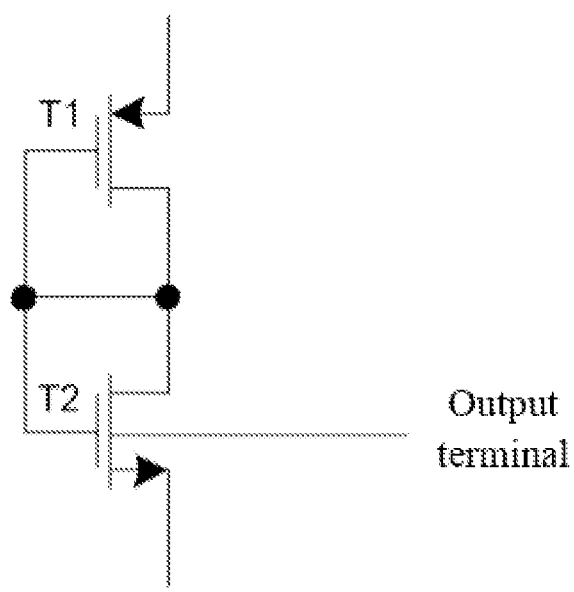
FIG. 22 is a diagram of a structure of a potential generating circuit according to embodiments of the present disclosure.

Another potential generating circuit is shown below with reference to FIG. 22 to FIG. 25. FIG. 22 is a diagram of a structure of a potential generating circuit according to embodiments of the present disclosure. As shown in FIG. 22, the potential generating circuit according to the embodiment may include a first transistor T1 and a second transistor T2. The potential at the substrate of the second transistor T2 varies with a first parameter. The first parameter may be any one of a supply voltage, an operating temperature, as well as a manufacturing process of the potential generating circuit.

The gate of the first transistor T1 is connected to the drain of the first transistor T1, the gate of the second transistor T2 is connected to the drain of the second transistor T2, and the substrate of the second transistor serves as the output of the potential generating circuit.

In particular, the potential at the substrate of the second transistor T2 is the potential output by the output terminal, and the potential at the substrate of the second transistor T2 varies with the first parameter. Therefore, the potential generating circuit provided in the embodiment may output a potential varying with any one of the supply voltage, the operating temperature, as well as the manufacturing process.

In particular, if the first parameter is the supply voltage or the operating temperature of the potential generating circuit, the potential at the substrate of the second transistor T2 may vary with the first parameter as follows. The potential at the substrate of the second transistor T2 may decrease with the increase of the first parameter, and the potential at the substrate of the second transistor T2 may increase with the decrease of the first parameter.

In one possible implementation, the first transistor T1 is a P-type transistor and the second transistor T2 is an N-type transistor.

In one possible implementation, the source of the first transistor T1 is connected to the first voltage node, the source of the second transistor T2 is connected to the second voltage node, the drain of the first transistor T1 is connected to the drain of the second transistor T2, and the substrate of the first transistor T1 is connected to the first voltage node.

Figure 23:
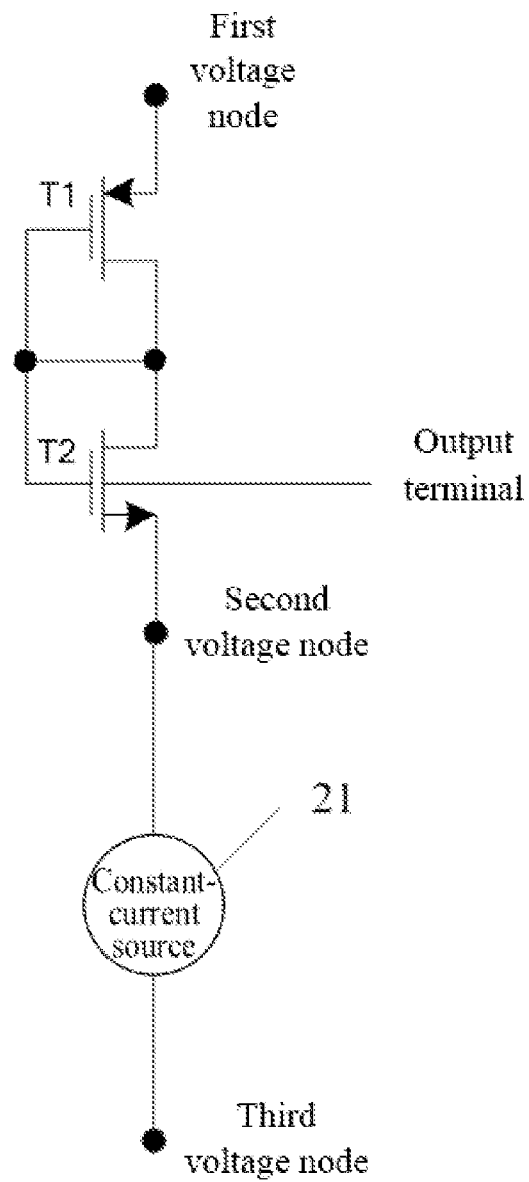
FIG. 23 is a diagram of a structure of a potential generating circuit according to embodiments of the present disclosure.

In the embodiment, FIG. 23 is a diagram of a structure of a potential generating circuit according to embodiments of the present disclosure. As shown in FIG. 23, the potential generating circuit according to this embodiment is based on the circuit shown in FIG. 22, and may further include a constant current source 21. The first terminal of the constant current source 21 is connected to the third voltage node. The second terminal of the constant current source 21 is connected to the second voltage node.

Figure 24:
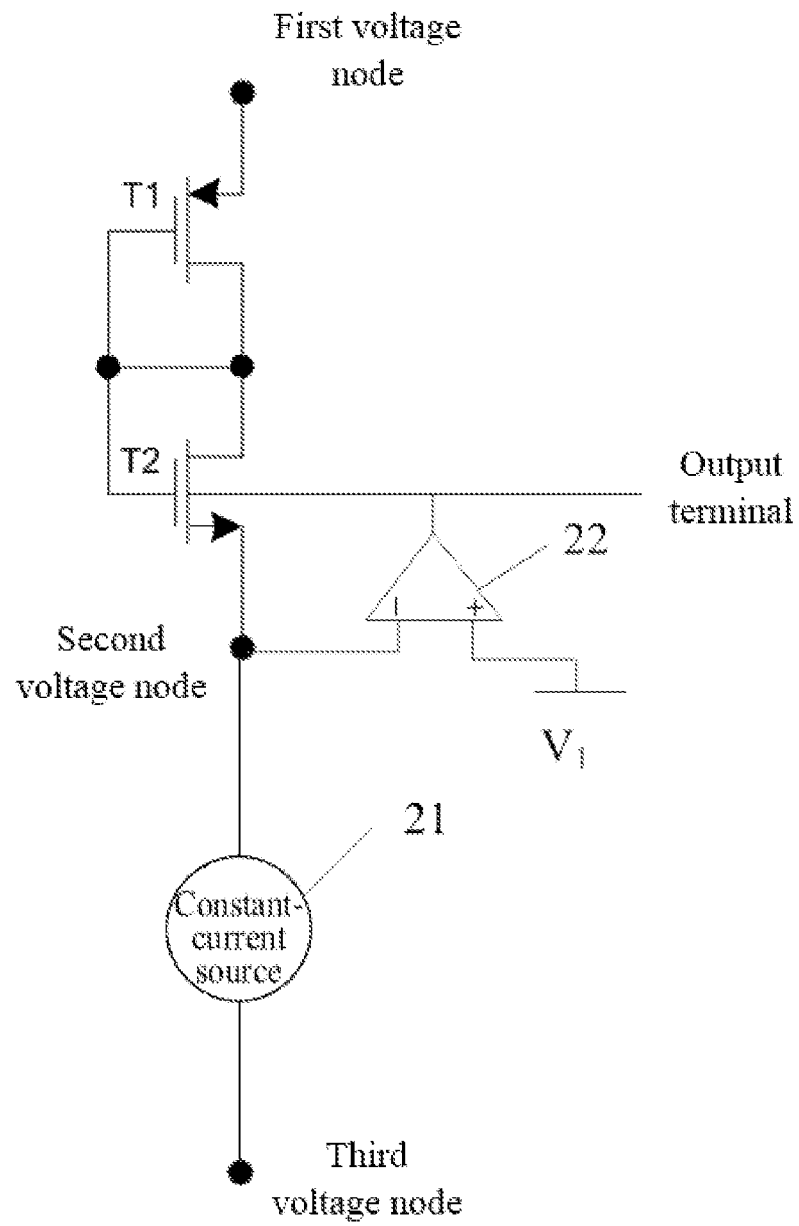
FIG. 24 is a diagram of a structure of a potential generating circuit according to embodiments of the present disclosure.

FIG. 24 is a diagram of a structure of a potential generating circuit according to embodiments of the present disclosure. As shown in FIG. 24, the potential generating circuit according to the embodiment is based on the circuit shown in FIG. 23, and may further include an error amplifier 22 that forms a feedback loop with the second transistor T2, and a substrate of the second transistor T2 is connected to a voltage node of the first feedback loop.

As shown in FIG. 24, optionally, the negative input of the error amplifier 22 is connected to the second voltage node, the positive input of the error amplifier 22 is connected to the first reference voltage V1, and the output of the error amplifier 22 is connected to the substrate of the second transistor T2.

In the embodiment, the first voltage node may be connected to a power supply Vcc. The first reference voltage V1 may be grounded Vss. A potential of the third voltage node may be less than a potential of the first reference voltage V1.

In the potential generating circuit shown in FIG. 24, the first voltage node is connected to the power supply Vcc, the first reference voltage V1 is grounded Vss, the potential of the third voltage node is less than the potential of V1. For example, the potential of the third voltage node is less than 0, and the potential of the second voltage node is greater than the potential of the third voltage node.

A potential generating circuit shown in any one of FIG. 22 to FIG. 24 is provided with a first transistor and a second transistor. The gate of the first transistor is connected to the drain of the first transistor, the gate of the second transistor is connected to the drain of the second transistor, the potential at the substrate of the second transistor T2 varies with the first parameter, and the substrate of the second transistor serves as the output of the potential generating circuit. The potential at the substrate of the second transistor varies with the first parameter, such that the output may output a potential varying with any one of a supply voltage, an operating temperature, as well as a manufacturing process.

Figure 25:
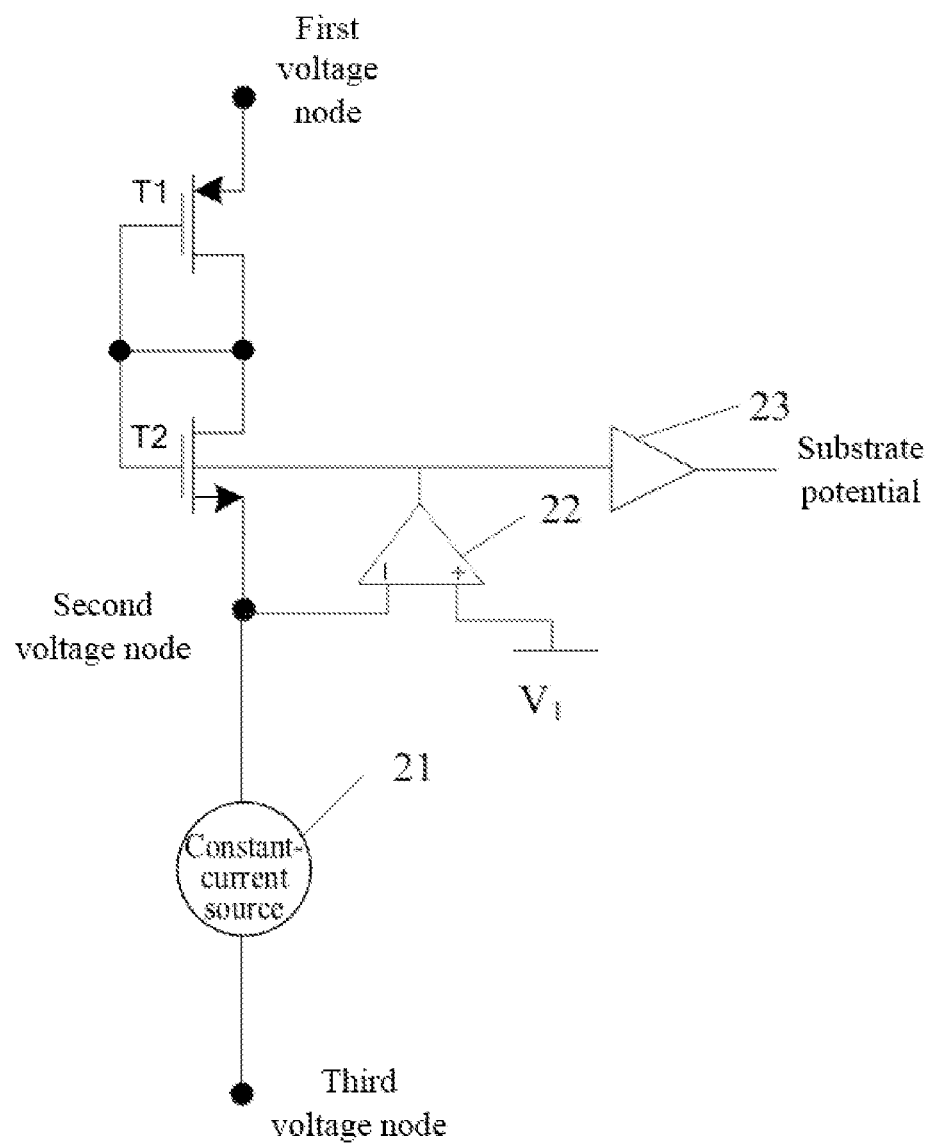
FIG. 25 is a diagram of a structure of a potential generating circuit according to embodiments of the present disclosure.

FIG. 25 is a diagram of a structure of a potential generating circuit according to embodiments of the present disclosure. As shown in FIG. 25, based on the potential generating circuit shown in FIG. 24, the potential generating circuit may further include a buffer 23. The buffer 23 is connected to the output, and outputs a substrate potential. The substrate potential is equal to the potential at the substrate of the second transistor T2. The input potential and the output potential of the buffer 23 are the same. The buffer 23 may be configured to enhance the driving capability of the potential at the substrate of the second transistor T2, and may also isolate the substrate of the second transistor T2, preventing interference to the potential at the substrate of the second transistor T2.

The structure of the potential generating circuit according to the present disclosure will be described with reference to specific embodiments. The specific structure of the potential generating circuit according to the present disclosure is not limited to any structure as follows.

Figure 26:
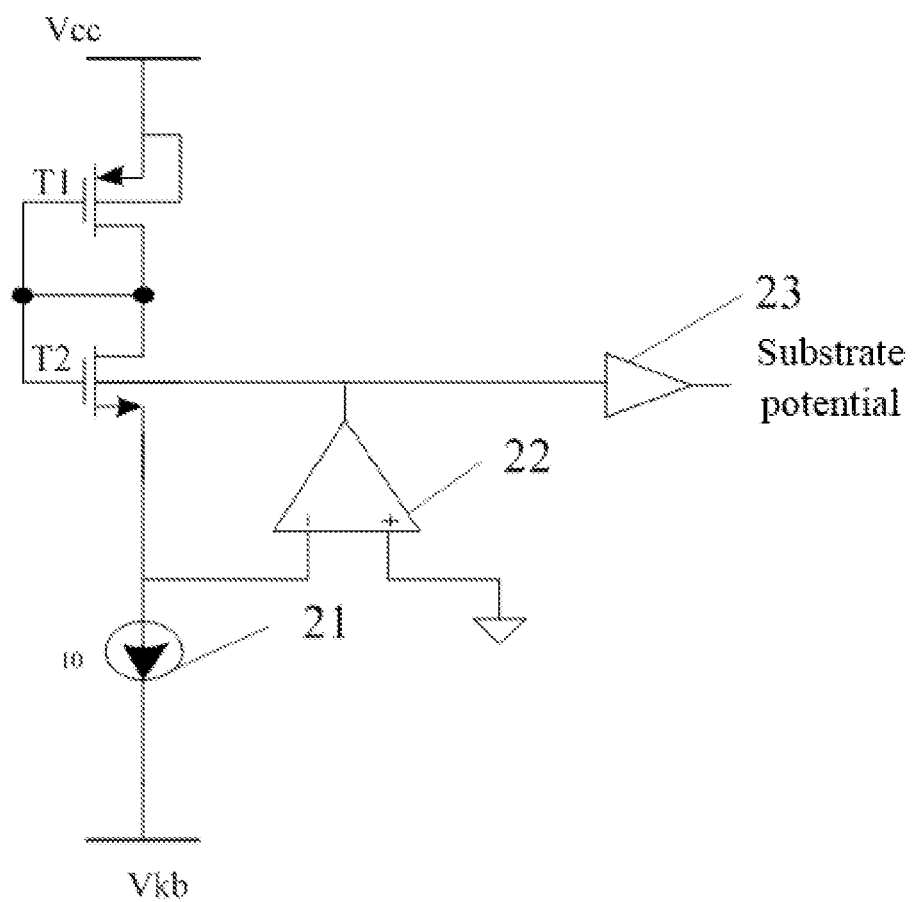
FIG. 26 is a diagram of a structure of a potential generating circuit according to embodiments of the present disclosure.

FIG. 26 is a diagram of a structure of a potential generating circuit according to embodiments of the present disclosure. As shown in FIG. 26, the potential generating circuit according to the embodiment may include a first transistor T1, a second transistor T2, a constant current source 21, an error amplifier 22, and a buffer 23.

In the embodiment, the first transistor T1 is a P-type transistor, and the second transistor T2 is an N-type transistor. The gate of the first transistor T1 is connected to the drain of the first transistor T1, the gate of the second transistor T2 is connected to the drain of the second transistor T2, the source of the first transistor T1 is connected to the power supply Vcc, the source of the second transistor T2 is connected to the first terminal of the constant current source 21, and the drain of the first transistor T1 is connected to the drain of the second transistor T2. The second terminal of the constant current source 21 is connected to Vkb. The potential of Vkb is less than 0.

The error amplifier 22 and the second transistor T2 may form a first feedback loop. The negative input of the error amplifier 22 is connected to the source of the second transistor T2 and the first terminal of the constant current source 21. The positive input of the error amplifier 22 is grounded. The output of the error amplifier 22 is connected to the substrate of the second transistor T2.

The buffer 23 is connected to the substrate of the second transistor T2, and outputs a substrate potential. The substrate potential is equal to the potential at the substrate of the second transistor T2.

In the present embodiment, the potential at the substrate of the second transistor T2 may vary with the first parameter as follows. The potential at the substrate of the second transistor T2 may decrease as the first parameter increases, and the potential at the substrate of the second transistor T2 may increase as the first parameter decreases. The first parameter may be any one of a supply voltage, an operating temperature, or a manufacturing process of the potential generating circuit.

Taking the first parameter being the operating temperature as an example, the principle of the potential at the substrate of the second transistor T2 varying with the first parameter is elaborated below.

The current flowing through the second transistor T2 is $Id=\mu*Cox*(W/L)*(Vgs-Vth)^2$. The $\mu$ is electron mobility. The Vth is a threshold voltage. For example, when the operating temperature increases, the electron mobility $\mu$ decreases, which causes the current Id flowing through the second transistor T2 to decrease, and the inverter delay to increase. In this case, if the Vgs−Vth is increased by a numerical value of adjustment, the change in the current caused by decrease in the electron mobility $\mu$ may be compensated, where the specific numerical value of adjustment may be set as needed. In the potential generating circuit shown in FIG. 26, if the temperature rises, the electron mobility $\mu$ decreases, and the current Id flowing through the second transistor T2 decreases. In order to keep the current of the constant current source constant, the potential at the substrate of the second transistor T2 may have to be decreased, and at this time, the potential at the substrate decreases as the temperature rises.

When the first parameter is the supply voltage and the manufacturing process, the change in the supply voltage as well as in the manufacturing process may change the current Id flowing through the second transistor T2, thereby changing the delay, with the compensation principle similar to that described above, details of which are not repeated here.

Figure 27:
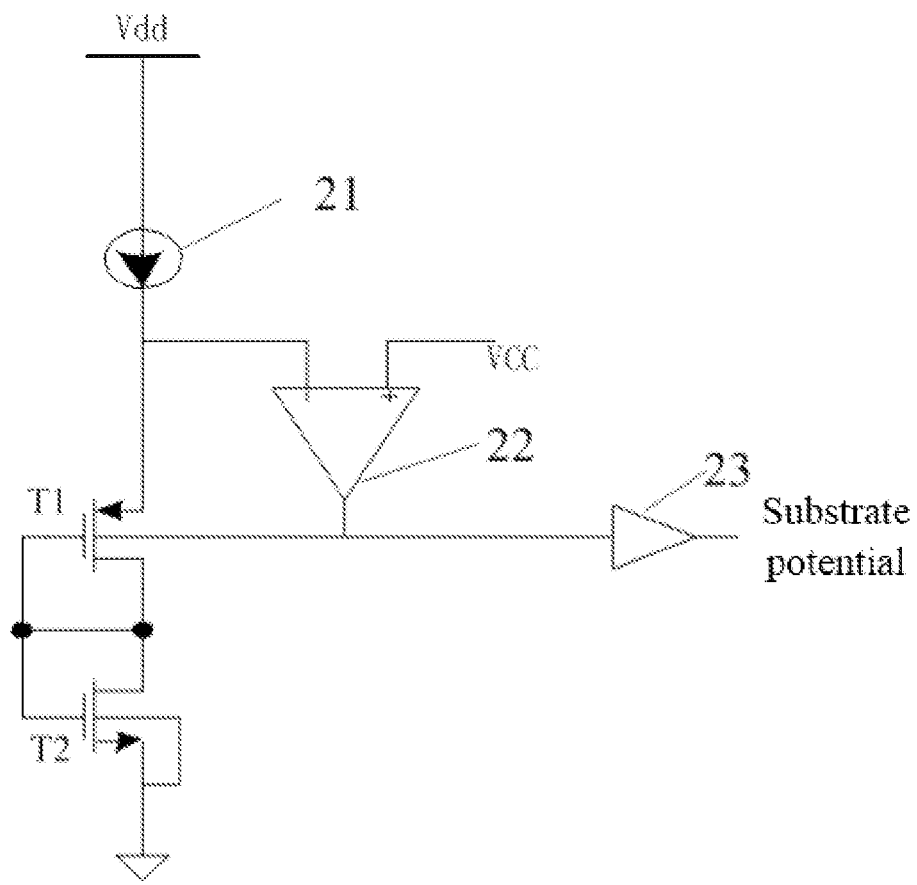
FIG. 27 is a diagram of a structure of a potential generating circuit according to embodiments of the present disclosure.

FIG. 27 is a diagram of a structure of a potential generating circuit according to embodiments of the present disclosure. As shown in FIG. 27, the potential generating circuit according to the embodiment may include a first transistor T1, a second transistor T2, a constant current source 21, an error amplifier 22, and a buffer 23.

In the embodiment, the first transistor T1 is a P-type transistor, and the second transistor T2 is an N-type transistor. The gate of the first transistor T1 is connected to the drain of the first transistor T1, the gate of the second transistor T2 is connected to the drain of the second transistor T2, the source of the first transistor T1 is connected to the first terminal of the constant current source 21, the source of the second transistor T2 is grounded, and the drain of the first transistor T1 is connected to the drain of the second transistor T2. The second terminal of the constant current source 21 is connected to Vdd.

The error amplifier 22 and the first transistor T1 may form a first feedback loop. The negative input of the error amplifier 22 is connected to the source of the first transistor T1 and the first terminal of the constant current source 21. The positive input of the error amplifier 22 is connected to the power supply Vcc. The output of the error amplifier 22 is connected to the substrate of the first transistor T1.

The Vdd is greater than Vcc.

The buffer 23 is connected to the substrate of the first transistor T1, and outputs a substrate potential equal to the potential at the substrate of the first transistor T1.

In the present embodiment, the potential at the substrate of the first transistor T1 may vary with the first parameter as follows. The potential at the substrate of the first transistor T1 may increase with increase of the first parameter, and the potential at the substrate of the first transistor T1 may decrease with decrease of the first parameter. The first parameter may be any one of a supply voltage, an operating temperature, or a manufacturing process of the potential generating circuit.

Taking the first parameter being the operating temperature as an example, the principle of the potential at the substrate of the first transistor T1 varying with the first parameter is elaborated below.

The current flowing through the first transistor T1 is $Id = \mu * Cox * (W/L) * (Vgs-Vth)^2$. The $\mu$ is electron mobility. The Vth is a threshold voltage. For example, when the operating temperature increases, the electron mobility $\mu$ decreases, which causes the current Id flowing through the first transistor T1 to decrease, and the inverter delay to increase. In this case, if the Vgs–Vth is increased by a numerical value of adjustment, the change in the current caused by decrease in the electron mobility $\mu$ may be compensated, where the specific numerical value of adjustment may be set as needed. In the potential generating circuit shown in FIG. 26, if the temperature rises, the electron mobility $\mu$ decreases, and the current Id flowing through the first transistor T1 decreases. In order to keep the current of the constant current source constant, the potential at the substrate of the first transistor T1 may have to be decreased, and at this time, the potential at the substrate decreases as the temperature rises.

When the first parameter is the supply voltage and the manufacturing process, the change in the supply voltage as well as in the manufacturing process may change the current Id flowing through the second transistor T2, thereby changing the delay, with the compensation principle similar to that described above, details of which are not repeated here.

Embodiments of the present disclosure further provide a delay circuit, including the potential generating circuit shown in FIG. 18 or FIG. 19 or FIG. 20, FIG. 21 or FIG. 27, and a delay unit. The delay unit includes a first inverter. The first inverter includes a fourth transistor and a fifth transistor, the substrate of the fourth transistor is connected to the potential at the substrate of the first transistor, and the substrate of the fifth transistor is grounded. The fourth transistor is a P-type transistor, and the fifth transistor being an N-type transistor.

Optionally, H is equal to L, and M is equal to N. The H is a ratio of a channel length of the first transistor to a channel length of the fourth transistor. The L is a ratio of a channel length of the second transistor to a channel length of the fifth transistor. The M is a ratio of a channel width of the first transistor to a channel width of the fourth transistor. The N is a ratio of a channel width of the second transistor to a channel width of the fifth transistor. Optionally, the H, L, M, and N may be 1. Optionally, the first transistor and the fourth transistor may be of the same type, and the second transistor and the fifth transistor may be of the same type.

With the delay circuit provided in the present embodiment, the potential at the substrate of the first transistor in the potential generating circuit may vary with any one of the supply voltage, the operating temperature, as well as the manufacturing process, providing the substrate of the P-type transistor in the inverter with a substrate potential varying with the first parameter. Therefore, the current flowing through the P-type transistor in the inverter may be adjusted, and the change in the current flowing through the P-type transistor in the inverter may be compensated, so that the change in the rising edge delay T provided by the delay circuit is small, improving control over a rising edge delay precision by the delay circuit.

The delay circuit according to the present embodiment may be applied to a scene in which the rising edge delay provided by the delay circuit has to be controlled precisely. For example, the delay circuit may be applied to a DRAM, and the impact of any one of a supply voltage, an operating temperature, as well as a manufacturing process on the rising edge delay may be compensated at the same time, rendering the change in the rising edge delay T to be small, improving control over a rising edge delay precision by the delay circuit.

Embodiments of the present disclosure further provide a delay circuit, including the potential generating circuit shown in any one of FIG. 22 to FIG. 26 and a delay unit. The delay unit includes a first inverter. The first inverter includes a fourth transistor and a fifth transistor. The substrate of the fourth transistor is connected to the potential at the substrate of the first transistor, and the substrate of the fifth transistor is connected to the power supply terminal. The fourth transistor may be a P-type transistor, and the fifth transistor may be an N-type transistor.

Optionally, H is equal to L, and M is equal to N. The H is a ratio of a channel length of the first transistor to a channel length of the fourth transistor. The L is a ratio of a channel length of the second transistor to a channel length of the fifth transistor. The M is a ratio of a channel width of the first transistor to a channel width of the fourth transistor. The N is a ratio of a channel width of the second transistor to a channel width of the fifth transistor. Optionally, the H, L, M, and N may be 1. Optionally, the first transistor and the fourth transistor may be of the same type, and the second transistor and the fifth transistor may be of the same type.

With the delay circuit provided in the present embodiment, the potential at the substrate of the first transistor in the potential generating circuit may vary with any one of the supply voltage, the operating temperature, as well as the manufacturing process, providing the substrate of the N-type transistor in the inverter with a substrate potential varying with the first parameter. Therefore, the current flowing through the N-type transistor in the inverter may be adjusted, and the change in the current flowing through the N-type transistor in the inverter may be compensated, so that the change in the falling edge delay T provided by the delay circuit is small, improving control over a falling edge delay precision by the delay circuit.

The delay circuit according to the present embodiment may be applied to a scene in which the falling edge delay provided by the delay circuit has to be controlled precisely. For example, the delay circuit may be applied to a DRAM, and the impact of any one of a supply voltage, an operating temperature, as well as a manufacturing process on the falling edge delay may be compensated at the same time, rendering the change in the falling edge delay T to be small, improving control over a falling edge delay precision by the delay circuit.

Embodiments of the present disclosure further provide a delay circuit, including a first potential generating circuit, a second potential generating circuit, and a delay unit.

The first potential generating circuit is the potential generating circuit shown in FIG. 18 or FIG. 19 or FIG. 20 or FIG. 21 or FIG. 27.

The second potential generating circuit is the potential generating circuit shown in any one of FIG. 22 to FIG. 26.

The delay unit includes a first inverter. The first inverter includes a fourth transistor and a fifth transistor. The substrate of the fourth transistor is connected to the potential at the substrate of the first transistor in the first potential generating circuit, and the substrate of the fifth transistor is connected to the potential at the substrate of the second transistor in the second potential generating circuit. The fourth transistor is a P-type transistor, and the fifth transistor is an N-type transistor.

Optionally, H1 is equal to L1, and M1 is equal to N1. The H1 is a ratio of a channel length of the first transistor in the first potential generating circuit to a channel length of the fourth transistor. The L1 is a ratio of a channel length of the second transistor in the first potential generating circuit to a channel length of the fifth transistor. The M1 is a ratio of a channel width of the first transistor in the first potential generating circuits to a channel width of the fourth transistor. The N1 is a ratio of a channel width of the second transistor in the first potential generating circuit to a channel width of the fifth transistor. Optionally, the H1, L1, M1, and N1 may be 1.

H2 is equal to L2, and M2 is equal to N2. The H2 is a ratio of a channel length of the first transistor in the second potential generating circuit to a channel length of the fourth transistor. The L2 is a ratio of a channel length of the second transistor in the second potential generating circuit to a channel length of the fifth transistor. The M2 is a ratio of a channel width of the first transistor in the second potential generating circuit to a channel width of the fourth transistor. The N2 is a ratio of a channel width of the second transistor in the second potential generating circuit to a channel width of the fifth transistor. Optionally, the H2, L2, M2, and N2 may be 1.

The delay circuit according to the present embodiment may be applied to a scene in which the rising edge delay and the falling edge delay provided by the delay circuit have to be controlled precisely. For example, the delay circuit may be applied to a DRAM, and the impact of any one of a supply voltage, an operating temperature, as well as a manufacturing process on the rising edge delay and the falling edge delay may be compensated at the same time, so that changes in the rising edge delay T and the falling edge delay T are small, improving control over a rising edge delay precision and a falling edge delay precision by the delay circuit.

It should be noted that with the delay circuit provided in embodiments of the present disclosure, the relation of connection between an inverter in a delay unit and a potential generating circuit shown in the two embodiments may be set according to the rising edge delay and/or the falling edge delay implemented by the delay unit. For example, a delay circuit implements a rising edge delay, and the delay circuit includes an inverter, and the inverter includes a P-type transistor and an N-type transistor. Then, a first potential generating circuit is provided in the delay circuit, and the first potential generating circuit may provide a substrate potential that varies with the first parameter to the substrate of the P-type transistor in the inverter, so that the current flowing through the P-type transistor in the inverter may be adjusted to compensate a change in the current flowing through the P-type transistor in the inverter, rendering the change in the rising edge delay T provided by the delay circuit to be small. As another example, a delay circuit implements a falling edge delay. The delay circuit includes an inverter. The inverter includes a P-type transistor and an N-type transistor. Then, a second potential generating circuit is provided in the delay circuit. The second potential generating circuit may provide a substrate potential that varies with a first parameter to a substrate of the N-type transistor in the inverter, so that a current flowing through the N-type transistor in the inverter may be adjusted to compensate a change in the current flowing through the N-type transistor in the inverter, rendering the change in the falling edge delay T provided by the delay circuit to be small. As another example, a delay circuit implements a rising edge delay and a falling edge delay. The delay circuit includes an inverter. The inverter includes a P-type transistor and an N-type transistor. Then, a first potential generating circuit and a second potential generating circuit are provided in the delay circuit. The first potential generating circuit may provide a substrate potential that varies with a first parameter to a substrate of the P-type transistor in the inverter, so that a current flowing through the P-type transistor in the inverter may be adjusted to compensate a change in the current flowing through the P-type transistor in the inverter, rendering a change in a delay T of the rising edge by the delay circuit to be small. The second potential generating circuit may provide a substrate potential that varies with a first parameter to a substrate of the N-type transistor in the inverter, so that the current flowing through the N-type transistor in the inverter may be adjusted to compensate a change in the current flowing through the N-type transistor in the inverter, rendering a change in the delay T of the falling edge by the delay circuit to be small. Thus, the changes in the rising edge delay T and the falling edge delay T provided by the delay circuit may both be made small, improving control over a delay precision, including a rising edge delay precision and a falling edge delay precision, by the delay circuit.

Figure 28:
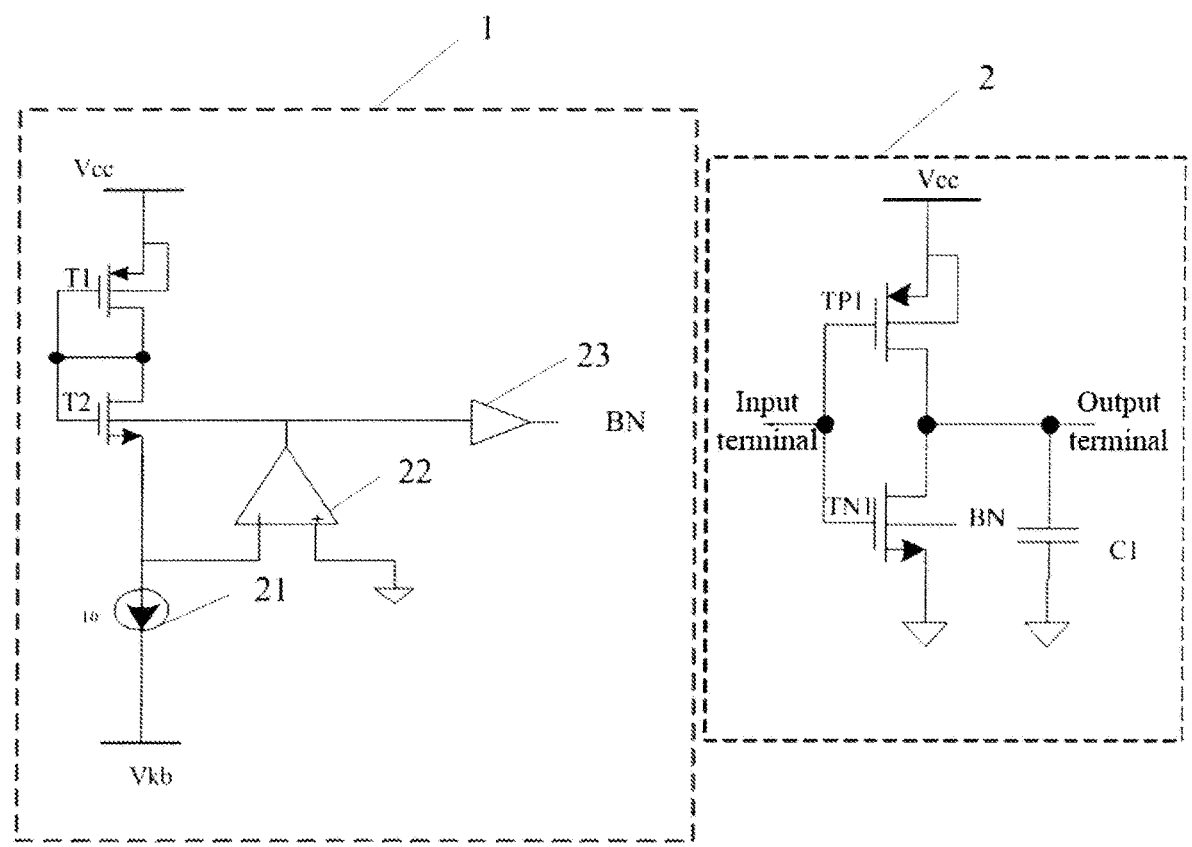
FIG. 28 is a diagram of a structure of a delay circuit according to embodiments of the present disclosure.

An example of three delay circuits is given below with reference to FIG. 28 to FIG. 30. FIG. 28 is a diagram of a structure of a delay circuit according to embodiments of the present disclosure. As shown in FIG. 28, the delay circuit of the present embodiment includes a potential generating circuit 1 and a delay unit 2. The potential generating circuit 1 is the circuit shown in FIG. 26. For elaboration of the structure, refer to the description in the embodiment shown in FIG. 26, details of which are not repeated here. The potential generating circuit 1 outputs a substrate potential BN. The delay unit 2 includes an inverter and a capacitor C1. The inverter includes a P-type transistor TP1 and an N-type transistor TN1. The substrate of the P-type transistor TP1 is connected to a power supply terminal Vcc. The substrate of the N-type transistor TN1 is connected to the substrate potential BN. In the delay circuit of the present embodiment, the potential generating circuit 1 provides a substrate potential that varies with the first parameter to the substrate of the N-type transistor in the delay unit 2, so that the change in the falling edge delay provided by the delay circuit may be adjusted, rendering the change in the falling edge delay provided by the delay circuit to be small, thereby reducing the impact of the manufacturing process, the supply voltage, and the operating temperature of the delay circuit on the falling edge delay T provided by the delay circuit, rendering the change in the falling edge delay T to be small, improving control over the falling edge delay precision by the delay circuit.

Figure 29:
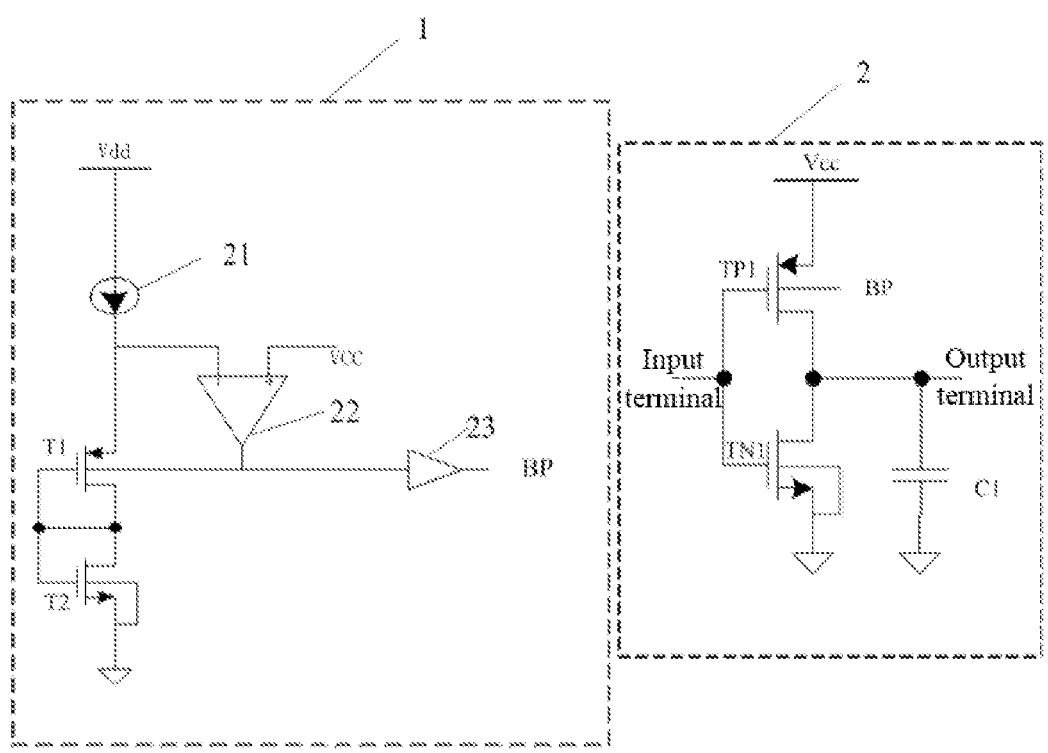
FIG. 29 is a diagram of a structure of a delay circuit according to embodiments of the present disclosure.

FIG. 29 is a diagram of a structure of a delay circuit according to embodiments of the present disclosure. As shown in FIG. 29, the delay circuit of the present embodiment includes a potential generating circuit 1 and a delay unit 2. The potential generating circuit 1 is the circuit shown in FIG. 27. For elaboration of the structure, refer to the description in the embodiment shown in FIG. 27, details of which are not repeated here. The potential generating circuit 1 outputs a substrate potential BP. The delay unit 2 includes an inverter and a capacitor C1. The inverter includes a P-type transistor TP1 and an N-type transistor TN1. The substrate of the P-type transistor TP1 is connected to the substrate potential BP. The substrate of the N-type transistor TN1 is grounded. In the delay circuit of the present embodiment, the potential generating circuit 1 provides a substrate potential that varies with the first parameter to the substrate of the P-type transistor in the delay unit 2, so that the change in the rising edge delay provided by the delay circuit may be adjusted so that the rising edge delay provided by the delay circuit changes little, thereby reducing the impact of the manufacturing process, the supply voltage, and the operating temperature of the delay circuit on the rising edge delay T provided by the delay circuit, rendering the change in the rising edge delay T to be small, thereby improving control over a rising edge delay precision by the delay circuit.

Figure 30:
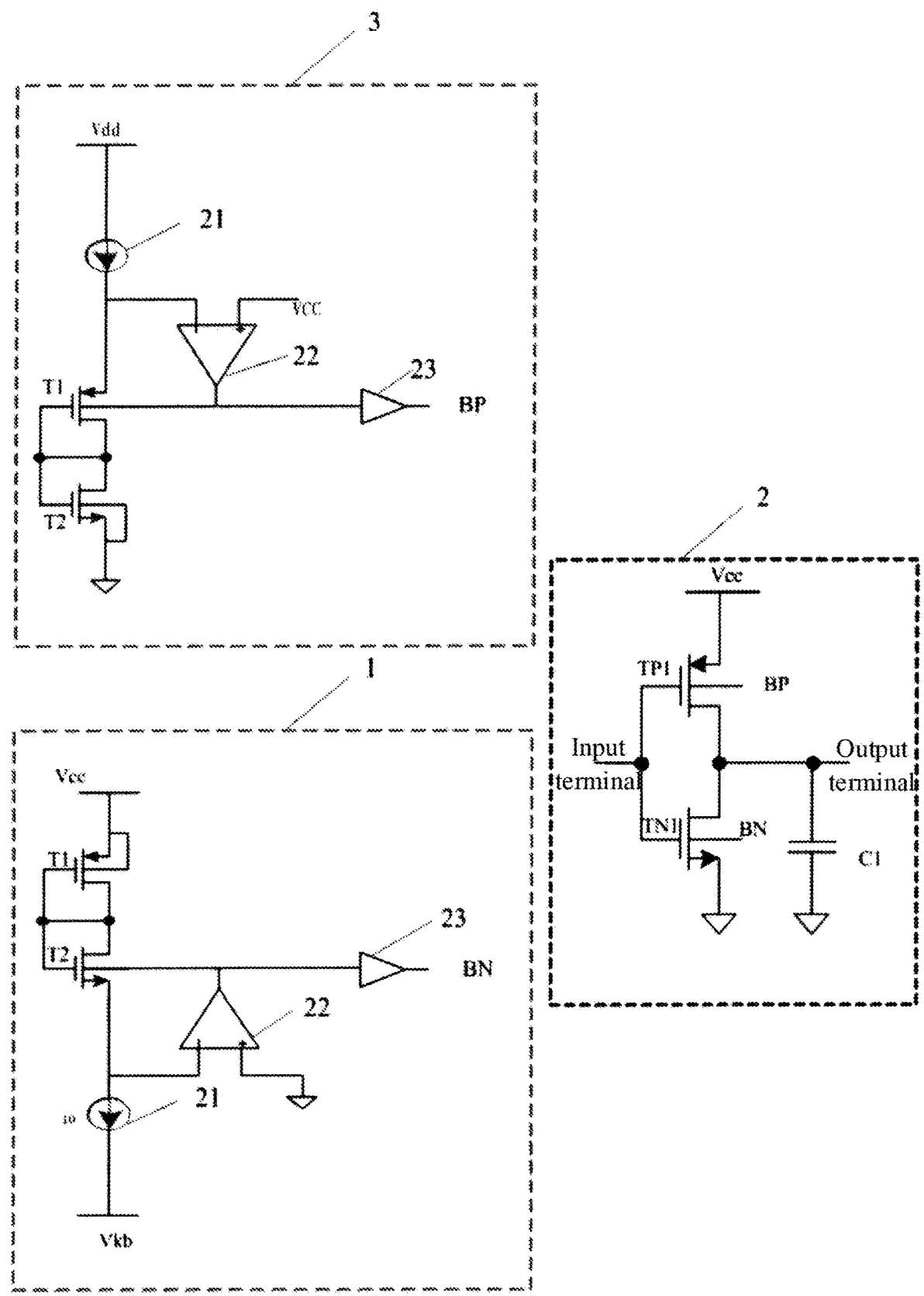
FIG. 30 is a diagram of a structure of a delay circuit according to embodiments of the present disclosure.

FIG. 30 is a diagram of a structure of a delay circuit according to embodiments of the present disclosure. As shown in FIG. 30, the delay circuit of the present embodiment includes a first potential generating circuit 1, a second potential generating circuit 3, and a delay unit 2. The first potential generating circuit 1 is the circuit shown in FIG. 27. For elaboration of the structure, refer to the description in the embodiment shown in FIG. 27, details of which are not repeated here. The first potential generating circuit 1 outputs a substrate potential BN. The second potential generating circuit 3 is the circuit shown in FIG. 28. For elaboration of the structure, refer to the description in the embodiment shown in FIG. 28, details of which are not repeated here. The second potential generating circuit 3 outputs a substrate potential BP. The delay unit 2 includes an inverter and a capacitor C1. The inverter includes a P-type transistor TP1 and an N-type transistor TN1. The substrate of the P-type transistor TP1 is connected to the substrate potential BP output by the second potential generating circuit 3, and the substrate of the N-type transistor TN1 is connected to the substrate potential BN output by the first potential generating circuit 1. In the delay circuit of the present embodiment, the potential generating circuit 1 provides a substrate potential that varies with the first parameter to the substrate of the N-type transistor in the delay unit 2. The change in the rising edge delay provided by the delay circuit may be adjusted so that the change in the rising edge delay provided by the delay circuit is small. The potential generating circuit 3 provides a substrate potential that varies with the first parameter to the substrate of the P-type transistor in the delay unit 2. The change in the falling edge delay provided by the delay circuit may be adjusted, rendering the change in the falling edge delay provided by the delay circuit to be small, thereby reducing the impact of the manufacturing process, the supply voltage and the operating temperature of the delay circuit on the delay T (including the rising edge delay and the falling edge delay) provided by the delay circuit, so that the change in the delay T is small, improving control over a delay precision by the delay circuit.

Figure 31:
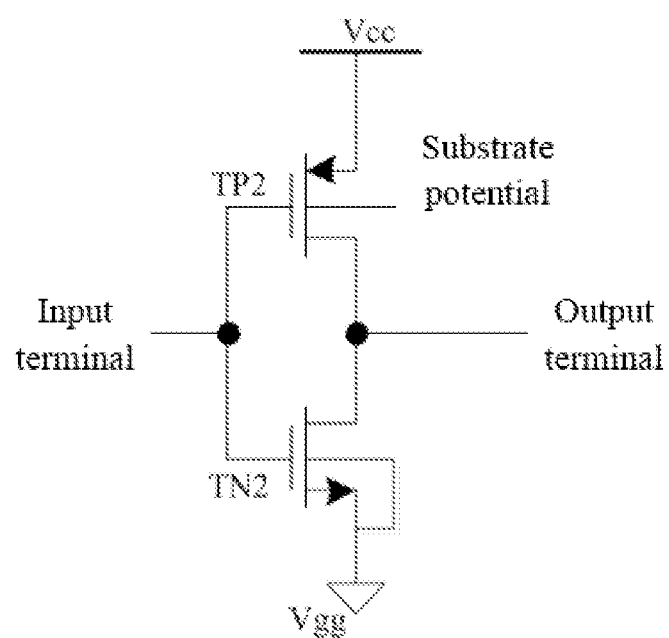
FIG. 31 is a diagram of a structure of an inverter according to embodiments of the present disclosure.

Embodiments of the present disclosure further provide an inverter. FIG. 31 is a diagram of a structure of an inverter according to embodiments of the present disclosure. As shown in FIG. 31, the inverter includes a P-type transistor TP2 and an N-type transistor TN2.

The source of the P-type transistor TP2 is connected to the power supply terminal. The drain of the P-type transistor TP2 is connected to the drain of the N-type transistor TN2. The source of the N-type transistor TN2 is grounded. The gate of the P-type transistor TP2 is connected to the gate of the N-type transistor TN2, and serves as an input of the inverter. The drain of the P-type transistor TP2 serves as the output of the inverter.

The substrate of the P-type transistor TP2 is connected to a substrate potential, the substrate of the N-type transistor TN2 is grounded. The substrate potential varies with a first parameter. The first parameter may be any one of a supply voltage, an operating temperature, as well as a manufacturing process of the inverter.

If the first parameter is the supply voltage or the operating temperature of the inverter, the substrate potential increases as the first parameter increases, and decreases as the first parameter decreases.

With the inverter provided in the present embodiment, the substrate potential may vary with any one of the supply voltage, the operating temperature, as well as the manufacturing process, providing the substrate of the P-type transistor TP2 with the substrate potential varying with the first parameter. Therefore, the current flowing through the P-type transistor TP2 of the inverter may be adjusted, and the change in the current flowing through the P-type transistor TP2 may be compensated, so that the change in the rising edge delay T provided by the inverter is small, improving control over a rising edge delay precision by the inverter.

Figure 32:
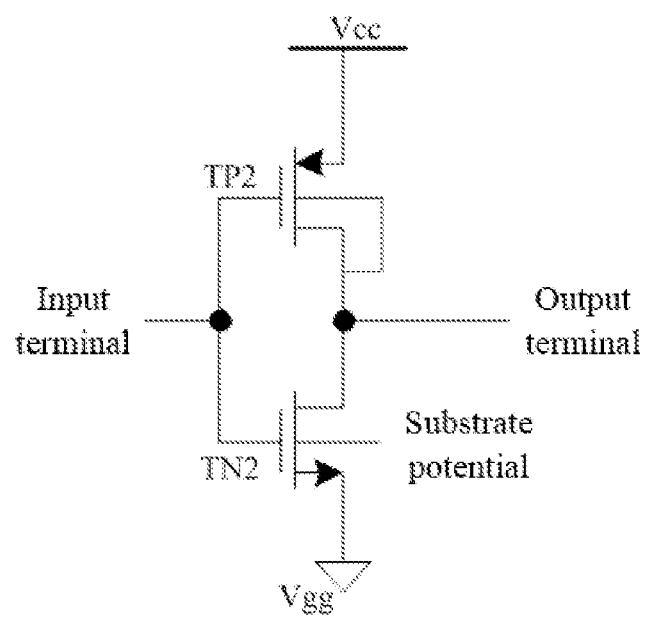
FIG. 32 is a diagram of a structure of an inverter according to embodiments of the present disclosure.

FIG. 32 is a diagram of a structure of an inverter according to embodiments of the present disclosure. As shown in FIG. 32, the inverter includes a P-type transistor TP2 and an N-type transistor TN2. The source of the P-type transistor TP2 is connected to a power supply terminal. The drain of the P-type transistor TP2 is connected to the drain of the N-type transistor TN2. The source of the N-type transistor TN2 is grounded. The gate of the P-type transistor TP2 is connected to the gate of the N-type transistor TN2, and serves as an input of the inverter. The drain of the P-type transistor TP2 serves as the output of the inverter.

The substrate of the N-type transistor TN2 is connected to a substrate potential, the substrate of the P-type transistor TP2 is connected to a power supply terminal, and the substrate potential varies with a first parameter. The first parameter may be any one of a supply voltage, an operating temperature, as well as a manufacturing process of the inverter.

If the first parameter is the supply voltage or the operating temperature of the inverter, the substrate decreases as the first parameter increases, and increases as the first parameter decreases.

With the inverter provided in the present embodiment, the substrate potential may vary with any one of the supply voltage, the operating temperature, as well as the manufacturing process, providing the substrate of the N-type transistor TN2 with the substrate potential varying with the first parameter. Therefore, the current flowing through the N-type transistor TN2 of the inverter may be adjusted, and the change in the current flowing through the N-type transistor TN2 may be compensated, so that the change in the falling edge delay T provided by the inverter is small, improving control over a falling edge delay precision by the inverter.

Figure 33:
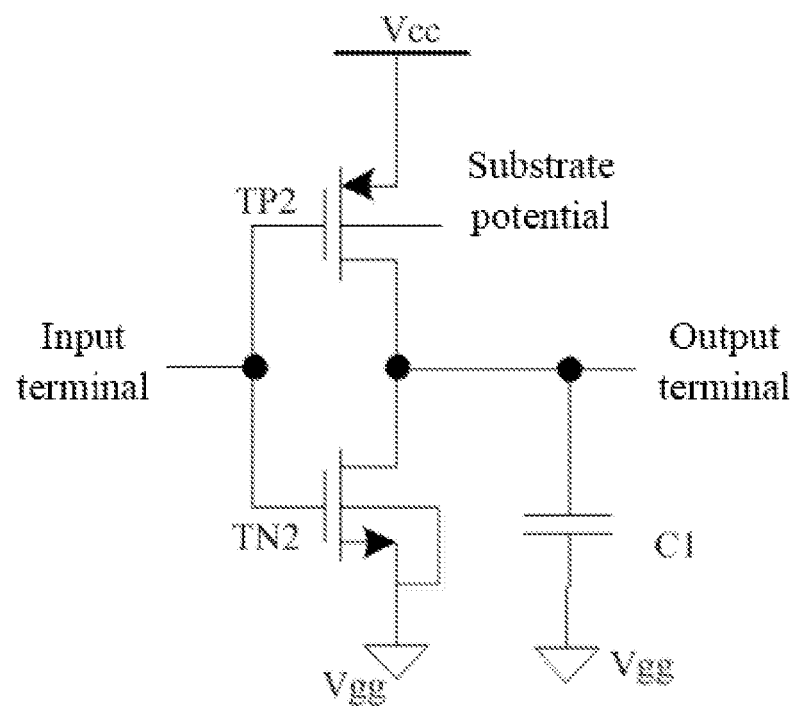
FIG. 33 is a diagram of a structure of a delay circuit according to embodiments of the present disclosure.

Embodiments of the present disclosure further provide a delay circuit. FIG. 33 is a diagram of a structure of a delay circuit according to embodiments of the present disclosure. As shown in FIG. 33, the delay circuit according to the embodiment may include a capacitor C1 and an inverter shown in FIG. 31. One terminal of the capacitor C1 is grounded. In one possible implementation, the capacitor C1 may be an array of capacitors.

With the delay circuit provided in the present embodiment, the change in the current flowing through the P-type transistor TP2 of the inverter may be compensated, so that the change in the rising edge delay T provided by the inverter is small, rendering the change in the rising edge delay T provided by the delay circuit small, improving control over a rising edge delay precision by the delay circuit.

Figure 34:
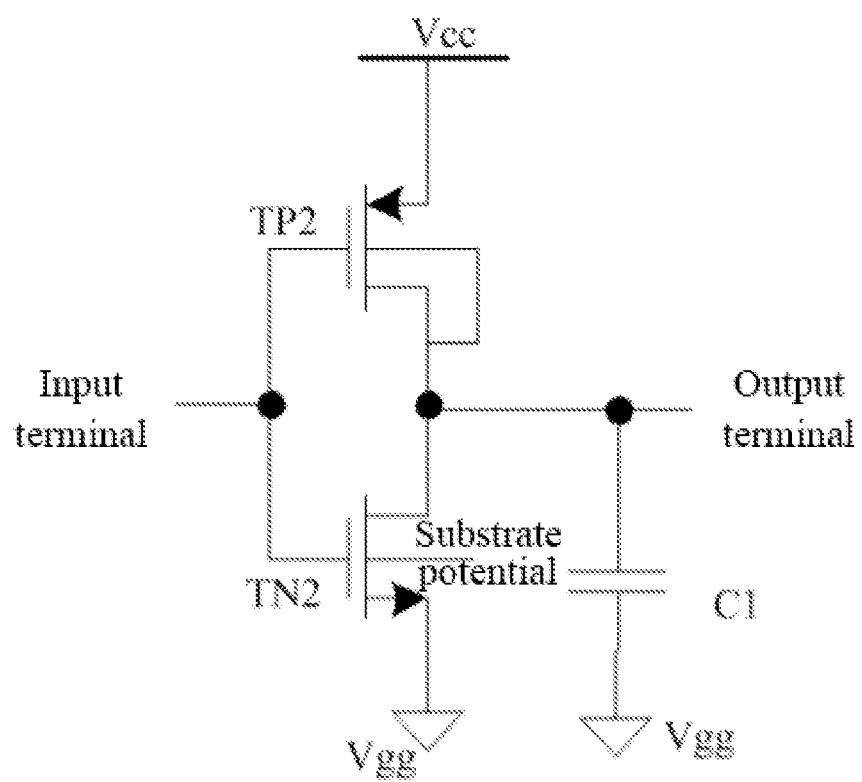
FIG. 34 is a diagram of a structure of a delay circuit according to embodiments of the present disclosure.

Embodiments of the present disclosure further provide a delay circuit. FIG. 34 is a diagram of a structure of a delay circuit according to embodiments of the present disclosure. As shown in FIG. 34, the delay circuit according to the embodiment may include a capacitor C1 and an inverter as shown in FIG. 32. One terminal of the capacitor C1 is grounded. In one possible implementation, the capacitor C1 may be an array of capacitors.

With the delay circuit provided in the present embodiment, the change in the current flowing through the N-type transistor TN2 of the inverter may be compensated, so that the change in the falling edge delay T provided by the inverter is small, rendering the change in the falling edge delay T provided by the delay circuit small, improving control over a falling edge delay precision by the delay circuit.

Embodiments of the present disclosure further provide a logic gate circuit, including a P-type transistor and an N-type transistor. The substrate of the P-type transistor is connected to a substrate potential. The substrate of the N-type transistor is grounded. The substrate potential varies with a first parameter, such that a change in a delay between an input and an output of the logic gate circuit varying with the first parameter is within a first range. The first parameter may include any one of a supply voltage, an operating temperature, as well as a manufacturing process of the logic gate circuit.

In particular, the first range is a small range, such as a range close to 0. For example, the first range is 1% or 3% or 5%, so that the rising edge delay provided by the logic gate circuit from the input terminal to the output terminal has a small change when any one of the supply voltage, the operating temperature, as well as the manufacturing process changes, improving control over a rising edge delay precision by the logic gate circuit.

Embodiments of the present disclosure further provide a logic gate circuit, including a P-type transistor and an N-type transistor. The substrate of the N-type transistor is connected to a substrate potential. The substrate of the P-type transistor is connected to a power supply terminal. The substrate potential varies with a first parameter, such that a change in a delay between an input and an output of the logic gate circuit varying with the first parameter is within a first range. The first parameter may include any one of a supply voltage, an operating temperature, as well as a manufacturing process of the logic gate circuit.

In particular, the first range is a small range, such as a range close to 0. For example, the first range is 1% or 3% or 5%, so that the falling edge delay provided by the logic gate circuit from the input terminal to the output terminal has a small change when any one of the supply voltage, the operating temperature, as well as the manufacturing process changes, improving control over a falling edge delay precision by the logic gate circuit.

Embodiment 3

Figure 35:
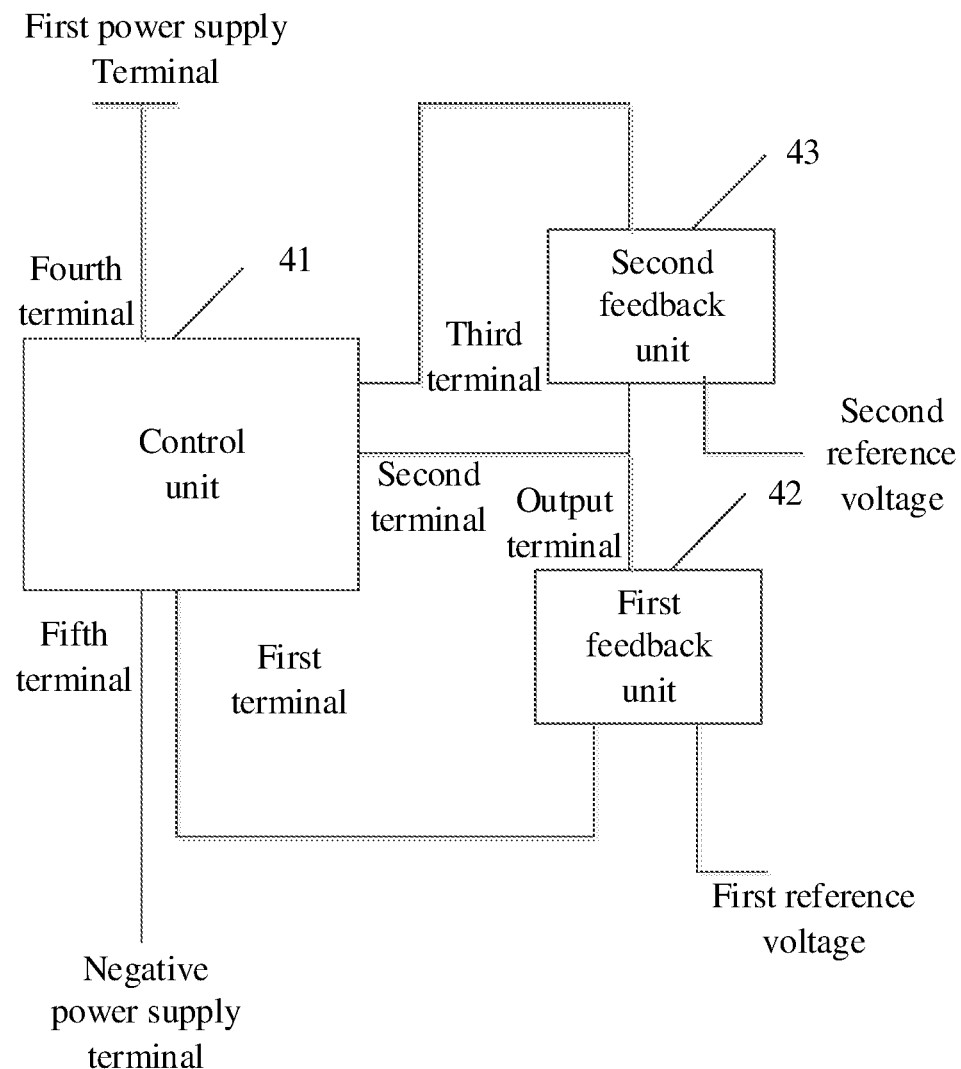
FIG. 35 is a diagram of a structure of a control circuit according to embodiments of the present disclosure.

FIG. 35 is a diagram of a structure of a control circuit according to embodiments of the present disclosure. As shown in FIG. 35, the control circuit according to the embodiment may include a control unit 41, a first feedback unit 42, and a second feedback unit 43. The first feedback unit 42 is configured to output a first feedback signal according to a voltage of the control unit 41 and a first reference voltage. The first terminal of the first feedback unit 42 is connected to the first terminal of the control unit. The second terminal of the first feedback unit 42 is an input terminal of the first reference voltage. The output terminal of the first feedback unit 42 is connected to the second terminal of the control unit 41 and the first terminal of the second feedback unit 43.

The second feedback unit 43 is configured to output a second feedback signal according to the voltage output by the first feedback unit 42 and the second reference voltage. The second terminal of the second feedback unit 43 is an input of the second reference voltage. The output of the second feedback unit 43 is connected to the third terminal of the control unit 41.

The control unit 41 is configured to adjust the voltage at the second terminal of the control unit 41 according to the first feedback signal, and adjust the voltage at the third terminal of the control unit 41 according to the second feedback signal, such that the change in the current of the control unit 41 varying with the first parameter is within a first range. The first parameter includes at least one of the manufacturing process, the supply voltage, and the operating temperature of the control circuit. The fourth terminal of the control unit 41 is connected to the first power supply terminal. The fifth terminal of the control unit 41 is connected to the negative power supply terminal. In particular, the first range is a small range, such as a range close to 0. For example, the first range is 1% or 3% or 5%, so that the change in the current of the control unit 41 varying with the first parameter may be made small.

Figure 36:
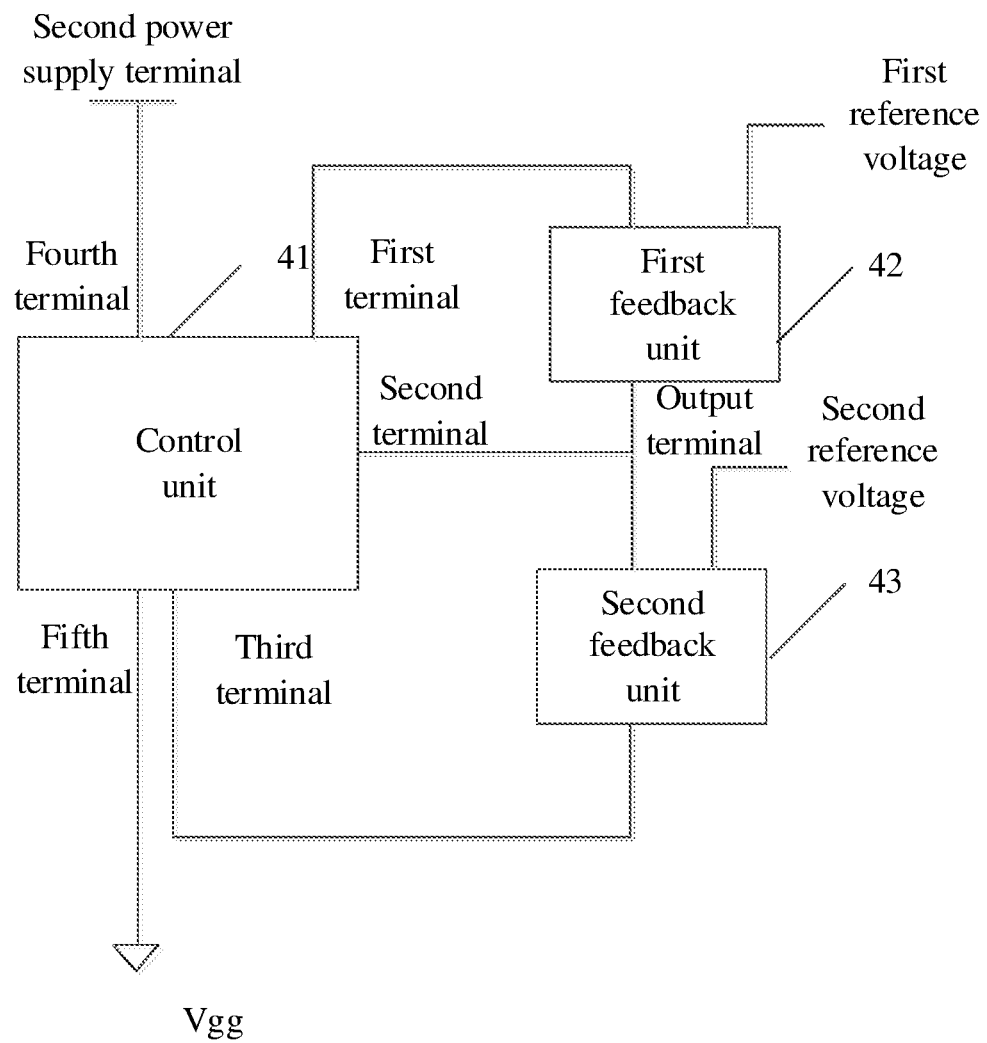
FIG. 36 is a diagram of a structure of a control circuit according to embodiments of the present disclosure.

FIG. 36 is a diagram of a structure of a control circuit according to embodiments of the present disclosure. As shown in FIG. 36, the present embodiment differs from the embodiment shown in FIG. 35 in that the fourth terminal of the control unit 41 is connected to the second power supply terminal, and the fifth terminal of the control unit 41 is grounded, i.e., by being connected to a ground terminal Vgg.

The control circuit shown in FIG. 35 and FIG. 36 is provided with a control unit, a first feedback unit, and a second feedback unit. The first terminal of the first feedback unit is connected to the first terminal of the control unit. The second terminal of the first feedback unit is an input terminal of a first reference voltage. The output terminal of the first feedback unit is connected to the second terminal of the control unit and the first terminal of the second feedback unit. The second terminal of the second feedback unit is an input terminal of the second reference voltage. The output terminal of the second feedback unit is connected to the third terminal of the control unit. The first feedback unit is configured to output the first feedback signal according to the voltage of the control unit and the first reference voltage. The second feedback unit is configured to output the second feedback signal according to the voltage output by the first feedback unit and the second reference voltage. The control unit is configured to adjust the voltage at the second terminal of the control unit according to the first feedback signal, and adjust the voltage at the third terminal of the control unit according to the second feedback signal, such that the change in the current of the control unit varying with the first parameter is within the first range. The first parameter may be any one of the supply voltage, the operating temperature, as well as the manufacturing process. Thus, the second terminal of the control unit and the third terminal of the control unit may respectively output a voltage varying with any one of the supply voltage, the operating temperature, as well as the manufacturing process.

Figure 37:
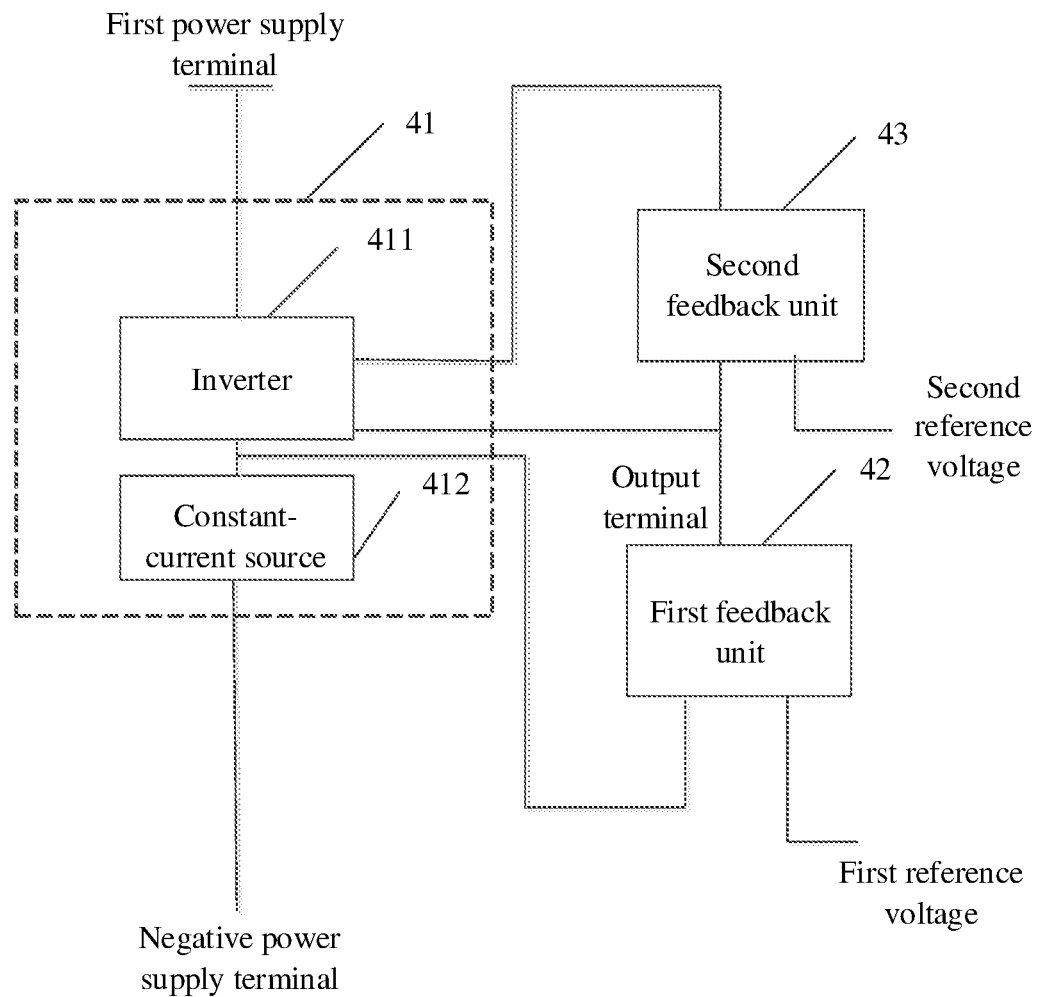
FIG. 37 is a diagram of a structure of a control circuit according to embodiments of the present disclosure.

FIG. 37 is a diagram of a structure of a control circuit according to embodiments of the present disclosure. As shown in FIG. 37, the control circuit according to the embodiment is based on the circuit shown in FIG. 35. Further, the control unit 41 may include an inverter 411 and a constant current source 412. The first terminal of the inverter 411 is connected to the first power supply terminal.

The first terminal of the constant current source 412 is connected to the second terminal of the inverter 411. The second terminal of the constant current source 412 is connected to the negative power supply terminal.

The input of the inverter 411 is short-circuited with the output of the inverter 411.

Figure 38:
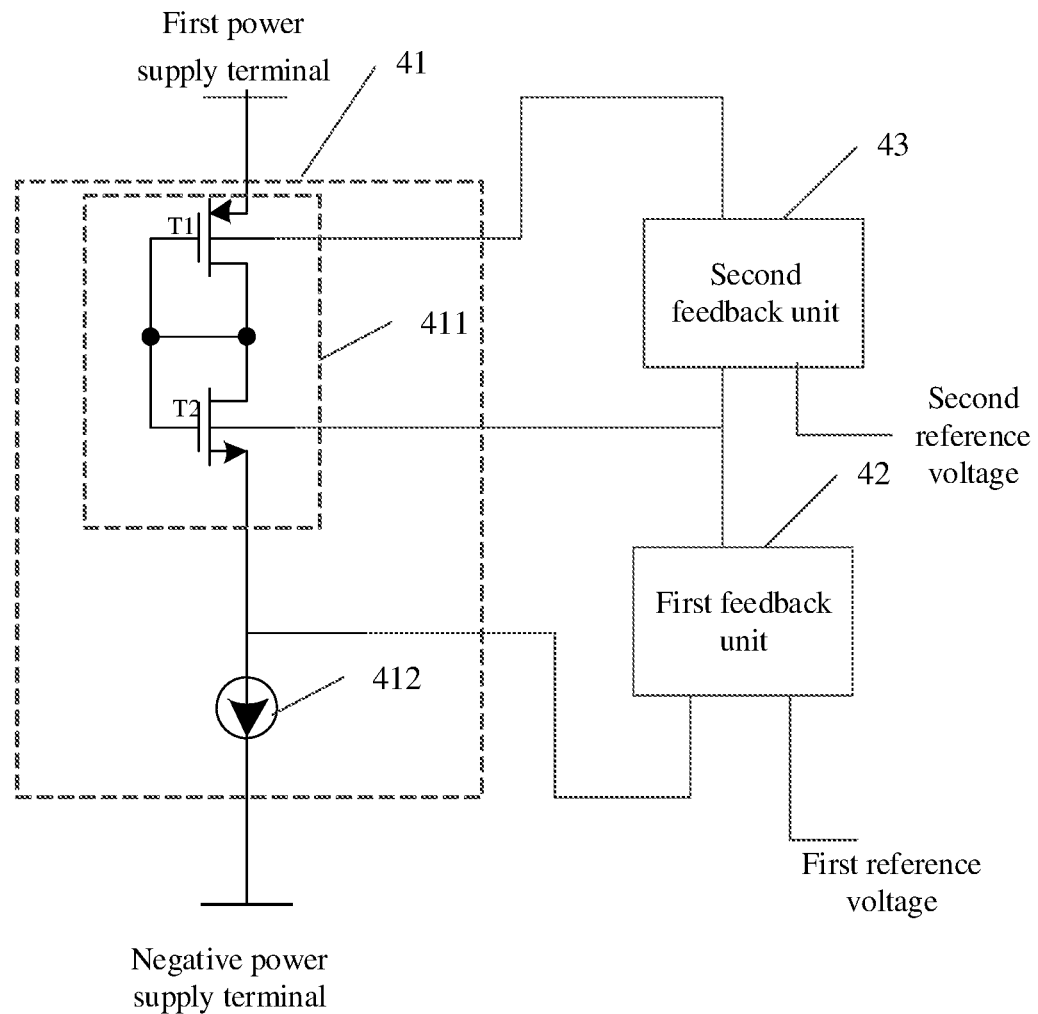
FIG. 38 is a diagram of a structure of a control circuit according to embodiments of the present disclosure.

FIG. 38 is a diagram of a structure of a control circuit according to embodiments of the present disclosure. As shown in FIG. 38, the control circuit according to the embodiment is based on the circuit shown in FIG. 37. Further, the inverter 411 includes a first transistor T1 and a second transistor T2. The substrate of the first transistor T1 is connected to the output of the second feedback unit 43, and the substrate of the second transistor T2 is connected to the output of the first feedback unit 42.

The first terminal of the first transistor T1 is connected to the first power supply terminal. The second terminal of the first transistor T1 is connected to the first terminal of the second transistor T2. The control terminal of the first transistor T1 is connected to the control terminal of the second transistor T2. The second terminal of the second transistor T2 is connected to the first terminal of the constant current source 412.

In the embodiment, the control unit 41 is configured to adjust the voltage at the substrate of the second transistor T2 according to the first feedback signal, and adjust the voltage at the substrate of the first transistor T1 according to the second feedback signal.

With the control circuit provided by the present embodiment, the control unit is configured to adjust the voltage at the substrate of the second transistor according to the first feedback signal, and adjust the voltage at the substrate of the first transistor according to the second feedback signal, such that the change in the current of the control unit varying with the first parameter is within a first range. The first parameter may be any one of a supply voltage, an operating temperature, as well as a manufacturing process. Thus, the substrate of the first transistor and the substrate of the second transistor may respectively output a voltage varying with any one of the supply voltage, the operating temperature, as well as the manufacturing process.

Figure 39:
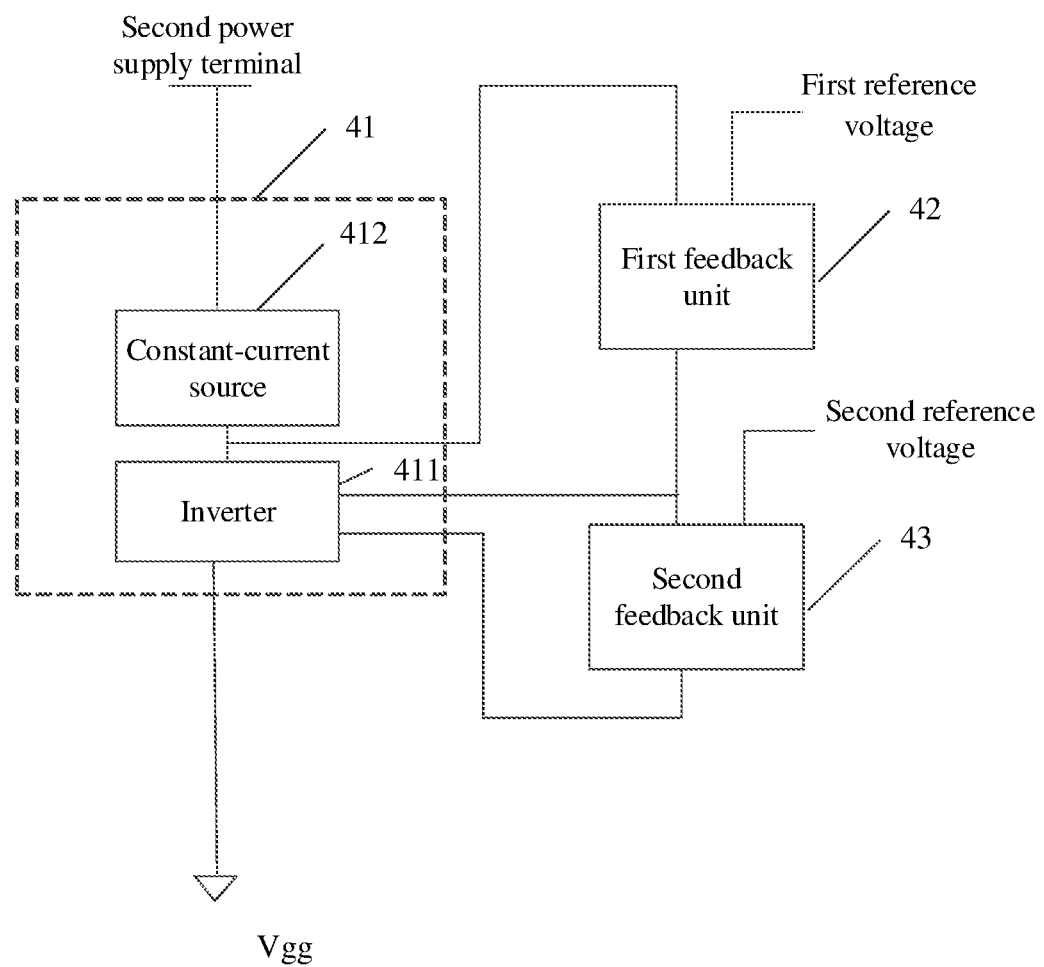
FIG. 39 is a diagram of a structure of a control circuit according to embodiments of the present disclosure.

FIG. 39 is a diagram of a structure of a control circuit according to embodiments of the present disclosure. As shown in FIG. 39, the control circuit according to the embodiment is based on the circuit shown in FIG. 36. Further, the control unit 41 may include an inverter 411 and a constant current source 412. The first terminal of the inverter 411 is grounded.

The first terminal of the constant current source 412 is connected to the second terminal of the inverter 411. The second terminal of the constant current source 412 is connected to the second power supply terminal.

The input of the inverter 411 is short-circuited with the output of the inverter 411.

Figure 40:
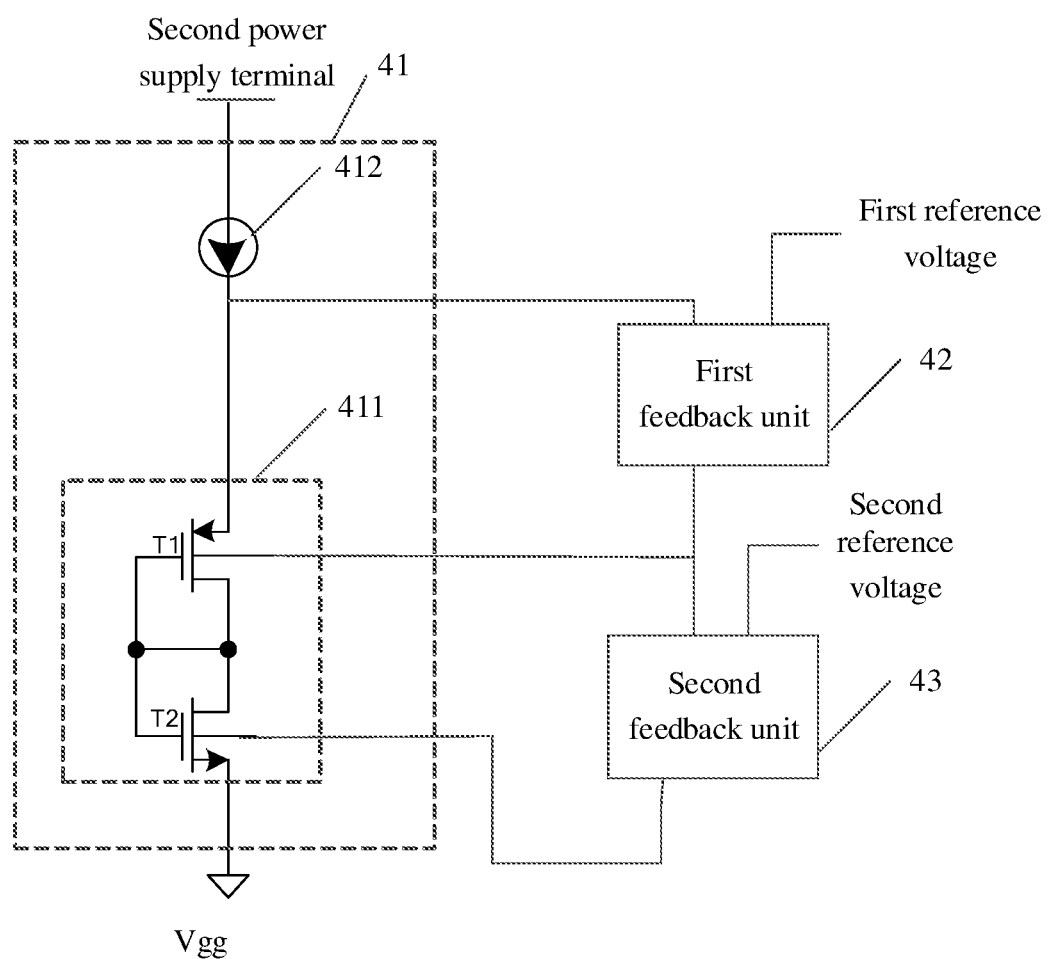
FIG. 40 is a diagram of a structure of a control circuit according to embodiments of the present disclosure.

FIG. 40 is a diagram of a structure of a control circuit according to embodiments of the present disclosure. As shown in FIG. 40, the control circuit according to the embodiment is based on the circuit shown in FIG. 39. Further, the inverter 411 includes a first transistor T1 and a second transistor T2. The substrate of the first transistor T1 is connected to the output of the first feedback unit, and the substrate of the second transistor T2 is connected to the output of the second feedback unit 43.

The first terminal of the first transistor T1 is connected to the first terminal of the constant current source, the second terminal of the first transistor T1 is connected to the first terminal of the second transistor T2, the control terminal of the first transistor T1 is connected to the control terminal of the second transistor T2, and the second terminal of the second transistor T2 is grounded.

In the embodiment, the control unit 41 is configured to adjust the voltage at the substrate of the second transistor T2 according to the first feedback signal, and adjust the voltage at the substrate of the first transistor T1 according to the second feedback signal.

With the control circuit provided by the present embodiment, the control unit is configured to adjust the voltage at the substrate of the second transistor according to the first feedback signal, and adjust the voltage at the substrate of the first transistor according to the second feedback signal, such that the change in the current of the control unit varying with the first parameter is within a first range. The first parameter may be any one of a supply voltage, an operating temperature, as well as a manufacturing process. Thus, the substrate of the first transistor and the substrate of the second transistor may respectively output a voltage varying with any one of the supply voltage, the operating temperature, as well as the manufacturing process.

In the control circuit shown in FIG. 38 and FIG. 40, the first transistor is a P-type transistor and the second transistor is an N-type transistor.

Specific implementable structures of the first feedback unit and the second feedback unit will now be elaborated with reference to the accompanying drawings.

Figure 41:
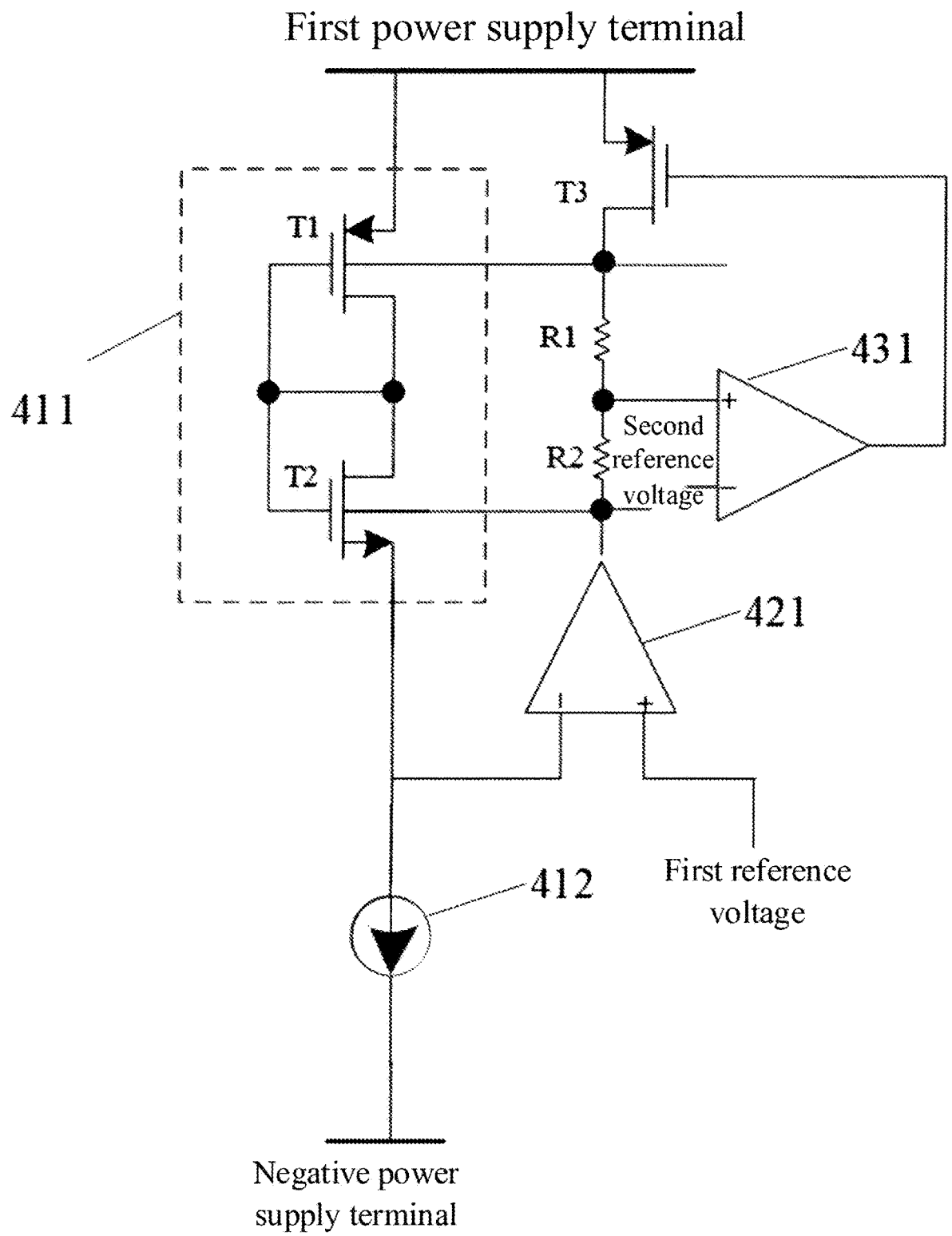
FIG. 41 is a diagram of a structure of a control circuit according to embodiments of the present disclosure.

FIG. 41 is a diagram of a structure of a control circuit according to embodiments of the present disclosure. As shown in FIG. 41, the control circuit according to the embodiment is based on the circuit shown in FIG. 38. Further, the first feedback unit 42 includes a first error amplifier 421. The negative input of the first error amplifier 421 is connected to the first terminal of the control unit 41. The positive input of the first error amplifier 421 is an input of a first reference voltage. The output of the first error amplifier 421 is connected to the second terminal of the control unit 41 and the first terminal of the second feedback unit 43.

As shown in FIG. 41, further, the second feedback unit 43 includes a second error amplifier 431, a first resistor R1, a second resistor R2, and a third transistor T3. The negative input of the second error amplifier 431 is an input of a second reference voltage. The positive input of the second error amplifier 431 is connected to the first terminal of the first resistor R1 and the first terminal of the second resistor R2, and the output of the second error amplifier 431 is connected to the control terminal of the third transistor T3.

The second terminal of the first resistor R1 is connected to the first terminal of the third transistor T3 and the third terminal of the control unit 41.

The second terminal of the second resistor R2 is connected to the output of the first feedback unit and the second terminal of the control unit 41.

The second terminal of the third transistor is connected to the first power supply terminal.

Figure 42:
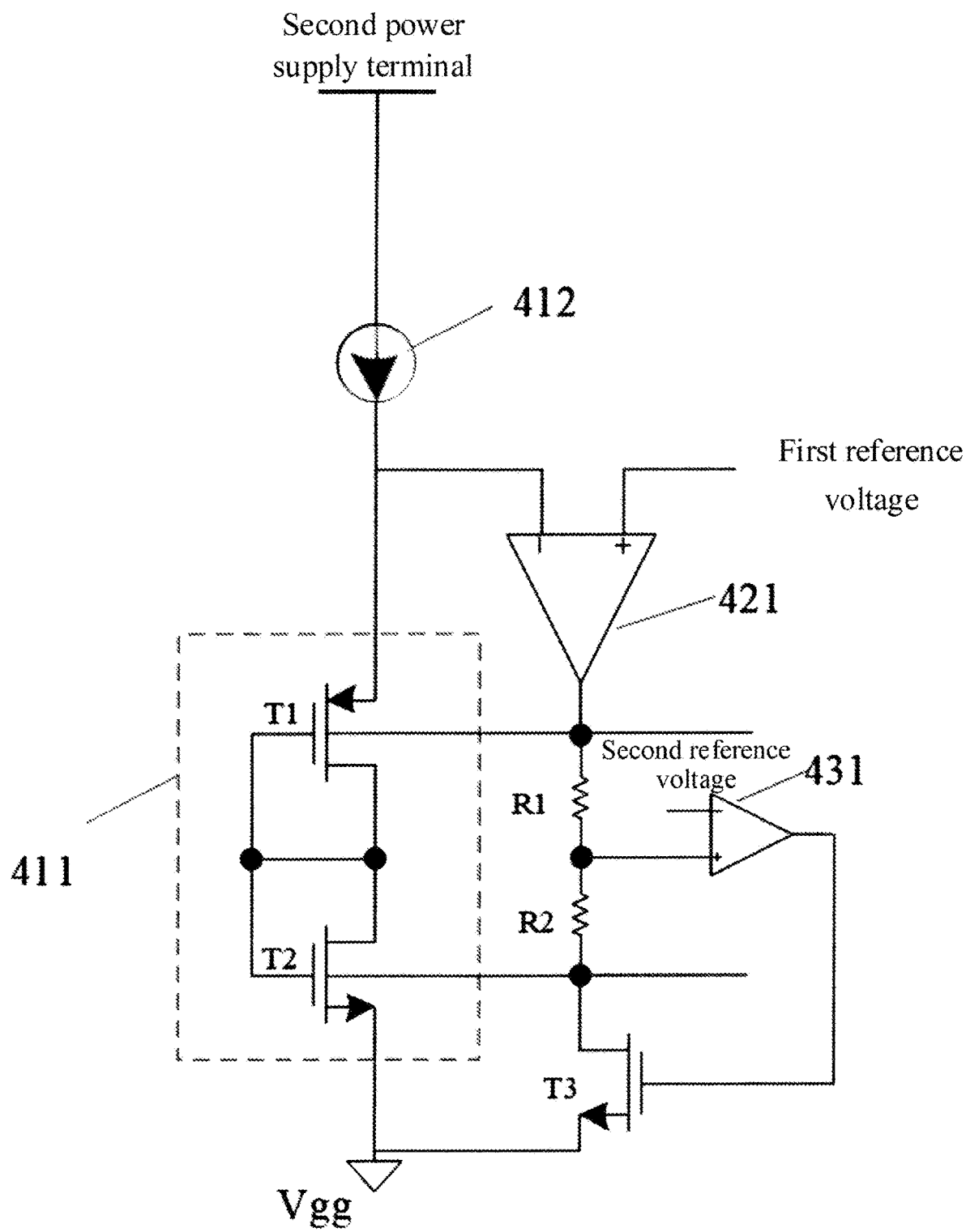
FIG. 42 is a diagram of a structure of a control circuit according to embodiments of the present disclosure.

FIG. 42 is a diagram of a structure of a control circuit according to embodiments of the present disclosure. As shown in FIG. 42, the control circuit according to the embodiment is based on the circuit shown in FIG. 40. Further, the first feedback unit 42 includes a first error amplifier 421. The negative input of the first error amplifier 421 is connected to the first terminal of the control unit 41. The positive input of the first error amplifier 421 is an input of a first reference voltage. The output of the first error amplifier 421 is connected to the second terminal of the control unit 41 and the first terminal of the second feedback unit 43.

As shown in FIG. 42, further, the second feedback unit 43 includes a second error amplifier 431, a first resistor R1, a second resistor R2, and a third transistor T3. The negative input of the second error amplifier 431 is an input of a second reference voltage. The positive input of the second error amplifier 431 is connected to the first terminal of the first resistor R1 and the first terminal of the second resistor R2. The output of the second error amplifier 431 is connected to the control terminal of the third transistor T3.

The second terminal of the first resistor R1 is connected to the output of the first feedback unit and the second terminal of the control unit 41.

The second terminal of the second resistor R2 is connected to the first terminal of the third transistor T3 and the third terminal of the control unit 41.

The second terminal of the third transistor is grounded.

Figure 43:
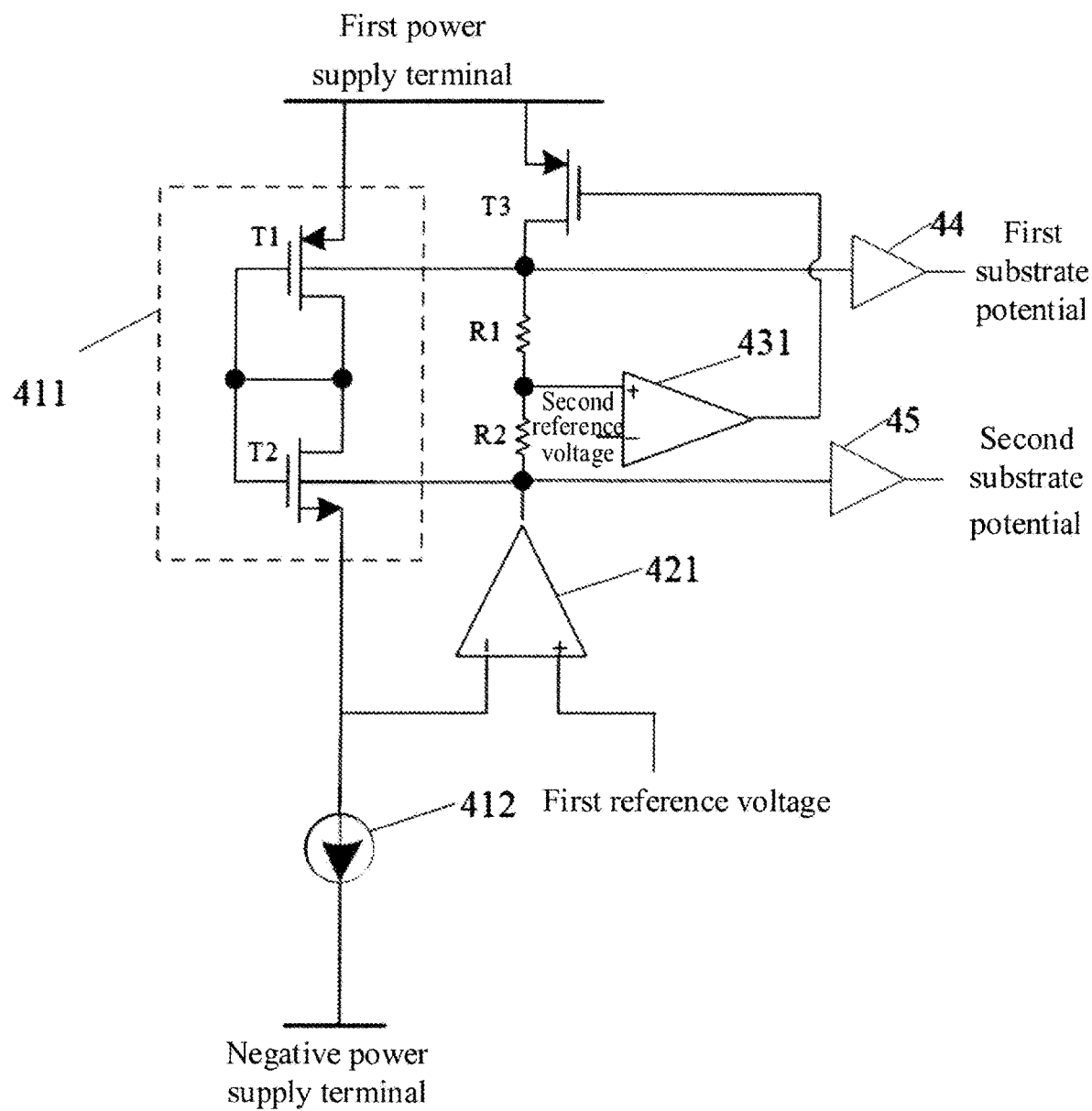
FIG. 43 is a diagram of a structure of a control circuit according to embodiments of the present disclosure.
Figure 44:
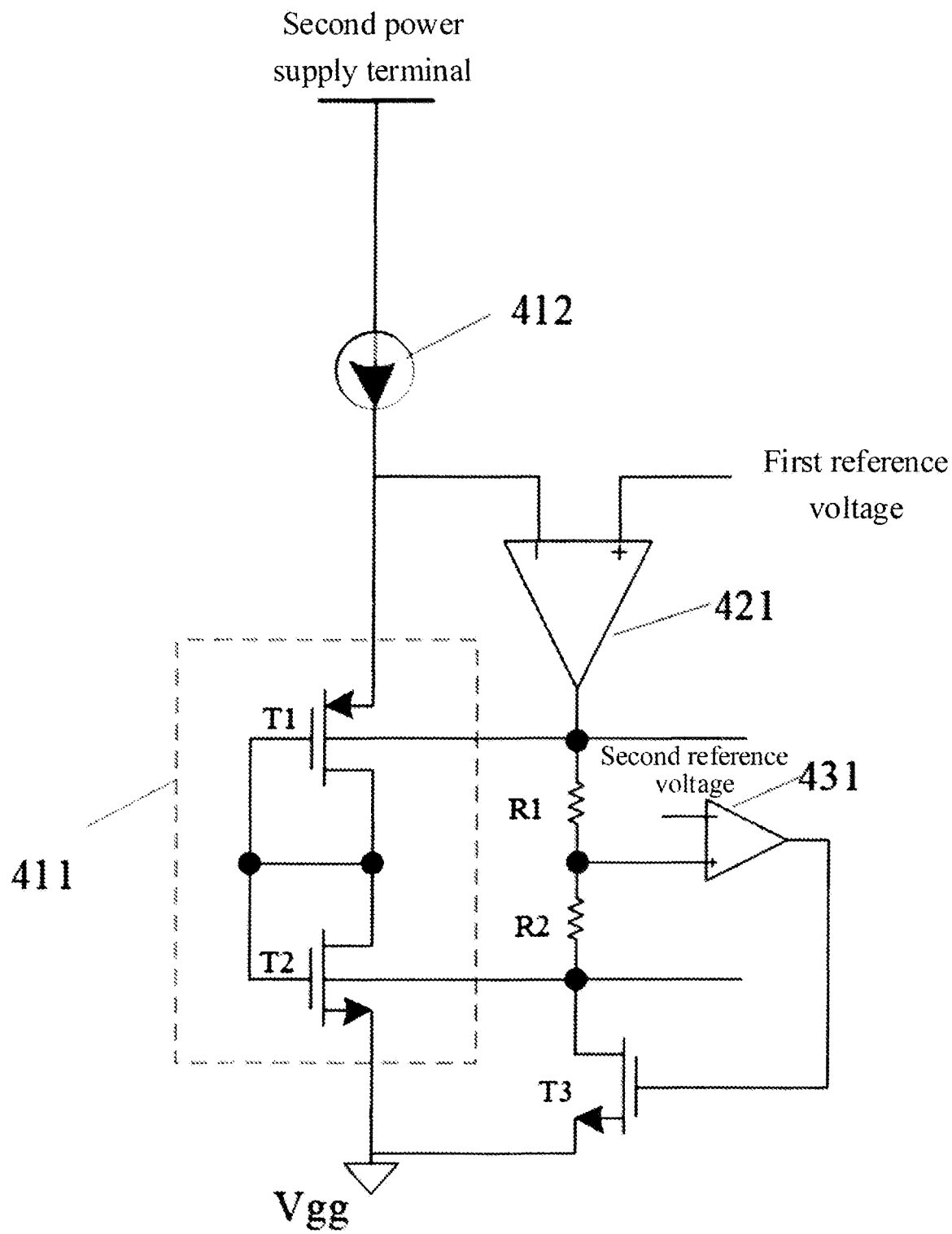
FIG. 44 is a diagram of a structure of a control circuit according to embodiments of the present disclosure.

The control circuit shown in FIG. 41 or FIG. 42 may further include a first buffer and a second buffer. FIG. 43 is a diagram of a structure of a control circuit according to embodiments of the present disclosure. FIG. 44 is a diagram of a structure of a control circuit according to embodiments of the present disclosure. As shown in FIG. 43 and FIG. 44, based on the control circuit shown in FIG. 41 or FIG. 42, the control circuit may further include a first buffer 44 and a second buffer 45. The first buffer 44 is connected to the substrate of the first transistor T1, and outputs a first substrate voltage. The first substrate voltage is equal to the voltage at the substrate of the first transistor T1. The input voltage and the output voltage of the first buffer 44 are the same. The first buffer 44 may be configured to enhance the driving capability of the potential at the substrate of the first transistor T1, and may also isolate the substrate of the first transistor T1, preventing interference to the potential at the substrate of the first transistor T1.

The second buffer 45 is connected to the substrate of the second transistor T2, and outputs a second substrate voltage. The second substrate voltage is equal to the voltage at the substrate of the first transistor T1. The second buffer 45 may be configured to enhance the driving capability of the potential at the substrate of the second transistor T2, and may also isolate the substrate of the second transistor T2, preventing interference to the potential at the substrate of the second transistor T2.

Note that in the control circuit shown in FIG. 35 to FIG. 44, the voltage at the first power supply terminal is Vcc, for example. The second reference voltage may be Vcc/2. The voltage at the negative power supply terminal may be a voltage less than 0. The first reference voltage may be 0.

The voltage at the second power supply terminal is greater than the first reference voltage. The second reference voltage may be half the first reference voltage. For example, the voltage at the second power supply terminal is Vdd. The first reference voltage is Vcc. The Vdd is greater than the Vcc. The second reference voltage may be Vcc/2.

The structure of the control circuit according to the present disclosure will be described with reference to specific embodiments. The specific structure of the control circuit according to the present disclosure is not limited to any structure as follows.

In particular, refer to circuit structures shown in FIG. 11 and FIG. 12 for a specific structure of the control circuit of the present embodiment. The potential generating circuits shown in FIG. 11 and FIG. 12 are control circuits in the present embodiment, with the same operation principle. Refer to the description of the embodiments shown in FIG. 11 and FIG. 12 for details, which are not repeated here.

Embodiments of the present disclosure further provide a delay circuit, including a control circuit as shown in any one of FIG. 35 to FIG. 44, and a delay unit. The second terminal of the control unit in the control circuit is connected to the first terminal of the delay unit. The third terminal of the control unit is connected to the second terminal of the delay unit. The control circuit is configured to control a change in the rising edge delay and/or the falling edge delay provided by the delay unit varying with the first parameter to be within a first range.

Optionally, the delay unit includes an inverter. The inverter includes a fourth transistor and a fifth transistor. The third terminal of the control unit may be connected to the substrate of the fourth transistor. The second terminal of the control unit may be connected to the substrate of the fifth transistor.

Optionally, the fourth transistor is a P-type transistor, and the fifth transistor is an N-type transistor.

In the present embodiment, optionally, when the control circuit in the delay circuit is a control circuit shown in any one of FIG. 38, FIG. 40, or FIG. 41 to FIG. 44, H is equal to L, and M is equal to N. The H is a ratio of a channel length of the first transistor to a channel length of the fourth transistor. The L is a ratio of a channel length of the second transistor to a channel length of the fifth transistor. The M is a ratio of a channel width of the first transistor to a channel width of the fourth transistor. The N is a ratio of a channel width of the second transistor to a channel width of the fifth transistor.

With the delay circuit provided in the present embodiment, the second terminal of the control unit and the third terminal of the control unit may respectively output a voltage varying with the first parameter (i.e., any one of a supply voltage, an operating temperature, as well as a manufacturing process), thereby providing the substrate of the fourth transistor with a first substrate voltage varying with the first parameter, and providing the substrate of the fifth transistor with a second substrate voltage varying with the first parameter. Therefore, the changes in the currents flowing through the two transistors in the inverter varying with the first parameter may be adjusted to be within the first range, and the changes in the currents flowing through the two transistors in the inverter may be compensated, so that the change in the delay T provided by the delay circuit is small, improving control over a delay precision by the delay circuit.

It should be noted that in embodiments of the present disclosure, the relation of connection between a control circuit and an inverter may be set according to the number of inverters included in the delay circuit and the requirement of delay compensation. The substrate of the P-type transistor in an inverter is connected to the substrate of the P-type transistor in the control circuit. The change in the rising edge delay provided by the delay circuit may be adjusted. The substrate of the N-type transistor in the inverter is connected to the substrate of the N-type transistor in the control circuit. The change in the falling edge delay provided by the delay circuit may be adjusted. In particular, the relation of connection between a control circuit and an inverter may be set according to the change in the rising edge delay and/or the falling edge delay to be adjusted. The control circuit provided in embodiments of the present disclosure may be applied to a delay circuit in which the rising edge and/or the falling edge is/are delayed, reducing impact of the manufacturing process, the supply voltage and the operating temperature of the delay circuit on the delay T provided by the delay circuit, reducing the change in the delay T (including the rising edge delay and/or the falling edge delay), improving control over a delay precision by the delay circuit.

FIG. 13 to FIG. 15 show examples of two delay circuits, and are also applicable to the present embodiment. The potential generating circuit shown in FIG. 13 to FIG. 15 is the specific control circuit in the present embodiment. Refer to the specific illustration in FIG. 13 to FIG. 15, details of which are not repeated here.

Embodiment 4

Figure 45:
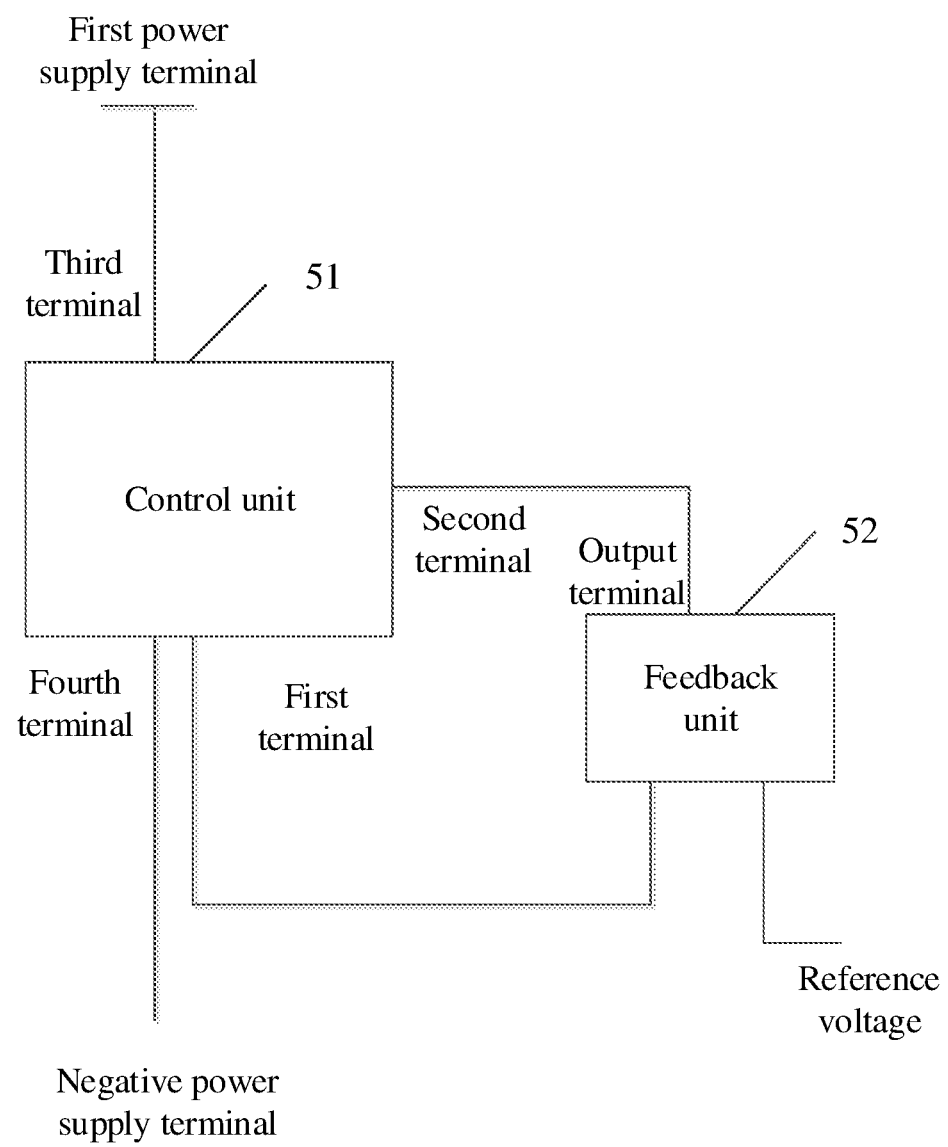
FIG. 45 is a diagram of a structure of a control circuit according to embodiments of the present disclosure.

FIG. 45 is a diagram of a structure of a control circuit according to embodiments of the present disclosure. As shown in FIG. 45, the control circuit according to the embodiment may include a control unit 51 and a feedback unit 52.

The feedback unit 52 is configured to output a feedback signal according to the voltage of the control unit 51 and the reference voltage. The first terminal of the feedback unit is connected to the first terminal of the control unit 51. The second terminal of the feedback unit is the input terminal of the reference voltage. The output of the feedback unit is connected to the second terminal of the control unit 51.

The control unit 51 is configured to adjust the voltage at the second terminal of the control unit 51 according to the feedback signal, so that the change in the current of the control unit 51 varying with the first parameter is within a first range. The first parameter includes at least one of the manufacturing process, the supply voltage and the operating temperature of the control circuit. The third terminal of the control unit 51 is connected to the first power supply terminal. The fourth terminal of the control unit 51 is connected to the negative power supply terminal.

In particular, the first range is a small range, such as a range close to 0. For example, the first range is 1% or 3% or 5%, so that the change in the current of the control unit 41 varying with the first parameter may be made small.

Figure 46:
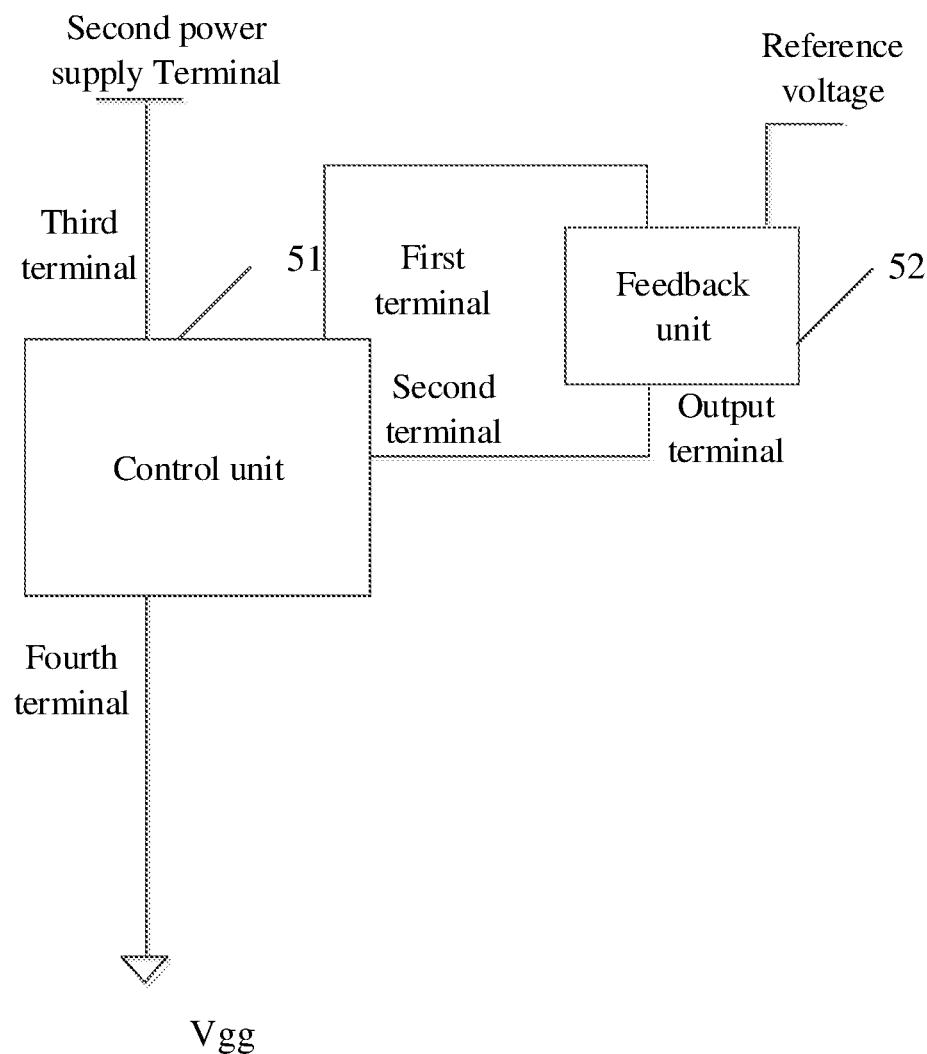
FIG. 46 is a diagram of a structure of a control circuit according to embodiments of the present disclosure.

FIG. 46 is a diagram of a structure of a control circuit according to embodiments of the present disclosure. As shown in FIG. 46, the present embodiment differs from the embodiment shown in FIG. 45 in that the third terminal of the control unit 51 is connected to the second power supply terminal, and the fourth terminal of the control unit 51 is grounded Vgg.

The control circuit shown in FIG. 45 and FIG. 46 is provided with a control unit and a feedback unit. The feedback unit is configured to output a feedback signal according to the voltage of the control unit and a reference voltage. The control unit is configured to adjust the voltage at the second terminal of the control unit according to the feedback signal, such that the change in the current of the control unit varying with the first parameter is within a first range. The first parameter may be any one of a supply voltage, an operating temperature, as well as a manufacturing process. Thus, the second terminal of the control unit may output a voltage varying with any one of the supply voltage, the operating temperature, as well as the manufacturing process.

Figure 47:
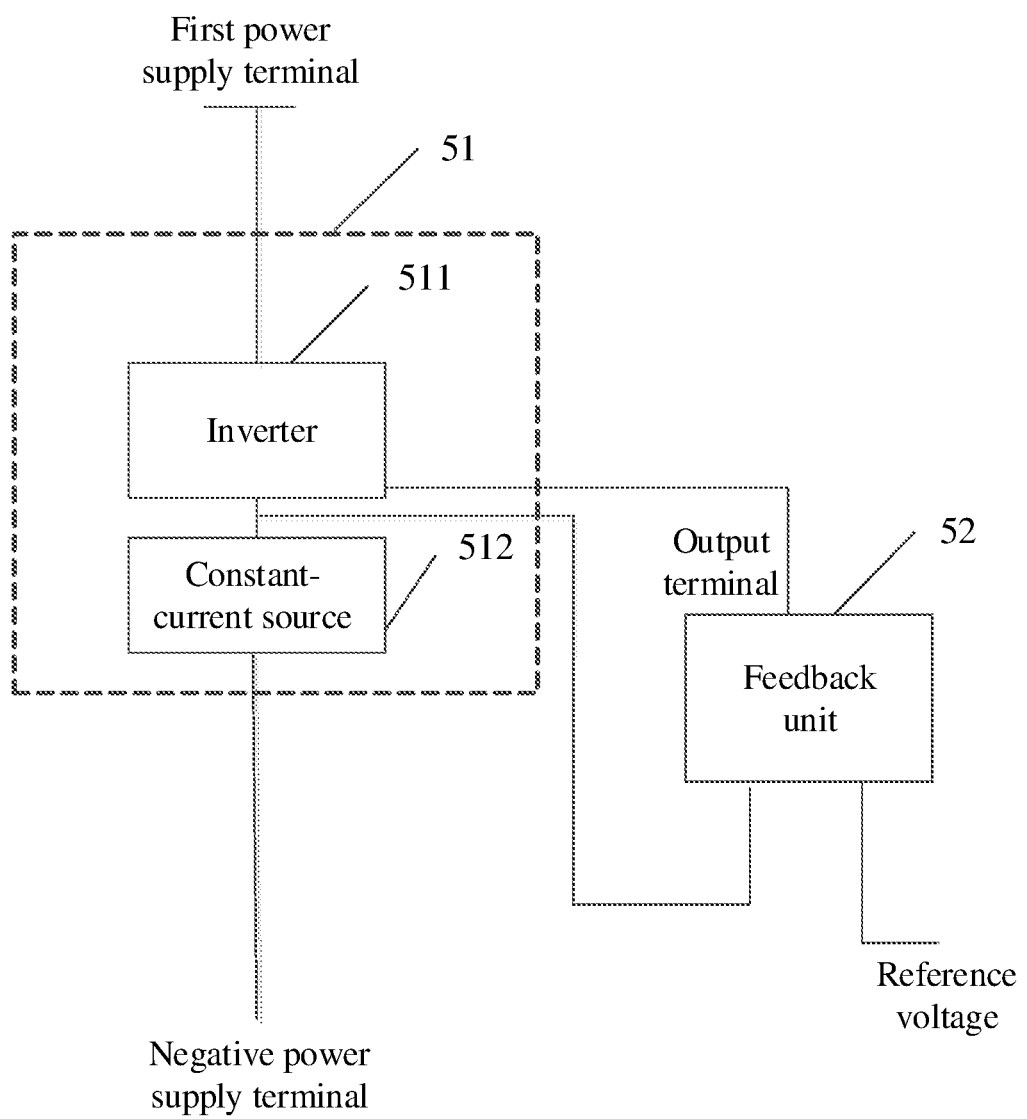
FIG. 47 is a diagram of a structure of a control circuit according to embodiments of the present disclosure.

FIG. 47 is a schematic diagram of a structure of a control circuit according to embodiments of the present disclosure. As shown in FIG. 47, the control circuit of the present embodiment is based on the circuit shown in FIG. 45. Further, the control unit 51 may include an inverter 511 and a constant current source 512. The first terminal of the inverter 511 is connected to a first power supply terminal. The first terminal of the constant current source 512 is connected to the second terminal of the inverter 511. The second terminal of the constant current source 512 is connected to the negative power supply terminal. The input terminal of the inverter 511 is short-circuited with the output terminal of the inverter 511.

Figure 48:
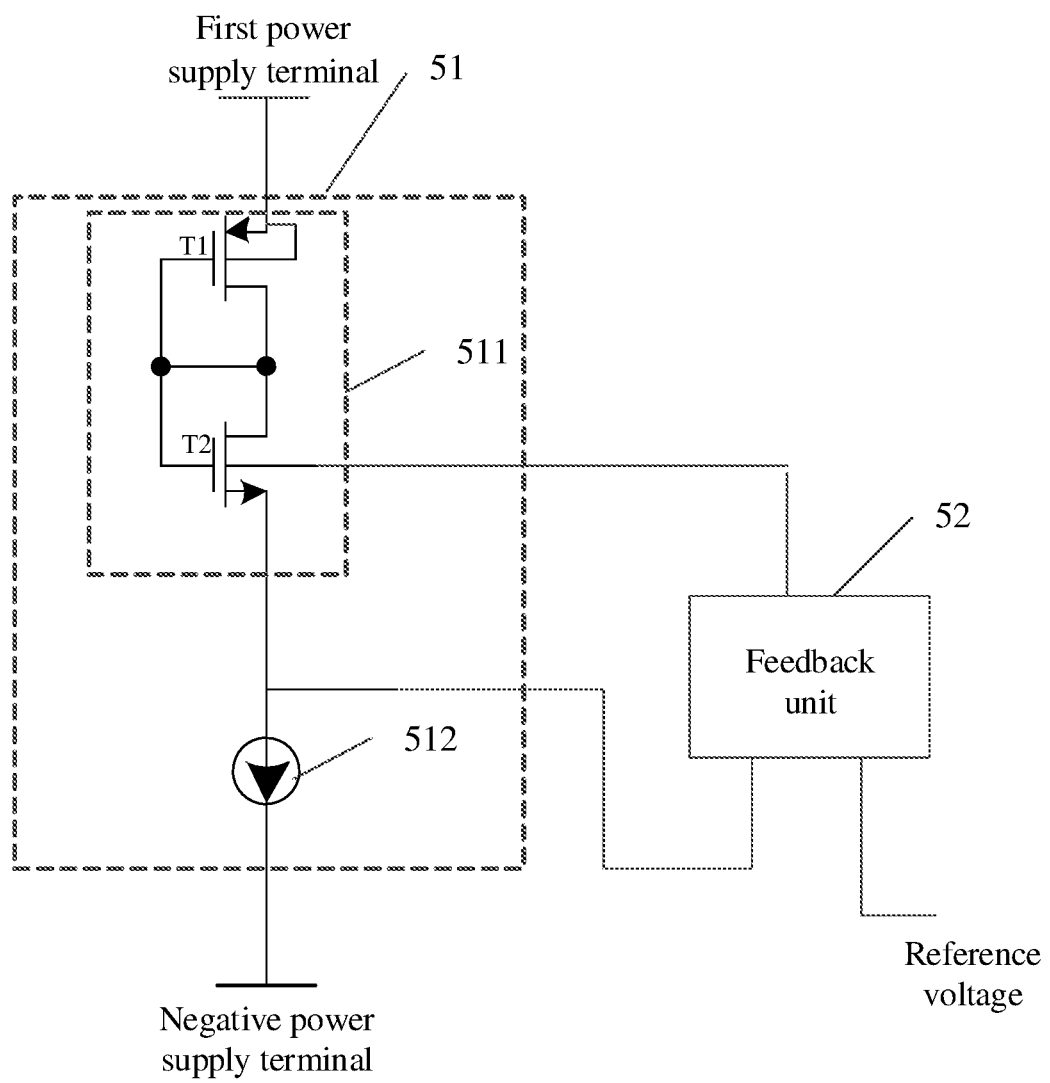
FIG. 48 is a diagram of a structure of a control circuit according to embodiments of the present disclosure.

FIG. 48 is a diagram of a structure of a control circuit according to embodiments of the present disclosure. As shown in FIG. 48, the control circuit according to the embodiment is based on the circuit shown in FIG. 47. Further, the inverter 411 includes a first transistor T1 and a second transistor T2. The substrate of the first transistor T1 is connected to a first power supply terminal. The substrate of the second transistor T2 is connected to the output of the feedback unit 52.

The first terminal of the first transistor T1 is connected to the first power supply terminal. The second terminal of the first transistor T1 is connected to the first terminal of the second transistor T2. The control terminal of the first transistor T1 is connected to the control terminal of the second transistor T2. The second terminal of the second transistor T2 is connected to the first terminal of the constant current source.

In the embodiment, the control unit 41 is configured to adjust the voltage at the substrate of the second transistor T2 according to the feedback signal.

With the control circuit provided in the present embodiment, the control unit is configured to adjust the voltage at the substrate of the second transistor according to the feedback signal, such that the change in the current of the control unit varying with the first parameter is within the first range. The first parameter may be any one of the supply voltage, the operating temperature, as well as the manufacturing process. Thus, the substrate of the second transistor may respectively output a voltage varying with any one of the supply voltage, the operating temperature, as well as the manufacturing process.

Figure 49:
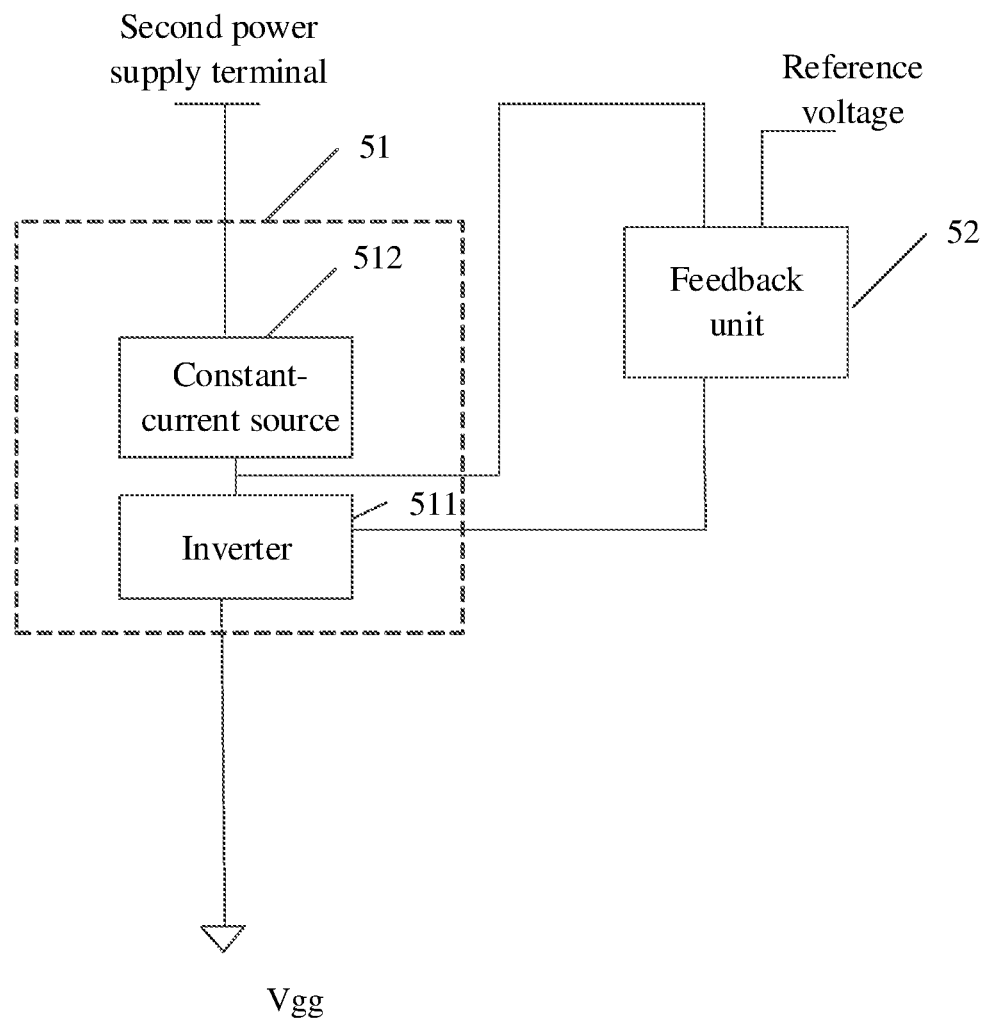
FIG. 49 is a diagram of a structure of a control circuit according to embodiments of the present disclosure.

FIG. 49 is a schematic diagram of a structure of a control circuit according to embodiments of the present disclosure. As shown in FIG. 49, the control circuit of the embodiment is based on the circuit shown in FIG. 46. Further, the control unit 51 may include an inverter 511 and a constant current source 512. The first terminal of the inverter 511 is grounded. The first terminal of the constant current source 512 is connected to the second terminal of the inverter 511. The second terminal of the constant current source 512 is connected to the second power supply terminal. The input terminal of the inverter 511 is short-circuited with the output terminal of the inverter 511.

Figure 50:
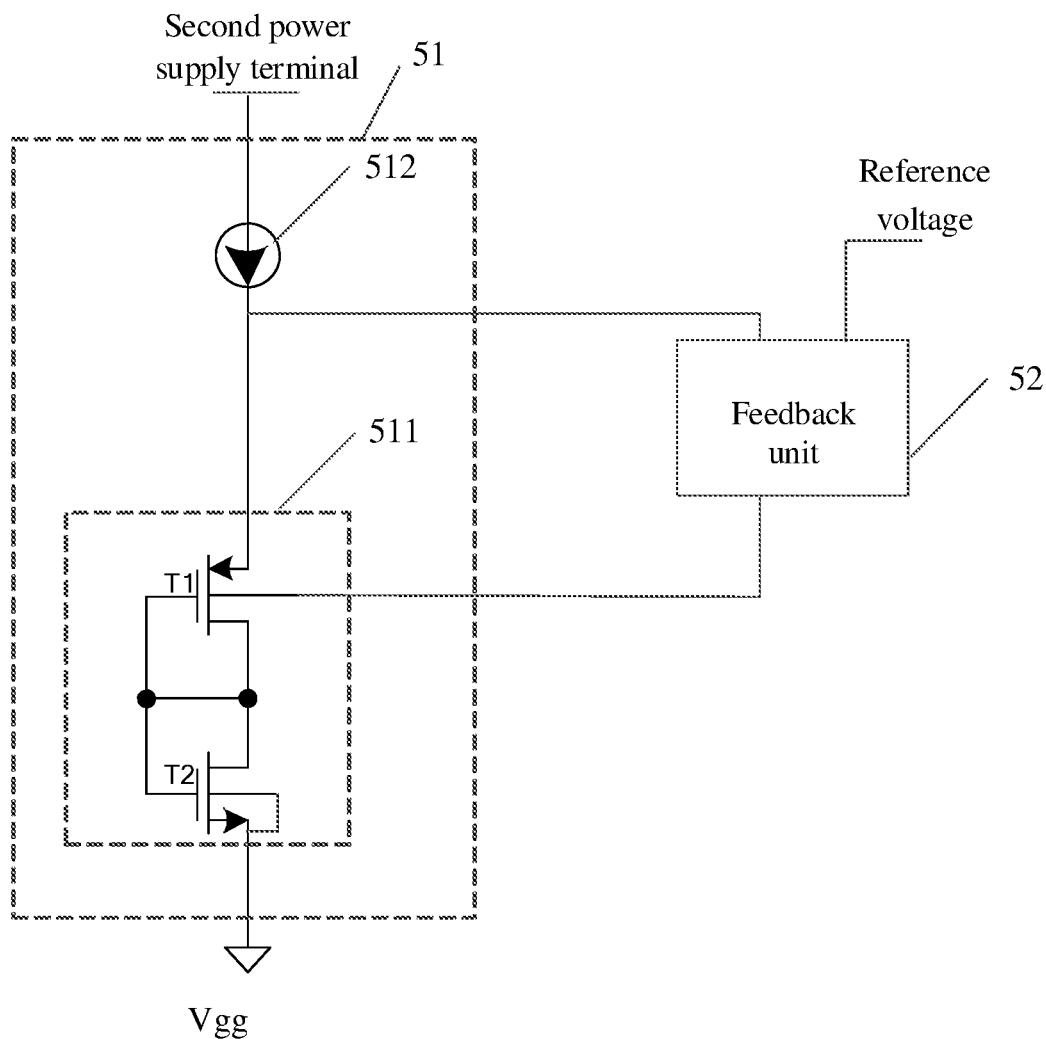
FIG. 50 is a diagram of a structure of a control circuit according to embodiments of the present disclosure.

FIG. 50 is a diagram of a structure of a control circuit according to embodiments of the present disclosure. As shown in FIG. 50, the control circuit according to the embodiment is based on the circuit shown in FIG. 49. Further, the inverter 511 includes a first transistor T1 and a second transistor T2. The substrate of the first transistor T1 is connected to the output of the feedback unit, and the substrate of the second transistor is grounded.

The first terminal of the first transistor T1 is connected to the first terminal of the constant current source, the second terminal of the first transistor T1 is connected to the first terminal of the second transistor T2, the control terminal of the first transistor T1 is connected to the control terminal of the second transistor T2, and the second terminal of the second transistor T2 is grounded.

In the embodiment, the control unit 51 is configured to adjust the voltage at the substrate of the first transistor T1 according to the feedback signal.

With the control circuit provided in the present embodiment, the control unit is configured to adjust the voltage at the substrate of the first transistor according to the feedback signal, such that the change in the current of the control unit varying with the first parameter is within the first range. The first parameter may be any one of the supply voltage, the operating temperature, as well as the manufacturing process. Thus, the substrate of the first transistor may respectively output a voltage varying with any one of the supply voltage, the operating temperature, as well as the manufacturing process.

In the control circuit shown in FIG. 48 and FIG. 50, the first transistor is a P-type transistor and the second transistor is an N-type transistor.

A specific implementable structure of the feedback unit is elaborated below with reference to the accompanying drawings.

Figure 51:
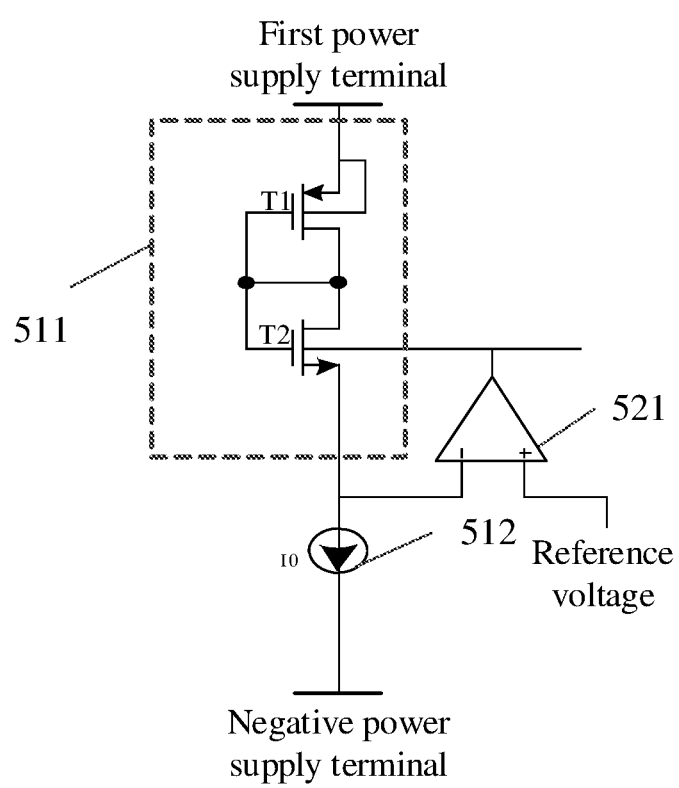
FIG. 51 is a diagram of a structure of a control circuit according to embodiments of the present disclosure.

FIG. 51 is a diagram of a structure of a control circuit according to embodiments of the present disclosure. As shown in FIG. 51, the control circuit of the present embodiment is based on the circuit shown in FIG. 48. Further, feedback unit 52 includes an error amplifier 521. The negative input of the error amplifier 521 is connected to the first terminal of the constant current source 512 and the second terminal of the second transistor T2. The positive input of the error amplifier 521 is a reference voltage input. The output of the error amplifier 521 is connected to the substrate of the second transistor T2.

Figure 52:
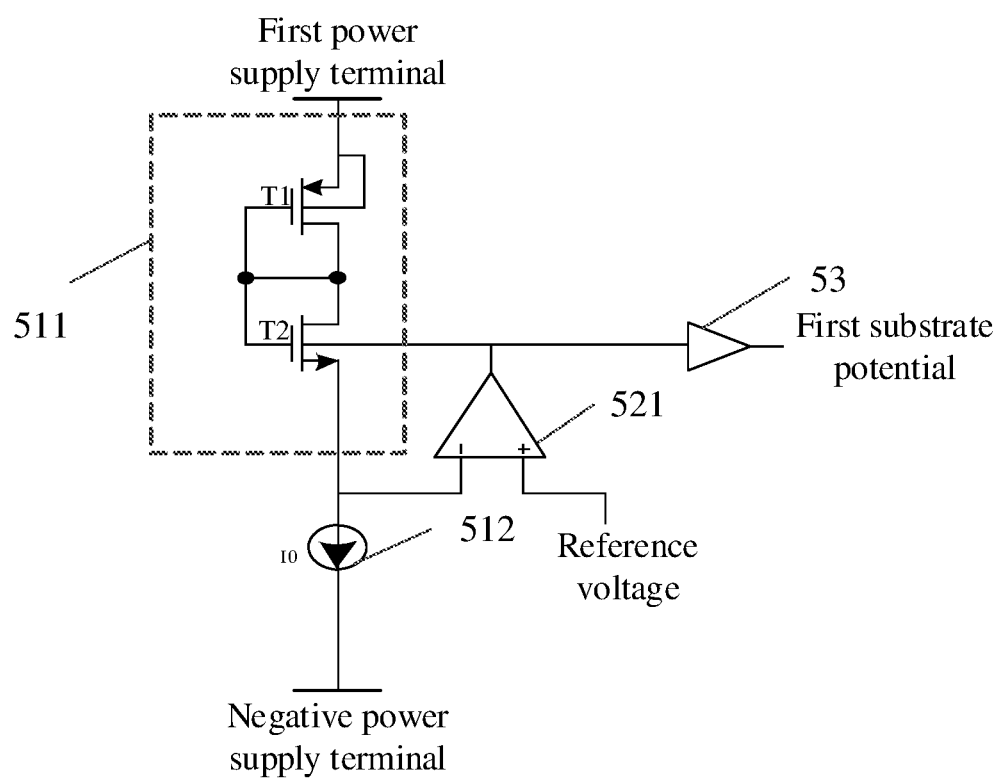
FIG. 52 is a diagram of a structure of a control circuit according to embodiments of the present disclosure.

FIG. 52 is a diagram of a structure of a control circuit according to embodiments of the present disclosure. As shown in FIG. 52, based on the circuit shown in FIG. 51, the control circuit of the present embodiment may further include a buffer 53.

The buffer 53 is connected to the substrate of the second transistor T2, and outputs a first substrate voltage. The first substrate voltage is equal to the voltage at the substrate of the second transistor T2.

Figure 53:
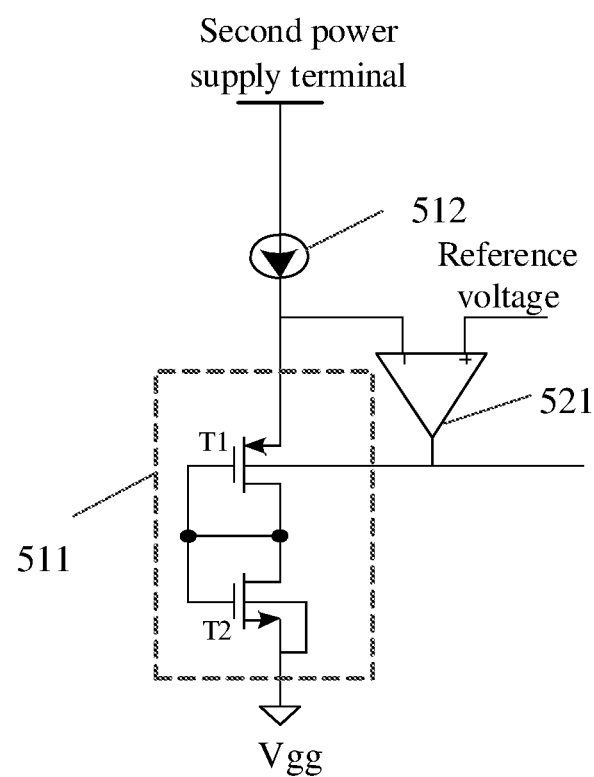
FIG. 53 is a diagram of a structure of a control circuit according to embodiments of the present disclosure.

FIG. 53 is a diagram of a structure of a control circuit according to embodiments of the present disclosure. As shown in FIG. 53, the control circuit of the present embodiment is based on the circuit shown in FIG. 50. Further, feedback unit 52 includes an error amplifier 521. The negative input of the error amplifier 521 is connected to the first terminal of the constant current source 512 and the first terminal of the first transistor T1. The negative input of the error amplifier 521 is a reference voltage input. The output of the error amplifier 521 is connected to the substrate of the first transistor T1.

Figure 54:
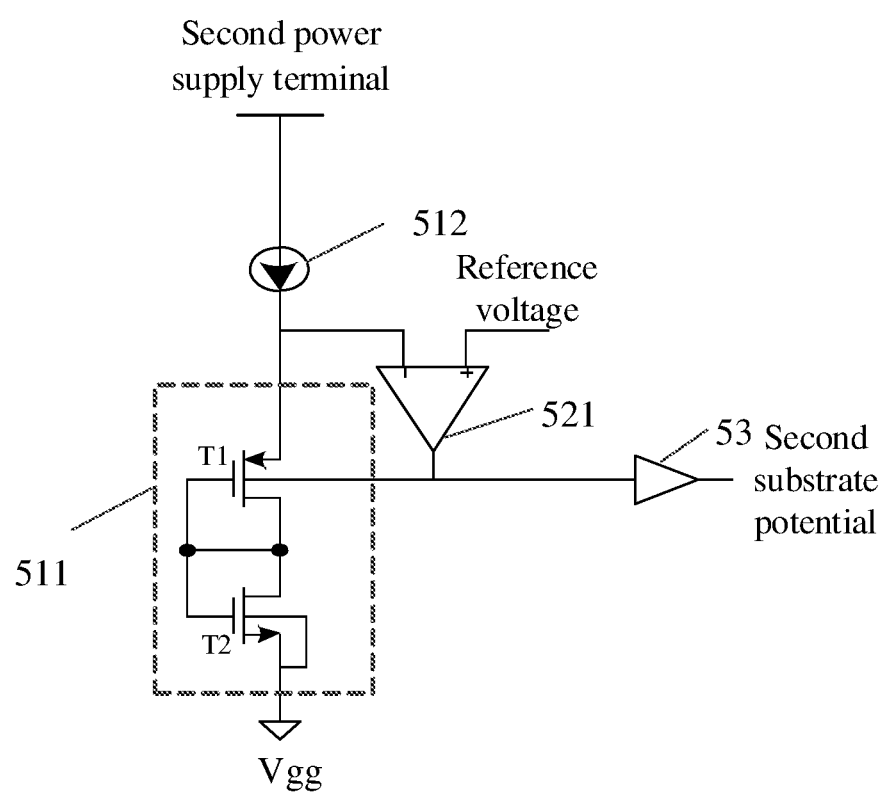
FIG. 54 is a diagram of a structure of a control circuit according to embodiments of the present disclosure.

FIG. 54 is a diagram of a structure of a control circuit according to embodiments of the present disclosure. As shown in FIG. 54, based on the circuit shown in FIG. 53, the control circuit according to the embodiment may further include a buffer 53. The buffer 53 is connected to the substrate of the first transistor T1, and outputs a second substrate voltage. The second substrate voltage is equal to the voltage at the substrate of the first transistor T1.

Note that in the control circuit shown in FIG. 45 to FIG. 54, the voltage at the first power supply terminal is Vcc, for example. The second reference voltage may be Vcc/2. The voltage at the negative power supply terminal may be 0 or less. The first reference voltage may be 0.

The voltage at the second power supply terminal is greater than the first reference voltage, and the second reference voltage may be half the first reference voltage. For example, the voltage at the second power supply terminal is Vdd, the first reference voltage is Vcc, Vdd is greater than Vcc, and the second reference voltage may be Vcc/2.

The structure of the control circuit according to the present disclosure will be described with reference to specific embodiments. The specific structure of the control circuit according to the present disclosure is not limited to any structure as follows.

In particular, for a specific structure of the control circuit of the present embodiment, refer to the circuit structures shown in FIG. 26 and FIG. 27. The potential generating circuits shown in FIG. 26 and FIG. 27 are control circuits in the present embodiment, with the same operation principle. Refer to the description of the embodiments shown in FIG. 26 and FIG. 27 for details, which are not repeated here.

Embodiments of the present disclosure further provide a delay circuit, including the control circuit shown in any one of FIG. 45 to FIG. 54 and a delay unit. The second terminal of the control unit is connected to the first terminal of the delay unit. The control circuit is configured to control the change in the rising edge delay and/or the falling edge delay provided by the delay unit varying with the first parameter to be within a first range.

Optionally, the delay unit includes an inverter. The inverter includes a fourth transistor and a fifth transistor. The second terminal of the control unit is connected to the substrate of the fourth transistor or to the substrate of the fifth transistor.

Optionally, the fourth transistor is a P-type transistor and the fifth transistor is an N-type transistor.

When the fifth terminal of the control unit is connected to the negative power supply terminal, the second terminal of the control unit is connected to the substrate of the fifth transistor.

The third terminal of the control unit is connected to the second power supply terminal. When the fourth terminal of the control unit is grounded, the second terminal of the control unit is connected to the substrate of the fourth transistor.

In the present embodiment, optionally, when the control circuit in the delay circuit is the control circuit shown in any one of FIG. 48, FIG. 50, or FIG. 51 to FIG. 54, H is equal to L, and M is equal to N. The H is a ratio of a channel length of the first transistor to a channel length of the fourth transistor. The L is a ratio of a channel length of the second transistor to a channel length of the fifth transistor. The M is a ratio of a channel width of the first transistor to a channel width of the fourth transistor. The N is a ratio of a channel width of the second transistor to a channel width of the fifth transistor.

With the delay circuit provided in the present embodiment, the second terminal of the control unit may output a voltage varying with the first parameter (i.e., any one of a supply voltage, an operating temperature, as well as a manufacturing process), thereby providing the substrate of the fourth transistor with a first substrate voltage varying with the first parameter. Therefore, the change in the current flowing through the fourth transistor of the inverter varying with the first parameter may be adjusted to be within the first range, and the change in the current flowing through the fourth transistor of the inverter may be compensated, so that the change in the rising edge delay T provided by the delay circuit is small, improving control over a rising edge delay precision by the delay circuit.

Alternatively, the substrate of the fifth transistor may be provided with a first substrate voltage varying with the first parameter. Therefore, the change in the current flowing through the fifth transistor of the inverter varying with the first parameter may be adjusted to be within the first range, and the change in the current flowing through the fifth transistor of the inverter may be compensated, so that the change in the falling edge delay T provided by the delay circuit is small, improving control over a falling edge delay precision by the delay circuit.

It should be noted that with the delay circuit provided in embodiments of the present disclosure, the relation of connection between an inverter in a delay unit and a control circuit shown in the two embodiments may be set according to the rising edge delay and/or the falling edge delay implemented by the delay unit. For example, a delay circuit implements a rising edge delay, and the delay circuit includes an inverter, and the inverter includes a P-type transistor and an N-type transistor. Then, a first control circuit is provided in the delay circuit, and the first control circuit may adjust the potential at the substrate of the P-type transistor in the inverter, so that the current flowing through the P-type transistor in the inverter may be adjusted, rendering the change in the current flowing through the P-type transistor in the inverter varying with the first parameter to be within a first range, to compensate the change in the current flowing through the P-type transistor in the inverter, rendering the change in the rising edge delay T provided by the delay circuit to be small. As another example, a delay circuit implements a falling edge delay. The delay circuit includes an inverter. The inverter includes a P-type transistor and an N-type transistor. Then, a second control circuit is provided in the delay circuit. The second control circuit may adjust the potential at the substrate of the N-type transistor in the inverter, so that a current flowing through the N-type transistor in the inverter may be adjusted, rendering the change in the current flowing through the N-type transistor in the inverter varying with the first parameter to be within the first range, to compensate the change in the current flowing through the N-type transistor in the inverter, rendering the change in the falling edge delay T provided by the delay circuit to be small. As another example, a delay circuit implements a rising edge delay and a falling edge delay. The delay circuit includes an inverter. The inverter includes a P-type transistor and an N-type transistor. Then, a first control circuit and a second control circuit are provided in the delay circuit. The first control circuit may adjust the potential at the substrate of the P-type transistor in the inverter, so that a current flowing through the P-type transistor in the inverter may be adjusted, rendering the change in the current flowing through the P-type transistor in the inverter varying with the first parameter to be within the first range, to compensate the change in the current flowing through the P-type transistor in the inverter, rendering the change in the rising edge delay T implemented by the delay circuit to be small. The second control circuit may adjust the potential at the substrate of the N-type transistor in the inverter, so that the current flowing through the N-type transistor in the inverter may be adjusted, rendering the change in the current flowing through the N-type transistor in the inverter varying with the first parameter to be within the first range, to compensate the change in the current flowing through the N-type transistor in the inverter, rendering the change in the falling edge delay T implemented by the delay circuit to be small. Thus, the changes in the rising edge delay T and the falling edge delay T provided by the delay circuit may both be made small, improving control over a delay precision, including a rising edge delay precision and a falling edge delay precision, by the delay circuit.

FIG. 20 to FIG. 30 give an example of two delay circuits, which is also applicable to the present embodiment. A potential generating circuit shown in FIG. 20 to FIG. 30 is a specific control circuit in the present embodiment. Refer to FIG. 20 to FIG. 30 for details, which are not repeated here.

A constant current source in an aforementioned embodiment may be, for example, a mirror current source. The current at a mirror terminal may be a current independent of a temperature coefficient, or the current is independent of the temperature, the voltage, etc. A constant current source in an aforementioned embodiment may also be implemented in other ways.

Finally, it should be noted that the embodiments are merely for describing a technical solution of the present disclosure, and are not intended to limit the present disclosure. The present disclosure is elaborated with the embodiments. A person having ordinary skill in the art may understand that she or he may still modify a technical solution according to the embodiments, or perform an equivalent replacement to some or all features in the technical solution. Any such modification and/or equivalent replacement does not render the essence of the technical solution departing from the scope of the technical solution according to the embodiments.

The invention claimed is:

1. A potential generating circuit, comprising a first transistor and a second transistor,
   wherein a potential of a substrate of the first transistor varies with a first parameter, the first parameter being any one of a supply voltage, an operating temperature, or a manufacturing process of the potential generating circuit,
   wherein a potential of a substrate of the second transistor varies with the first parameter,
   wherein a gate of the first transistor is connected to a drain of the first transistor, the substrate of the first transistor serves as a first output of the potential generating circuit, a gate of the second transistor is connected to a drain of the second transistor, and the substrate of the second transistor serves as a second output of the potential generating circuit,
   wherein the first transistor is a P-type transistor, and the second transistor is an N-type transistor,
   wherein a source of the first transistor is connected to a first voltage node, a source of the second transistor is connected to a second voltage node, and the drain of the first transistor is connected to the drain of the second transistor,
   wherein the potential generating circuit further comprises a constant current source,
   wherein a first terminal of the constant current source is connected to the second voltage node, and a second terminal of constant current source is connected to a third voltage node.

2. The potential generating circuit of claim 1, wherein the first parameter is the supply voltage or the operating temperature of the potential generating circuit, the potential of the substrate of the first transistor increases as the first parameter increases, the potential of the substrate of the first transistor decreases as the first parameter decreases, the potential of the substrate of the second transistor decreases as the first parameter increases, and the potential of the substrate of the second transistor increases as the first parameter decreases.

3. The potential generating circuit of claim 1, further comprising a first error amplifier, a second error amplifier, and a third transistor,
   the first error amplifier and the second transistor forming a first feedback loop, the substrate of the second transistor being connected to a voltage node of the first feedback loop,
   the second error amplifier and the third transistor forming a second feedback loop, the substrate of the first transistor being connected to a voltage node of the second feedback loop.

4. The potential generating circuit of claim 3, wherein a negative input of the first error amplifier is connected to the second voltage node, a positive input of the first error amplifier is connected to a first reference voltage, an output of the first error amplifier is connected to the substrate of the second transistor,
   a negative input of the second error amplifier is connected to a second reference voltage, a positive input of the second error amplifier is connected to a fourth voltage node, an output of the second error amplifier is connected to a gate of the third transistor, a source of the third transistor is connected to the first voltage node, a drain of the third transistor is coupled to the fourth voltage node through a first resistor, and the output of the first error amplifier is coupled to the fourth voltage node through a second resistor.

5. The potential generating circuit of claim 4, wherein the first voltage node is connected to a power supply, the first reference voltage is grounded, and a potential of the third voltage node is less than a potential of the first reference voltage.

6. The potential generating circuit of claim 1, further comprising a first buffer and a second buffer,
   the first buffer being connected to the first output, and outputting a first substrate potential equal to the potential of the substrate of the first transistor,
   the second buffer being connected to the second output, and outputting a second substrate potential equal to the potential of the substrate of the second transistor.

7. A delay circuit, comprising:
   the potential generating circuit of claim 1; and
   a delay unit comprising a first inverter, the first inverter comprising a fourth transistor and a fifth transistor, a substrate of the fourth transistor being connected to the potential of the substrate of the first transistor, a substrate of the fifth transistor being connected to the potential of the substrate of the second transistor.

8. The delay circuit of claim 7, wherein H is equal to L, and M is equal to N, wherein the H is a ratio of a channel length of the first transistor to a channel length of the fourth transistor, the L is a ratio of a channel length of the second transistor to a channel length of the fifth transistor, the M is a ratio of a channel width of the first transistor to a channel width of the fourth transistor, and the N is a ratio of a channel width of the second transistor to a channel width of the fifth transistor.

9. A potential generating circuit, comprising a first transistor and a second transistor,
   wherein a potential of a substrate of the first transistor varies with a first parameter, the first parameter being any one of a supply voltage, an operating temperature, or a manufacturing process of the potential generating circuit,
   wherein a potential of a substrate of the second transistor varies with the first parameter,
   wherein a gate of the first transistor is connected to a drain of the first transistor, the substrate of the first transistor serves as a first output of the potential generating circuit, a gate of the second transistor is connected to a drain of the second transistor, and the substrate of the second transistor serves as a second output of the potential generating circuit,
   wherein the first transistor is a P-type transistor, and the second transistor is an N-type transistor,
   wherein a source of the first transistor is connected to a first voltage node, a source of the second transistor is connected to a second voltage node, and the drain of the first transistor is connected to the drain of the second transistor,
   wherein the potential generating circuit further comprises a constant current source,
   wherein a first terminal of the constant current source is connected to a third voltage node, and a second terminal of the constant current source is connected to the first voltage node.

10. The potential generating circuit of claim 9, further comprising a first error amplifier, a second error amplifier, and a third transistor, the first error amplifier and the first transistor forming a first feedback loop, the substrate of the first transistor being connected to a voltage node of the first feedback loop, the second error amplifier and the third transistor forming a second feedback loop, the substrate of the second transistor being connected to a voltage node of the second feedback loop.

11. The potential generating circuit of claim 10, wherein a negative input of the first error amplifier is connected to the first voltage node, a positive input of the first error amplifier is connected to a first reference voltage, an output of the first error amplifier is connected to the substrate of the first transistor, a negative input of the second error amplifier is connected to a second reference voltage, a positive input of the second error amplifier is connected to a fourth voltage node, an output of the second error amplifier is connected to a gate of the third transistor, a source of the third transistor is connected to the second voltage node, a drain of the third transistor is coupled to the fourth voltage node through a second resistor, and an output of the first error amplifier is coupled to the fourth voltage node through a first resistor.

12. The potential generating circuit of claim 11, wherein the second voltage node is grounded, the first reference voltage is connected to a power supply, and a potential of the third voltage node is greater than a potential of the first reference voltage.

13. The potential generating circuit of claim 9, wherein the first parameter is the supply voltage or the operating temperature of the potential generating circuit, the potential of the substrate of the first transistor increases as the first parameter increases, the potential of the substrate of the first transistor decreases as the first parameter decreases, the potential of the substrate of the second transistor decreases as the first parameter increases, and the potential of the substrate of the second transistor increases as the first parameter decreases.

14. The potential generating circuit of claim 9, further comprising a first buffer and a second buffer, the first buffer being connected to the first output, and outputting a first substrate potential equal to the potential of the substrate of the first transistor, the second buffer being connected to the second output, and outputting a second substrate potential equal to the potential of the substrate of the second transistor.

15. A delay circuit, comprising:

the potential generating circuit of claim 9; and a delay unit comprising a first inverter, the first inverter comprising a fourth transistor and a fifth transistor, a substrate of the fourth transistor being connected to the potential of the substrate of the first transistor, a substrate of the fifth transistor being connected to the potential of the substrate of the second transistor.

16. The delay circuit of claim 15, wherein H is equal to L, and M is equal to N, wherein the H is a ratio of a channel length of the first transistor to a channel length of the fourth transistor, the L is a ratio of a channel length of the second transistor to a channel length of the fifth transistor, the M is a ratio of a channel width of the first transistor to a channel width of the fourth transistor, and the N is a ratio of a channel width of the second transistor to a channel width of the fifth transistor.

* * * * *